United States Patent
Sharon

(10) Patent No.: US 9,036,415 B2
(45) Date of Patent: May 19, 2015

(54) MITIGATING VARIATIONS ARISING FROM SIMULTANEOUS MULTI-STATE SENSING

(75) Inventor: Eran Sharon, Rishon Lezion (IL)

(73) Assignee: SanDisk Technologies Inc., Plano, TX (US)

( * ) Notice: Subject to any disclaimer, the term of this patent is extended or adjusted under 35 U.S.C. 154(b) by 581 days.

(21) Appl. No.: 13/333,799

(22) Filed: Dec. 21, 2011

(65) Prior Publication Data

US 2013/0163330 A1    Jun. 27, 2013

(51) Int. Cl.
*G11C 5/14* (2006.01)
*G11C 11/56* (2006.01)
*G06F 11/10* (2006.01)

(52) U.S. Cl.
CPC ........ *G11C 11/5642* (2013.01); *G06F 11/1072* (2013.01)

(58) Field of Classification Search
USPC .............. 365/185.09, 185.24, 185.17, 185.01
See application file for complete search history.

(56) References Cited

U.S. PATENT DOCUMENTS

| | | | |
|---|---|---|---|
| 6,222,762 B1 | 4/2001 | Guterman et al. | |
| 7,002,843 B2 | 2/2006 | Guterman et al. | |
| 7,020,026 B2 | 3/2006 | Guterman et al. | |
| 7,280,408 B2 | 10/2007 | Guterman et al. | |
| 7,349,264 B2 | 3/2008 | Mokhlesi et al. | |
| 7,414,887 B2 | 8/2008 | Guterman et al. | |
| 7,460,406 B2 | 12/2008 | Mokhlesi et al. | |
| 2008/0019187 A1* | 1/2008 | Kux et al. | ................ 365/185.22 |
| 2008/0205163 A1* | 8/2008 | Park et al. | ................ 365/185.23 |
| 2008/0244338 A1* | 10/2008 | Mokhlesi et al. | ............. 714/702 |
| 2009/0024905 A1 | 1/2009 | Shalvi et al. | |
| 2009/0129169 A1 | 5/2009 | Roohparvar et al. | |
| 2009/0290418 A1* | 11/2009 | Han | ........................ 365/185.09 |
| 2010/0192042 A1 | 7/2010 | Sharon et al. | |
| 2010/0246289 A1 | 9/2010 | Vigoda et al. | |

FOREIGN PATENT DOCUMENTS

WO   2011/119500 A1   9/2011

OTHER PUBLICATIONS

U.S. Appl. No. 12/732,121, filed Mar. 25, 2010.
(Continued)

*Primary Examiner* — Son Dinh
*Assistant Examiner* — Uyen B Tran
(74) *Attorney, Agent, or Firm* — Vierra Magen Marcus LLP

(57) ABSTRACT

Methods and devices for mitigating sensing variations that may arise from simultaneous multi-threshold (SMT) sensing are provided. During SMT sensing, two or more different bias conditions may be used to simultaneously sense two different threshold voltages. However, there may be variances in the threshold voltage shift of memory cells when read with a different bias condition than was used to verify. In one embodiment each programmed state is read using both (or all) bias conditions that were used during SMT verify. In other words, two (or more) different sense operations are used to read each memory cell. The data from these different sense operations may be used to compute initialization values (e.g., LLRs, LRs, probabilities) for an ECC decoder. In one embodiment, this technique is only performed when a normal read fails.

22 Claims, 37 Drawing Sheets

(56) References Cited

OTHER PUBLICATIONS

Dong, et al., "On the Use of Soft-Decision Error-Correction Codes in nand Flash Memory," Abstract, IEEE Transactions on Circuits and Systems I: Regular Papers, IEEE Circuits and Systems Society, Issue 99, Nov. 11, 2010, 1 page.

International Search Report and Written Opinion of the International Searching Authority dated Mar. 15, 2013, PCT Application No. PCT/US2012/065948 filed Nov. 19, 2012, 10 pages.

* cited by examiner

|  | Fresh | | | Cycled | | | Diff |
|---|---|---|---|---|---|---|---|
| Fsense | Mean | Stand. dev | SD/mean | Mean | Stand. dev | SD/Mean | |
| 600 | 95 | 24 | 0.26 | 112 | 35 | 0.31 | 17 |
| 700 | 164 | 36 | 0.22 | 197 | 50 | 0.25 | 33 |
| 800 | 219 | 46 | 0.21 | 262 | 61 | 0.23 | 44 |
| 900 | 262 | 53 | 0.20 | 315 | 69 | 0.22 | 52 |
| 1000 | 300 | 60 | 0.20 | 358 | 76 | 0.21 | 57 |
| 1100 | 332 | 65 | 0.20 | 394 | 82 | 0.21 | 62 |
| 1200 | 360 | 70 | 0.19 | 426 | 87 | 0.20 | 66 |
| 1300 | 385 | 75 | 0.19 | 454 | 91 | 0.20 | 70 |
| 1400 | 406 | 79 | 0.19 | 479 | 95 | 0.20 | 72 |
| 1500 | 427 | 82 | 0.19 | 500 | 98 | 0.20 | 74 |
| 1600 | 445 | 86 | 0.19 | 522 | 102 | 0.20 | 76 |

Fig. 1

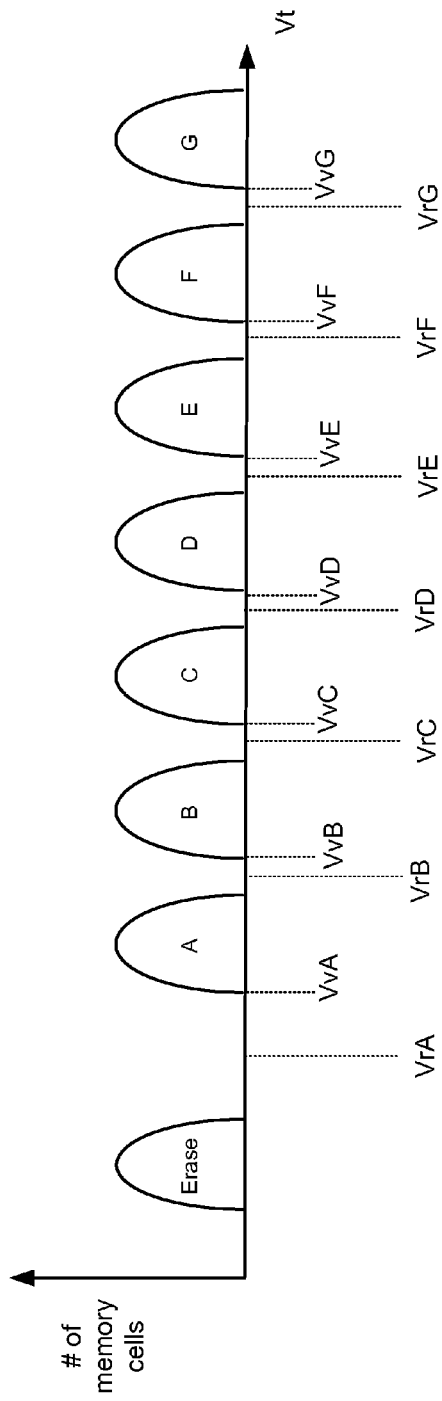
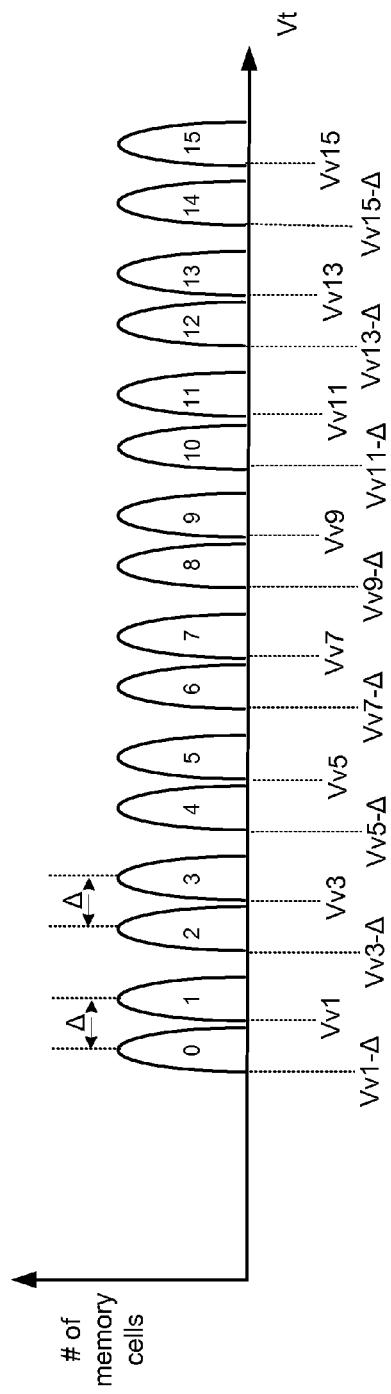
Fig. 7A
Fig. 7B

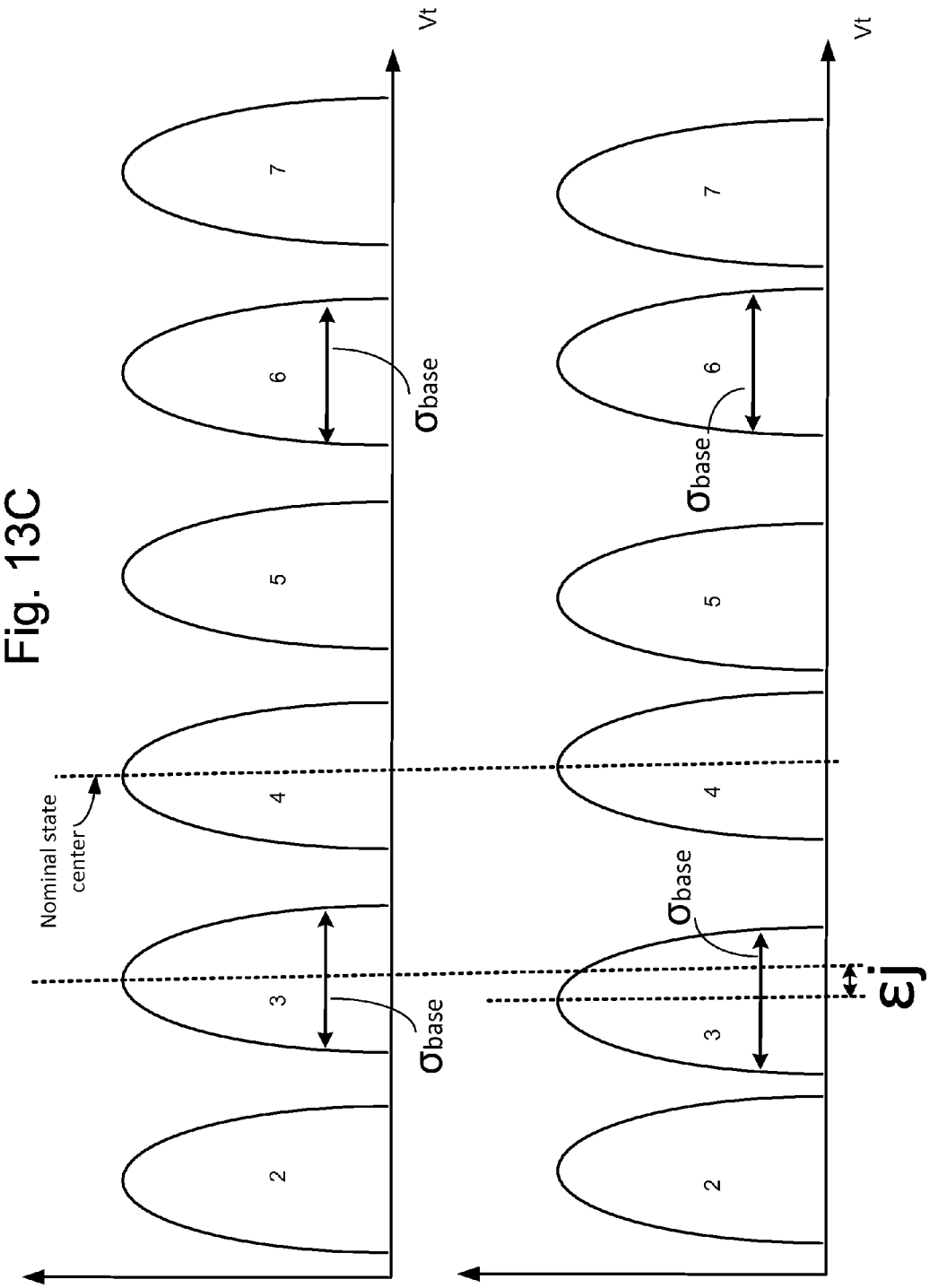

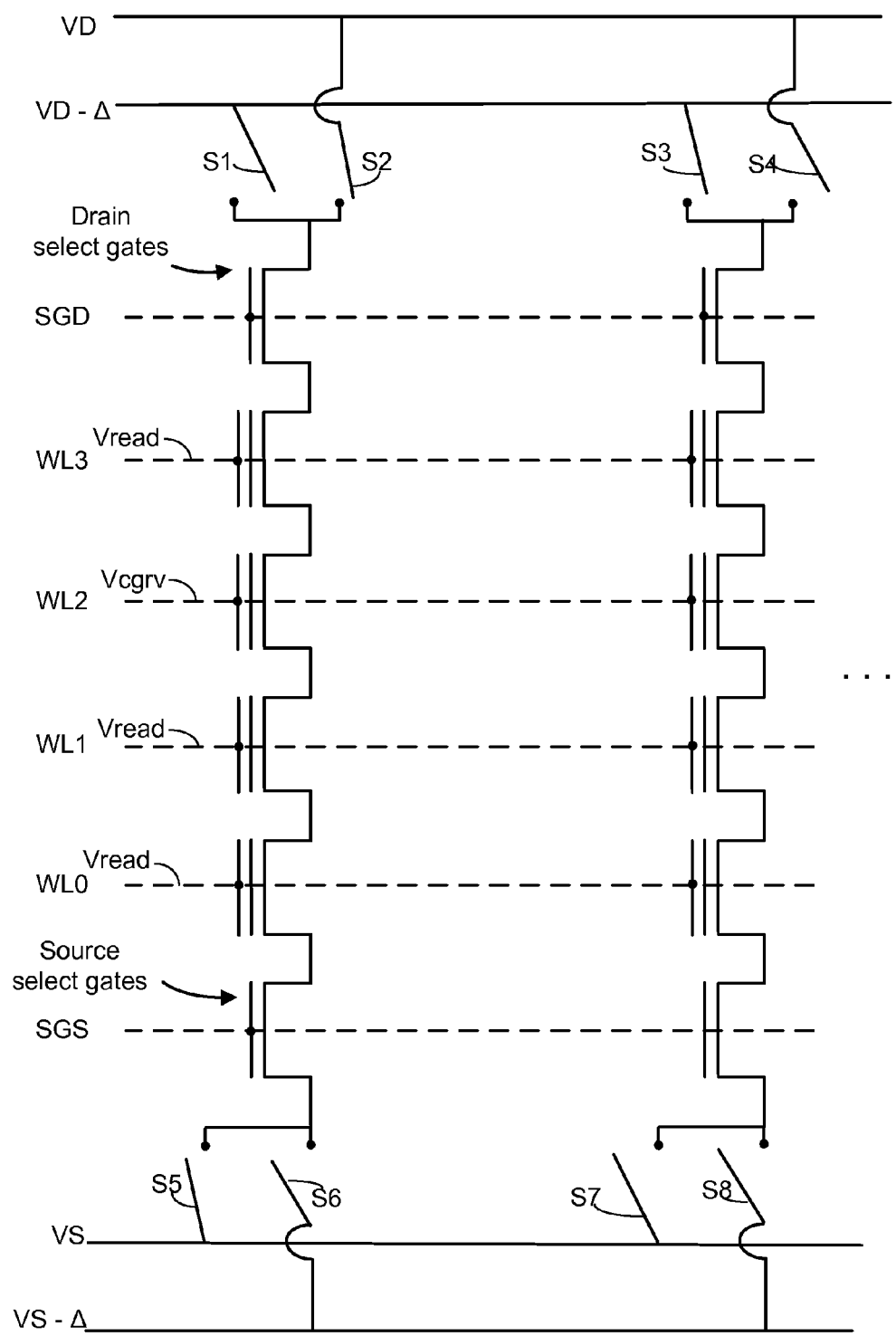

MITIGATING VARIATIONS ARISING FROM SIMULTANEOUS MULTI-STATE SENSING

BACKGROUND

This disclosure relates to non-volatile storage.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both traditional EEPROM and flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

A significant problem with storing multiple bits per cell is that the programming and reading performance may become significantly slower, if reasonable Flash memory reliability (e.g., cycling and data retention specification) is to be achieved. A reason for the reduced performance is that in order to obtain reasonable memory reliability, narrow cell voltage distributions (CVDs) need to be achieved. This requires performing a very controlled programming procedure by using small programming steps and verifying which cells have reached their intended state after each programming pulse. Thus, the increased number of programming pulses and the increased number of states that needs to be verified after each pulse significantly decrease the programming speed.

U.S. Pat. No. 7,073,103, entitled "Smart Verify For Multi-State Memories," incorporated herein by reference in its entirety, describes a process for minimizing the number of sequential verify operations for each program/verify/lockout step of a write sequence. Initially, only the lowest state of the multi-state range to which selected storage elements are programmed is checked during the verify phase. Once the first storage state is reached by one or more of the selected elements, the next state in a sequence of multi-states is added to the verify process. This next state can either be added immediately upon the fastest elements reaching the preceding state in the sequence, or after a delay of several program pulses. The adding of states to the set being checked in the verify phase continues through the rest of the set of multi-states in sequence, until the highest state has been added. Additionally, lower states can be removed from the verify set as all of the selected storage elements bound for these levels verify successfully to those target values and are locked out from further programming. Note that this technique may require that more than one state be verified following each programming pulse.

However, further improvements are desired.

BRIEF DESCRIPTION OF THE DRAWINGS

FIG. 1 is a table showing cell to cell variations due to SMT sensing.

FIG. 7A depicts example threshold voltage distributions for states of memory cells in which there are eight states.

FIG. 7B illustrates example threshold voltage distributions corresponding to data states for the memory cell array when each memory cell stores four bits of data.

FIG. 13C shows portions of two threshold distributions.

FIG. 17A is a schematic diagram of a circuit that is able to apply different gate-to-source voltages across a selected memory cell on different strings of memory cells.

DETAILED DESCRIPTION

Figure 2A:
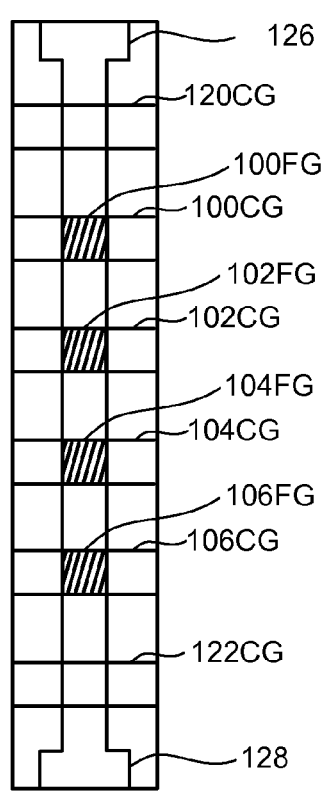
FIG. 2A is a top view of a NAND string.

Methods and devices for mitigating sensing variations that may arise from simultaneous multi-threshold (SMT) sensing are provided. During SMT sensing, two or more different bias conditions may be used to simultaneously sense two different threshold voltages. For example, a single verify reference voltage may be applied to the selected word line, while one bias condition is used for memory cells being verified to odd states and a second bias condition is used for memory cells being verified to even states. One example of different bias conditions is to sense the conduction current of the bit line for different lengths of times. Herein, this sense time is referred to as "FSENSE." Using two (or more) different FSENSEs allows different threshold voltages to be sensed, while applying the same verify reference voltage to the selected word line. Hence, this may be referred to as "simultaneous multi-threshold" sensing.

Using SMT sensing saves time during program verify. However, when the memory cells are later read, the bias condition that was used for each memory cell being read is not known. Therefore, all memory cells may be read using the same bias condition. For example, all memory cells may be read using a nominal (e.g., short) FSENSE. Therefore, the memory cells that were verified using a longer FSENSE would get read using a different FSENSE than was used at verify.

Note that memory cells can react differently to being read using a different bias condition than used during verify. For example, they may show different threshold voltage shifts. Ideally, all memory cells would experience the same threshold voltage shift as a result of the different bias conditions (e.g., sensing times). However, this may not be the case. The foregoing may lead to variance in the threshold voltage shifts of memory cells read with a different bias condition than used to verify.

Embodiments disclosed herein mitigate for these variances or SMT noise. In one embodiment each programmed state is read using both (or all) bias conditions that were used during SMT verify. In one embodiment, each programmed state is read using a short (nominal) FSENSE and a long (biased) FSENSE. In other words, two (or more) different sense operations are used to read each memory cell. The data from these different sense operations may be used to compute initialization values (e.g., LLRs) for an ECC decoder. In one embodiment, this technique is only performed when a normal read fails. Note that embodiments may significantly reduce the ECC redundancy needed, compared to performing SMT sensing without mitigation.

The Table in FIG. 1 shows shifts in threshold voltage (Vt), and will be used to illustrate how there may be a memory cell to memory cell variance between memory cells that are read back with a different bias condition than they were verified with. The memory cells were verified with a short (nominal) FSENSE of 500 ns in this example. The memory cells were read using a long FSENSE ranging from 600 ns to 1600 ns. For a fresh memory array, the mean Vt shift for a long FSENSE of 600 ns is 95 mV. However, due to cell to cell variations, the standard deviation is 24 mV. The standard deviations for longer values of FSENSE are even higher.

As one example, verifying one memory cell with a long FSENSE, and then reading with a short FSENSE may result in a shift in the Vt of 95 mV. However, verifying another memory cell with a long FSENSE, and then reading with a short FSENSE may result in a shift of the Vt by 115 mV. Other memory cells may see other Vt shifts. Of course, the mean Vt shift may be applied to the readings of all affected memory cells to compensate for the expected average Vt shift. However, the variance in Vt shifts may lead to some inaccuracies. In effect, the variance in the Vt shifts results in what may be referred to as "SMT noise."

Also note that there may be variation that is a function of the program cycles. The Table of FIG. 1 shows that for the long FSENSE of 600 ns, the mean is 95 mV when fresh, but is 112 mV when cycled. This implies that a given memory cell may see a different Vt shift as the number of program cycles increases.

SMT Sensing Overview

The following describes a brief overview of SMT sensing. In one embodiment of SMT sensing, memory cells on different NAND strings that are verified at the same time are tested for different threshold voltage levels. For example, a memory cell on one NAND string is tested to determine whether its threshold voltage is above a first voltage level, whereas a memory cell on another NAND string is tested to determine whether its threshold voltage is above a second voltage level. As a specific example, one memory cell is tested to determine if its threshold voltage is above the voltage level associated with one data state, whereas, the other memory cell is tested to determine if its threshold voltage is above the voltage level associated with another data state. Therefore, in a memory array that programs memory cells to multiple bits per memory cell, more than one data state can be tested at a time.

In one embodiment, the SMT sensing is used during a verify operation associated with programming memory cells to multiple data states. By verifying multiple data states at a time, the programming sequence is sped up. For example, one or more programming pulses are applied to the memory cells with the goal of eventually programming some memory cells to one state and others to a different state (in all there might be 4, 5, 6, 7, 8, 9, . . . , 16, or more states). Then, a verify operation is performed to determine whether the memory cells were programmed to their respective intended states as a result of the one or more programming pulses. By verifying multiple states with the same verify operation, time may be saved. In some embodiments, the same voltage is applied to the gates of the memory cells that are being verified for different threshold voltages.

Note that using two (or more) different FSENSE times is one example of a sensing scheme that can be used for SMT sensing. Other schemes include: 1) reverse sensing by controlling the source voltage (e.g., different Vgs to sense different states); and 2) applying different voltages to the bit lines to simultaneously verify different states using different Vds.

In one reverse sensing embodiment, memory cells are tested for different threshold voltages by applying different gate-to-source voltages to memory cells being tested for different threshold voltages. One embodiment involves biasing a common source line of a NAND string to a first voltage and causing one voltage to a first set of bit lines and a different voltage to a second set of bit lines. The first set of bit lines are associated with NAND strings having a memory cell being programmed to a first state and the second set of bit lines are associated with NAND strings having a memory cell being programmed to a second state. However, the same voltage is applied to the gates of the memory cells being programmed. The bit line voltages may be lower than the common source line such that, in effect, the side of the memory cell nearest the source line functions as the drain and the side of the memory cell nearest its bit line functions as the source. Therefore, the memory cell's current flows from the source line to its bit line. This technique may therefore be referred to as "reverse sensing" in that the current flows in the opposite direction as is commonly done to sense memory cells on a NAND string In the foregoing reverse sensing example, the different gate to source voltages that are used during verify may be considered to be different bias conditions. There may be cell to cell variations in Vt shift that occur due to using a different Vgs during read than for verify. For example, there may be body bias variations that occur due to using a different Vgs during read than for verify. Embodiments disclosed herein mitigate body bias and/or other variations.

In one embodiment, memory cells are tested for different threshold voltages by applying different drain to source voltages to the memory cells. One embodiment involves biasing a common source line of a NAND string to a first voltage and causing one voltage to a first set of bit lines and a different voltage to a second set of bit lines. The first set of bit lines are associated with NAND strings having a memory cell being programmed to a first state and the second set of bit lines are associated with NAND strings having a memory cell being programmed to a second state. However, the same voltage is applied to the gates of the memory cells being programmed. The different bit line voltages cause different drain-to-source voltages for memory cells being tested for different threshold voltages. The drain voltage of at least some of the memory cells is sufficiently high to cause drain induced barrier lowering (DIBL), which alters the threshold voltage of the memory cell. For example, the goal may be to verify that the threshold voltage of a first memory cell is at least 3.0V and the threshold voltage of a second memory cell is at least 3.5V. In fact, the first memory cell may have a threshold voltage of 3.0V and the second memory cell may have a threshold voltage of 3.5V without any DIBL effect. By creating sufficient DIBL to lower the threshold voltage of the second memory cell from 3.5V to 3.0V, the threshold voltage of both memory cells can be tested using the same gate to source voltage (e.g., the same verify reference voltage to the selected word line may be used). As an example, under the foregoing conditions, a Vgs of 3.0V may cause both memory cells to turn on, thereby verifying memory cells having different threshold voltages at the same time. Note this means that the same voltage is applied to the gates of the memory cells that are being verified for different threshold voltages. In this example, the different bias conditions may be the different drain to source voltages.

In the foregoing sensing example, the different drain to source voltages that are used during verify may be considered to be different bias conditions. There may be cell to cell variations in Vt shift that occur due to using a different Vds during read than for verify. Embodiments disclosed herein mitigate these variations.

Example Memory System and Operation

Figure 2B:
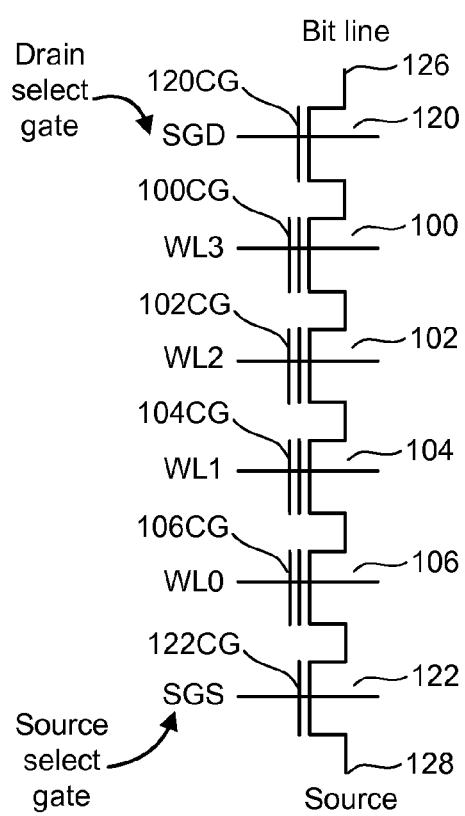
FIG. 2B is an equivalent circuit diagram of the NAND string of FIG. 2A.

One example of a memory system suitable for implementing embodiments uses a NAND flash memory architecture, which includes connecting multiple transistors in series between two select gates. The transistors connected in series and the select gates are referred to as a NAND string. FIG. 2A is a top view showing one NAND string. FIG. 2B is an equivalent circuit thereof. The NAND string includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

Figure 2C:
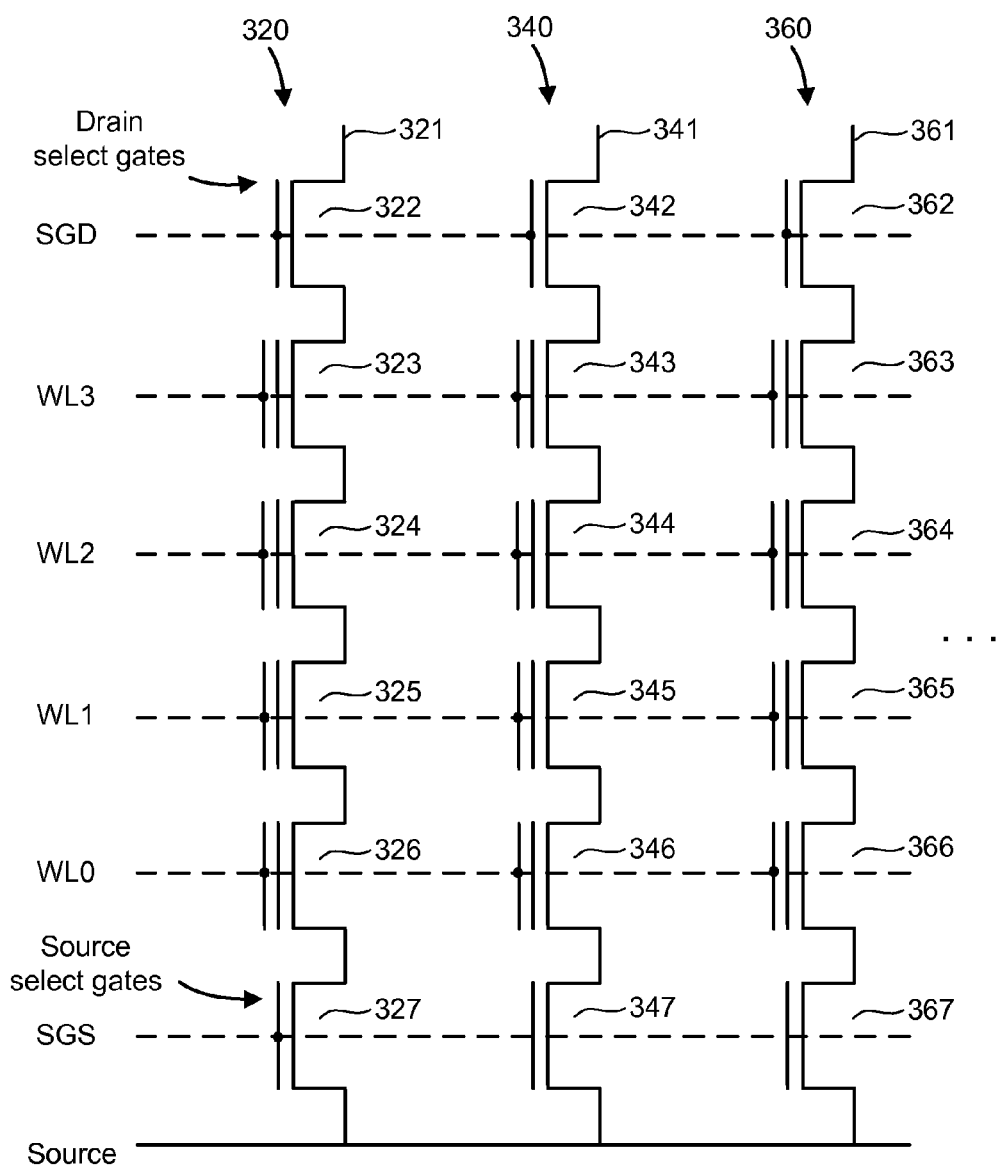
FIG. 2C is a circuit diagram depicting three NAND strings.

FIG. 2C is a circuit diagram depicting three NAND strings. A typical architecture for a flash memory system using a NAND structure will include many NAND strings. For example, three NAND strings 320, 340 and 360 are shown in a memory array having many more NAND strings. Each of the NAND strings includes two select gates and four storage elements. While four storage elements are illustrated for simplicity, NAND strings can have thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, and so forth. These select transistors are controlled by a drain select line SGD. In other embodiments, the select lines do not necessarily need to be in common among the NAND strings; that is, different select lines can be provided for different NAND strings. WL3 is connected to the control gates for storage elements 323, 343 and 363. WL2 is connected to the control gates for storage elements 324, 344 and 364. WL1 is connected to the control gates for storage elements 325, 345 and 365. WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, WL2 provides the control gates for storage elements 324, 344 and 364. In practice, there can be thousands of storage elements on a word line.

In some embodiments, the voltage applied to the bit line is greater than the voltage applied to source when reading a memory cell on the NAND string. In some embodiments, the voltage applied to the bit line is less than the voltage applied to source when reading a memory cell on the NAND string. For consistency of discussion, the source line will always be referred to as a source line regardless of whether the voltage applied to it is less than or greater than the voltage applied to the bit line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2C, the program voltage will also be applied to the control gates of storage elements 344 and 364.

Figure 3:
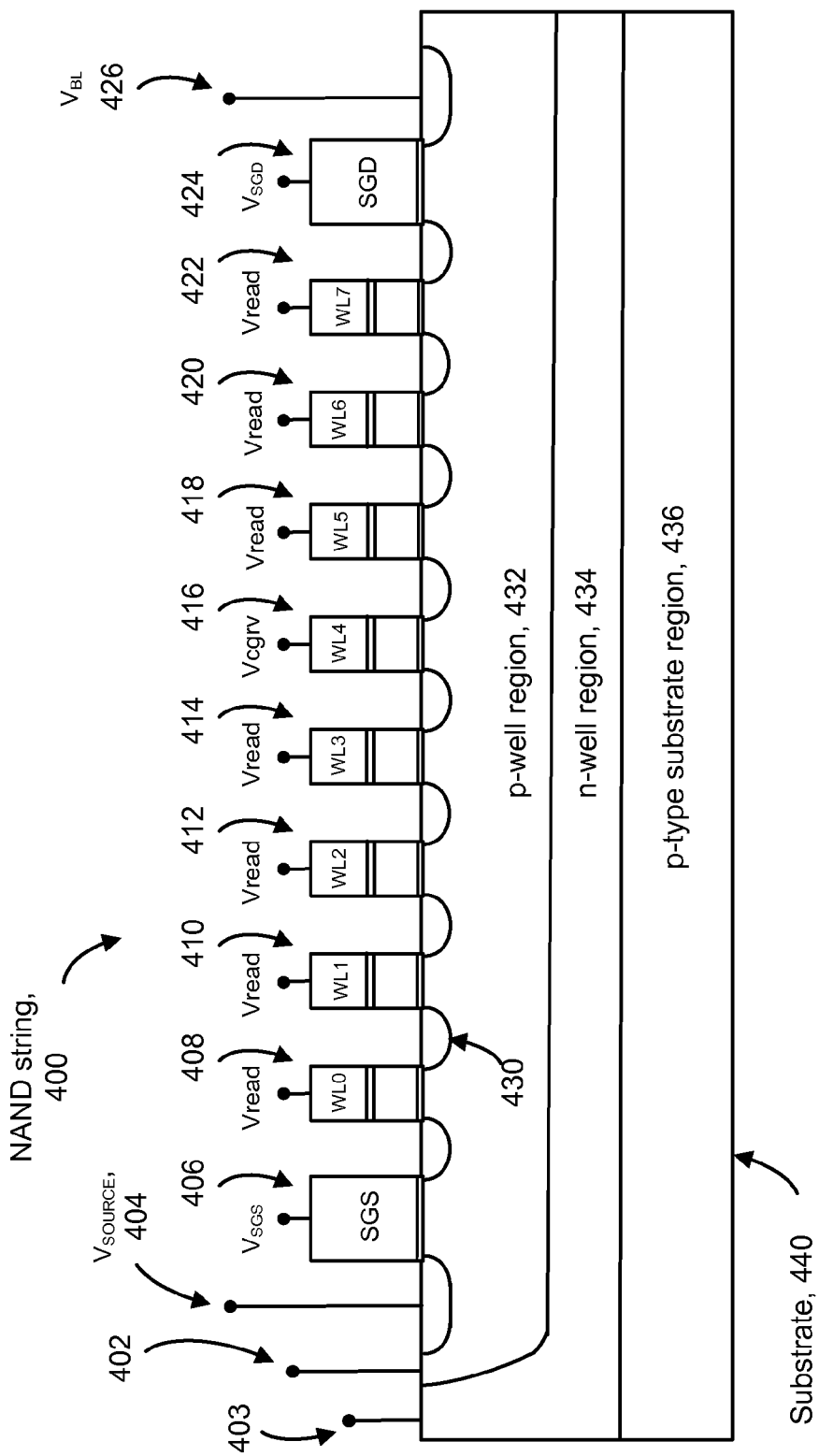
FIG. 3 depicts a cross-sectional view of a NAND string formed on a substrate.

FIG. 3 depicts a cross-sectional view of a NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 440. A number of source/drain regions, one example of which is source/drain region 430, are provided on either side of each storage element and the select gates 406 and 424.

In one approach, the substrate 440 employs a triple-well technology which includes a p-well region 432 within an n-well region 434, which in turn is within a p-type substrate region 436. The NAND string and its non-volatile storage elements can be formed, at least in part, on the p-well region. A source supply line 404 with a potential of $V_{SOURCE}$ is provided in addition to a bit line 426 with a potential of $V_{BL}$. Voltages, such as body bias voltages, can also be applied to the p-well region 432 via a terminal 402 and/or to the n-well region 434 via a terminal 403. During a read or verify operation, a control gate voltage $V_{GGRV}$ is provided on a selected word line, in this example, WL4, which is associated with storage element 416. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, $V_{READ}$ is applied to the remaining word lines associated with NAND string 400. $V_{SGS}$ and $V_{SGD}$ are applied to the select gates 406 and 424, respectively.

Note that the direction current flow along the NAND string may depend on the relative magnitudes of $V_{SOURCE}$ to $V_{BL}$. For example, if $V_{BL}$ is greater than $V_{SOURCE}$, then the current may flow from the bit line to the source. In such an example, source/drain region 430 may serve as the drain of memory cell 408 and as the source of memory cell 410. However, if $V_{BL}$ is less than $V_{SOURCE}$, then the current may flow from the source line to the bit line. In such an example, source/drain region 430 may serve as the source of memory cell 408 and as the drain of memory cell 410. Thus, whether a source/drain region 430 functions as the source or as the drain of a given memory cell may depend on the relative magnitudes of $V_{SOURCE}$ to $V_{BL}$. As previously mentioned, the source line will be referred to herein as a source line regardless of whether $V_{SOURCE}$ is less than or greater than $V_{BL}$. Moreover, the voltage applied to the source line will be referred to herein as $V_{SOURCE}$ regardless of whether $V_{SOURCE}$ is less than or greater than $V_{BL}$.

Figure 4:
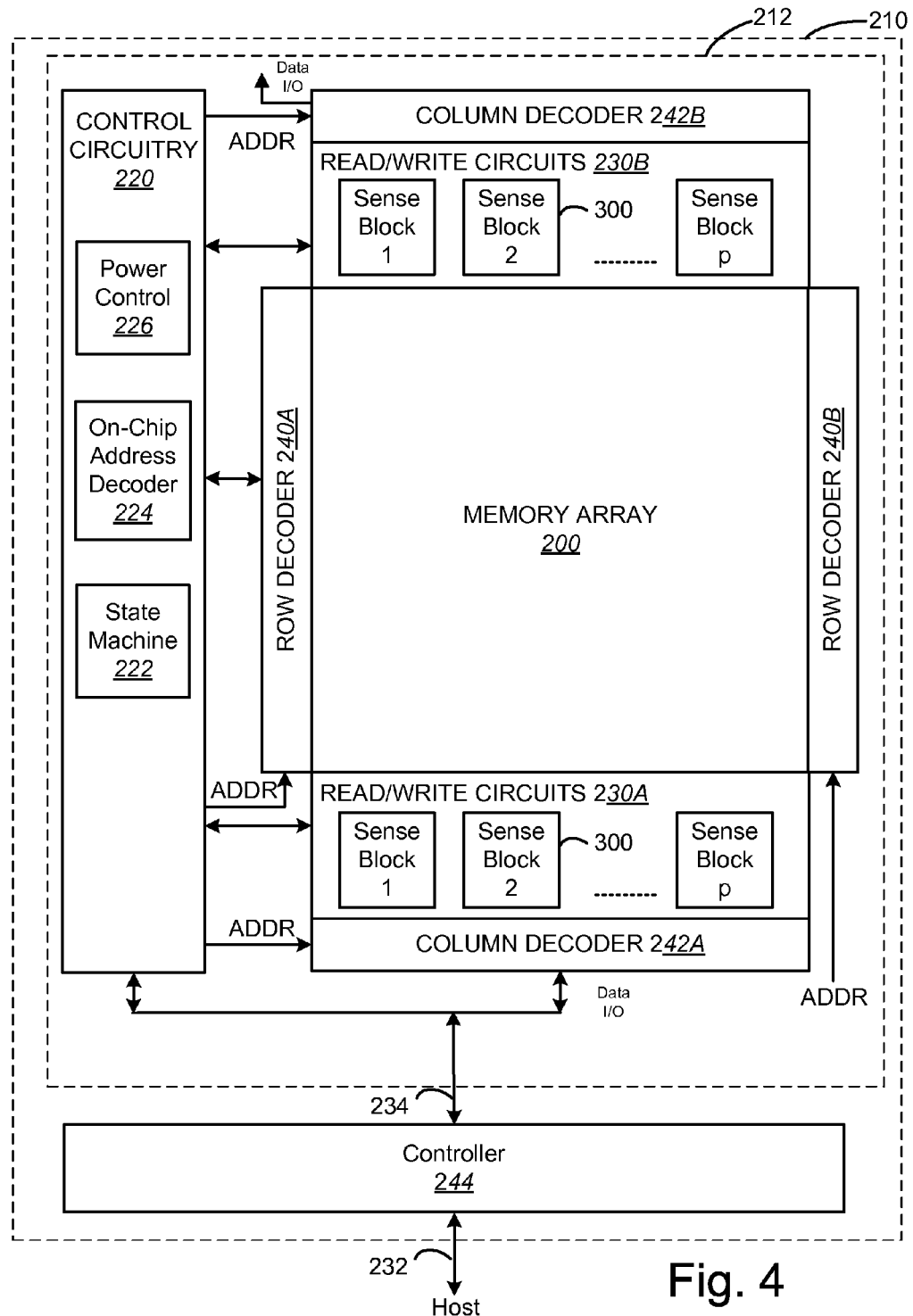
FIG. 4 illustrates a non-volatile storage device that may include one or more memory die or chips.

FIG. 4 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 5:
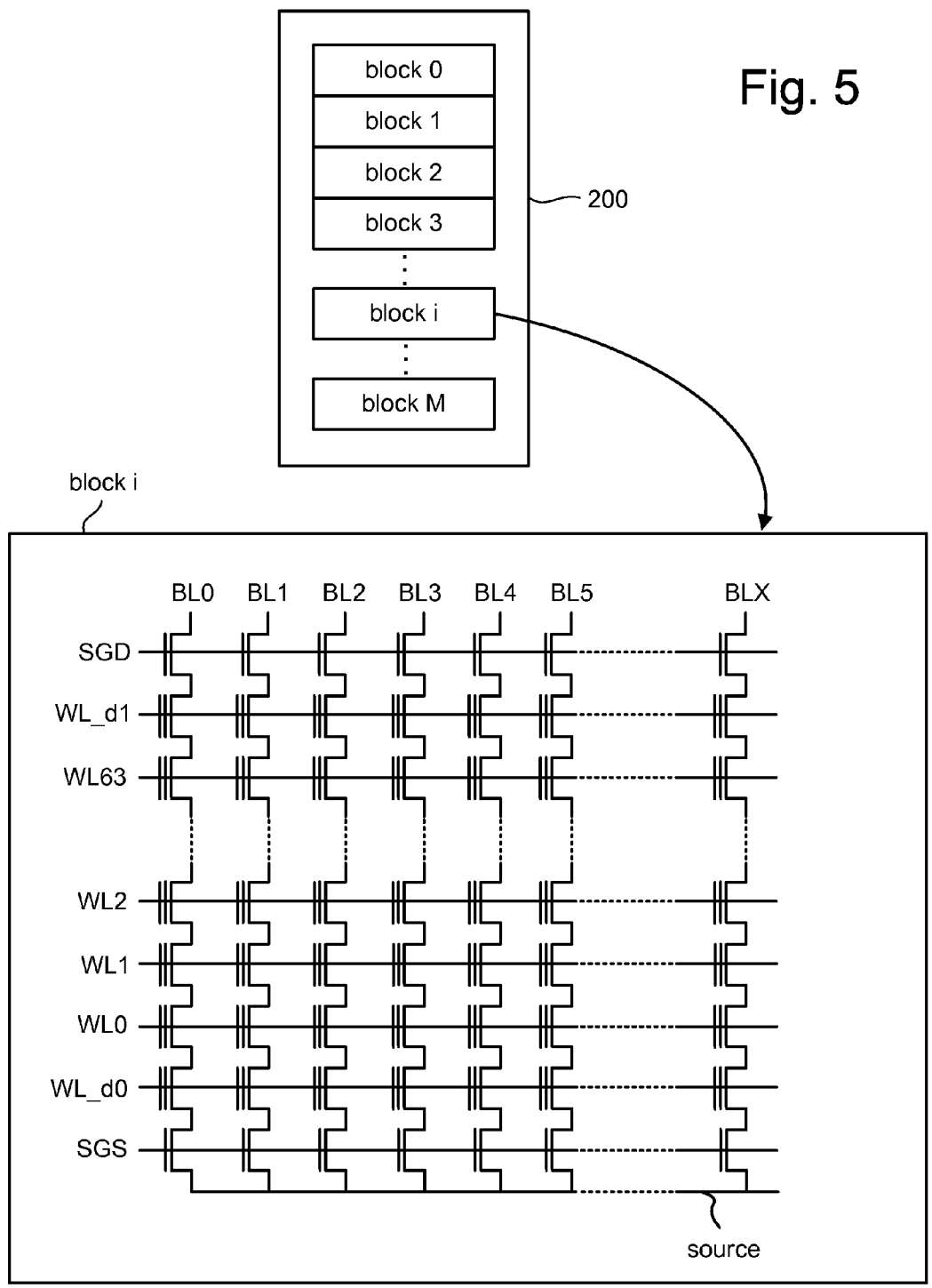
FIG. 5 depicts an exemplary structure of memory cell array.

FIG. 5 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5 also shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 6:
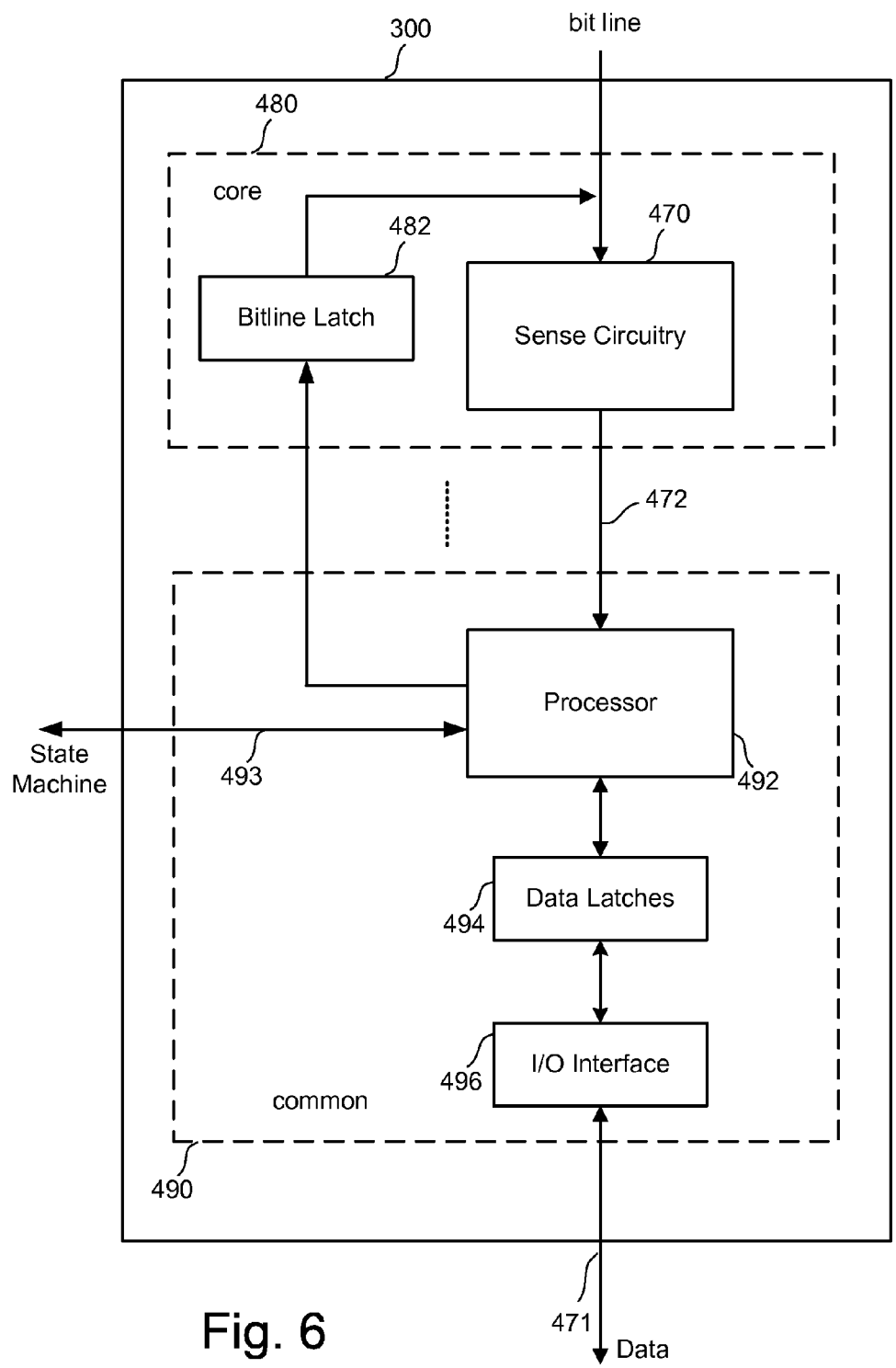
FIG. 6 is a block diagram of an individual sense block.

FIG. 6 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, filed Dec. 29, 2004, and titled, "Non-volatile memory and method with shared processing for an aggregate of read/write circuits," which is hereby incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 471. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 471 during a program operation. The imported data bits represent write data meant to be programmed into the memory. I/O interface 496 provides an interface between data latches 494 and the data bus 471.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 6) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 471. The program operation, under the control of the state machine, comprises a series of programming voltage pulses (with increasing magnitudes) applied to the control gates of the addressed memory cells. Each programming pulse may be followed by a verify process to determine if the memory cell has been programmed to the desired state. Processor 492 monitors the verified memory state relative to the desired memory state. When the two are in agreement, processor 492 may set the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 471, and vice versa. In one embodiment, all the data latches corresponding to the read/write block of M memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Pat. No. 7,046,568; (4) U.S. Pat. No. 7,196,928, "Compensating for Coupling During Read Operations of Non-Volatile Memory," and (5) U.S. Pat. No. 7,327,619, "Reference Sense Amplifier For Non-Volatile Memory". All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 7A depicts example threshold voltage distributions for states of memory cells in which there are eight states. The eight data states include an erase state and states A-G. In this example, three bits may be stored per memory cell. Between each of the data states are read reference voltages used for reading data from memory cells. For example, FIG. 7A shows read reference voltage Vra between data states erase and A, and Vrb between data states A and B. By testing whether the threshold voltage of a given memory cell is above or below the respective read reference voltages, the system can determine what state the memory cell is in. At or near the lower edge of each data state are verify reference voltages. For example, FIG. 7A shows VvA for state A and VvB for state B, etc. When programming memory cells to a given state, the system will test whether those memory cells have a threshold voltage greater than or equal to the verify reference voltage.

FIG. 7B illustrates example threshold voltage distributions corresponding to data states for the memory cell array when each memory cell stores four bits of data. Other embodiments, however, may use more or fewer than four bits of data per memory cell. FIG. 7B shows 16 threshold voltage distributions corresponding to data states 0-15. In the embodiment of FIG. 7B, one odd state and one even state may be verified together. For example, a reference voltage Vv3 may be applied to the selected word line to verify that memory cells are programmed to state 2 and to state 3. One bias condition is used to verify memory cells that are to be programmed to state 2 and another bias condition for state 3. For example, a different FSENSE may be used for each state. Note that three or even more different states could be verified simultaneously if additional bias conditions (e.g., additional FSENSEs) are used.

In some embodiments, the threshold voltages in state 0 are negative and the threshold voltages in the states 1-15 are positive. However, the threshold voltages in one or more of states 1-15 may be negative.

Figure 8A:
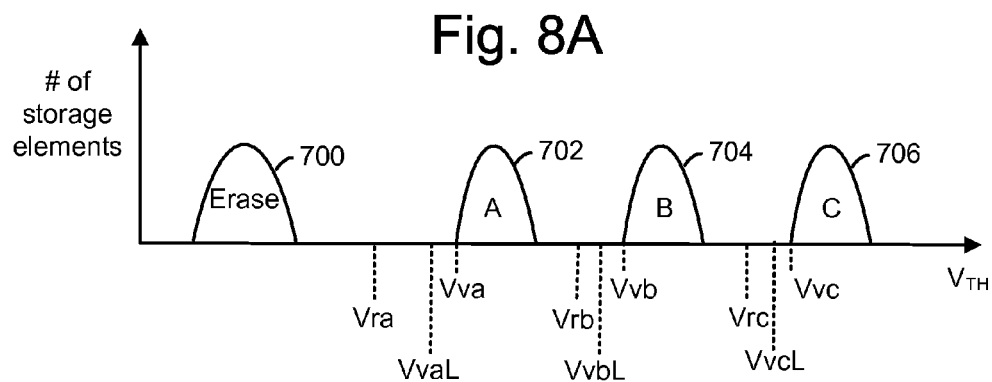
FIG. 8A depicts an example set of threshold voltage distributions for a four-state memory device in which each storage element stores two bits of data.

In some embodiments, a "verify low" and a "verify high" reference voltage is used. FIG. 8A depicts an example set of threshold voltage distributions for a four-state memory device in which each storage element stores two bits of data. A first threshold voltage distribution 700 is provided for erased (Erased-state) storage elements. Three threshold voltage distributions 702, 704 and 706 represent programmed states A, B and C, respectively. In one embodiment, the threshold voltages in the Erased-state are negative, and the threshold voltages in the A-, B- and C-states are positive.

Read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, verify reference voltages, Vva, Vvb, and Vvc are provided. When programming storage elements to the A-state, B-state or C-state, the system will test whether those storage elements have a threshold voltage greater than or equal to Vva, Vvb or Vvc, respectively. In one embodiment, "verify low" reference voltages, Vval, Vvbl, and Vvcl are provided. Similar "verify low" reference voltages could also be used in embodiments with a different number of states.

Figure 8B:
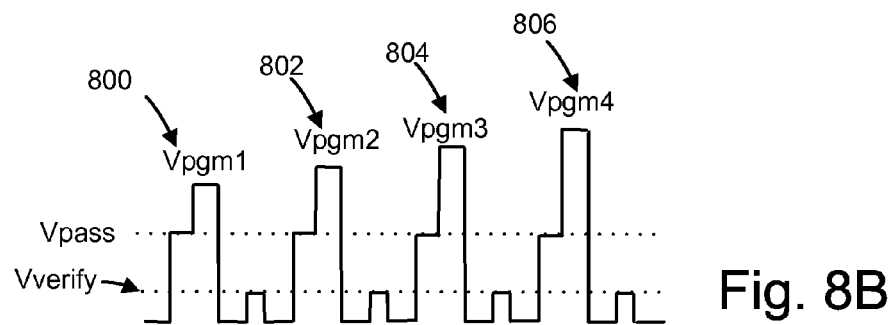
FIG. 8B depicts a series of program and verify pulses which are applied to a selected word line during a programming operation.

In full sequence programming, storage elements can be programmed from the Erased-state directly to any of the programmed states A, B or C. For example, a population of storage elements to be programmed may first be erased so that all storage elements in the population are in the Erased-state. A series of program pulses such as depicted in FIG. 8B is used to program storage elements directly into the A-, B- and C-states. While some storage elements are being programmed from the Erased-state to the A-state, other storage elements are being programmed from the Erased-state to the B-state and/or from the Erased-state to the C-state. Note that using a full sequence programming is not required.

One example of a slow programming mode uses low (offset) and high (target) verify levels for one or more data states. For example, VvaL and Vva are offset and target verify levels, respectively, for the A-state, and VvbL and Vvb are offset and target verify levels, respectively, for the B-state. During programming, when the threshold voltage of a storage element which is being programmed to the A-state as a target state (e.g., an A-state storage element) exceeds VvaL, its programming speed is slowed, such as by raising Vbl to a level, e.g., 0.6-0.8 V, which is between a nominal program or non-inhibit level, e.g., 0 V and a full inhibit level, e.g., 2-3 V. This provides greater accuracy by avoiding large step increases in threshold voltage. When the threshold voltage reaches Vva, the storage element is locked out from further programming. Similarly, when the threshold voltage of a B-state storage element exceeds VvbL, its programming speed is slowed, and when the threshold voltage reaches Vvb, the storage element is locked out from further programming. In one approach, a slow programming mode is not used for the highest state since some overshoot is typically acceptable. Instead, the slow programming mode can be used for the programmed states, above the erased state, and below the highest state.

Moreover, in the example programming techniques discussed, the threshold voltage of a storage element is raised as it is programmed to a target data state. However, programming techniques can be used in which the threshold voltage of a storage element is lowered as it is programmed to a target data state. Programming techniques which measure storage element current can be used as well. The concepts herein can be adapted to different programming techniques.

FIG. 8B depicts a series of program and verify pulses which are applied to a selected word line during a programming operation. A programming operation may include multiple programming iterations, where each iteration applies one or more program pulses (voltages) followed by one or more verify voltages, to a selected word line. In one possible approach, the program voltages are stepped up in successive iterations. Moreover, the program voltages may include a first portion which has a pass voltage (Vpass) level, e.g., 6-8 V, followed by a second portion at a program level, e.g., 12-25 V. For example, first, second, third and fourth program pulses 800, 802, 804 and 806 have program voltages of Vpgm1, Vpgm2, Vpgm3 and Vpgm4, respectively, and so forth. A set of one or more verify voltages may be provided after each program pulse. In some embodiments, a single verify pulse is used to verify memory cells being programmed to different states. For example, a single verify pulse Vverify may be used to verify whether memory cells that are targeted for the A-state have reached Vva, whether memory cells that are targeted for the B-state have reached Vba, and whether memory cells that are targeted for the C-state have reached Vvc. In some embodiments, there may be two or more verify pulses between the program pulses. For example, one pulse might be used to verify the A-state and the B-state, a second may be used to verify the C-state and a D-state, etc. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance.

Mitigating SMT Sensing Variations

Figure 9:
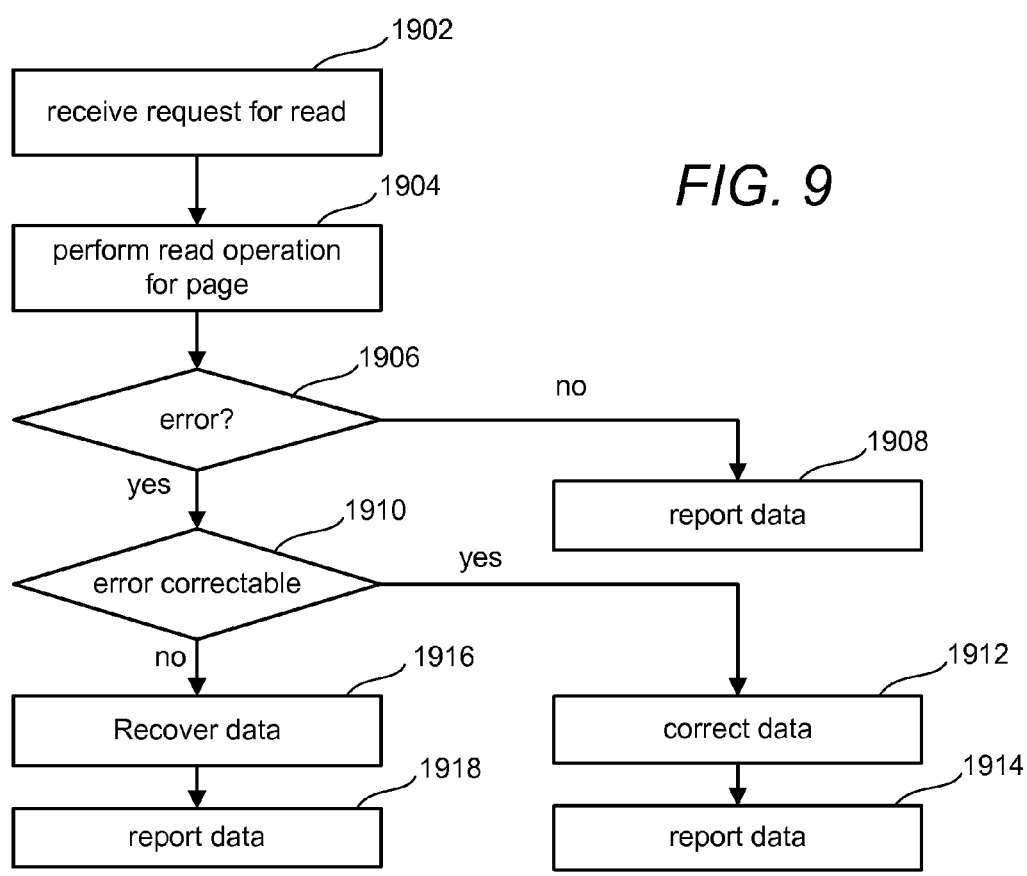
FIG. 9 is a flow chart describing one embodiment for reading data from non-volatile memory cells.

FIG. 9 is a flow chart describing one embodiment for reading data from non-volatile memory cells. FIG. 9 describes one embodiment of a read process at the system level. At step 1902, a request to read data is received. At step 1904, a read operation is performed for a particular page in response to the request to read data. Note that this read operation may be a "normal" read in that all of the memory cells might be read with just one bias condition. For example, even though the memory cells may have been verified using two different FSENSEs, they may be read back using just one FSENSE. However, a suitable compensation is made for the states that were verified with the other FSENSE. Note that this compensation may be to adjust the reading by the expected Vt shift, based on average cell responses to the different bias conditions.

In one embodiment, when data for a page is programmed, the system will also create extra bits used for Error Correction Codes (ECCs) and write those ECC bits along with the page of data. When reading data from a page, the ECC bits will be used to determine whether there are any errors in the data at step 1904. The ECC process can be performed by the controller, the state machine or elsewhere in the system. If there are no errors in the data, the data is reported to the user at step 1908. If an error is found at step 1906, it is determined whether the error is correctable at step 1910. Various ECC methods have the ability to correct a predetermined number of errors in a set of data. If the ECC process can correct the data, then the ECC process is used to correct that data at step 1912 and the data, as corrected, is reported to the user at step 1914.

If the data is not correctable by the ECC process, a data recovery process may be performed at step 1916. Numerous techniques are disclosed herein for recovering the data. In some embodiments, two reads are performed using the two bias conditions used during SMT verify. For example, each memory cell may be read using both a short and a long FSENSE. These readings for each cell may be used to compute initialization values (e.g., LLRs) for a soft ECC decoder. Thus, the data may be recovered. After the data is recovered, that data is reported to the host at step 1918. The process can continue by reading additional pages if necessary while reporting data to the host.

Figure 10:
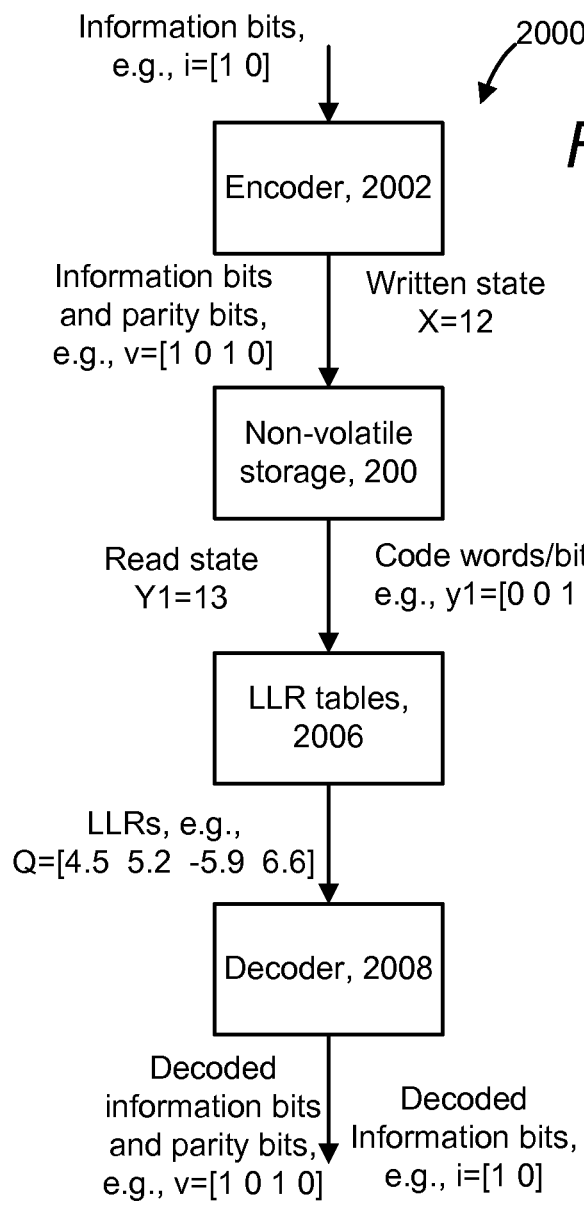
FIG. 10 depicts a system for encoding and decoding data for non-volatile storage that can be used in accordance with one embodiment.

FIG. 10 depicts a system for encoding and decoding data for non-volatile storage that can be used in accordance with one embodiment. Error correction controls are employed to detect and correct readings of erroneous or corrupted data in the non-volatile memory array. Generally speaking, some additional ECC or parity bits are calculated from the input data and stored in the memory array according to an encoding scheme. When reading, the input data and ECC bits are both read, and a decoder uses both to detect whether errors are present and in some cases, in which bit(s) the errors occur.

The error correction control system 2000 of FIG. 10 can be implemented as part of controller 244 in one embodiment, although different systems and architectures can be used. The system of FIG. 10 includes an encoder 2002, memory array 200, LLR (logarithmic likelihood ratio) tables 2006 and a decoder 2008. Note that using LLR tables is one technique for determining initialization values for the decoder 2008; however, other metrics beside LLRs may be used. The encoder 2002 receives user data, also referred to as information bits, that is to be stored in memory array 200. The informational bits are represented by the matrix i=[1 0]. The encoder 2002 implements an error correction coding process in which parity bits are added to the informational bits to provide data represented by the matrix or code word v=[1 0 1 0], indicating that two parity bits have been appended to the data bits. Other techniques can be used that map input data to output data in more complex manners. Low density parity check (LDPC) codes, also referred to as Gallager codes, can be used. In practice, such codes are typically applied to multiple pages encoded across a number of storage elements. Further information regarding LDPCs can be found in D. MacKay, Information Theory, Inference and Learning Algorithms, Cambridge University Press 2003, chapter 47. The data bits can then be mapped to a logical page and stored in the non-volatile storage 200 by programming a non-volatile storage element to a programming state, e.g., X=12, which corresponds to v. With a four-bit data matrix v, sixteen programming states can be used. Generally, parity bits are not used for each individual cell.

In one possible implementation, an iterative probabilistic decoding process is used which implements error correction decoding corresponding to the encoding implemented at the encoder 2002. Further details regarding iterative probabilistic decoding can be found in the above-mentioned D. MacKay text. The iterative probabilistic decoding attempts to decode a code word by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables 2006. LLR values are measures of the reliability with which the values of various binary bits read from the storage elements are known.

The LLR for a bit is given by $$Q = \log \frac{P(v=0 \mid Y)}{P(v=1 \mid Y)},$$

where $P(v=0|Y)$ is the probability that a bit is a 0 given the condition that the read state is Y, and $P(v=1|Y)$ is the probability that a bit is a 1 given the condition that the read state is Y. Thus, an LLR>0 indicates a bit is more likely a 0 than a 1, while an LLR<0 indicates a bit is more likely a 1 than a 0. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the four bit positions in the codeword y1. For example, LLRs of 4.5, 5.2, −5.9 and 6.6 are assigned to bits 0, 0, 1 and 0, respectively, of y1. Further, the LLR tables can account for the multiple read results so that an LLR of greater magnitude is used when the bit value is consistent in the different code words.

The decoder 2008 (also referred to herein as ECC decoder or soft ECC decoder) receives the code word y1 and the LLRs. The decoder 2008 may iterate in successive iterations in which it determines if parity checks of the error encoding process have been satisfied. If all parity checks have been satisfied, the decoding process has converged and the code word has been error corrected. If one or more parity checks have not been satisfied, the decoder may adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of y1 is completed to obtain the decoded information including parity bits v and the decoded information bits i.

Note that the system 2000 could also have a mapper that maps data from the encoder 2002, and a demapper that demaps data from the memory array 200.

Figure 11:
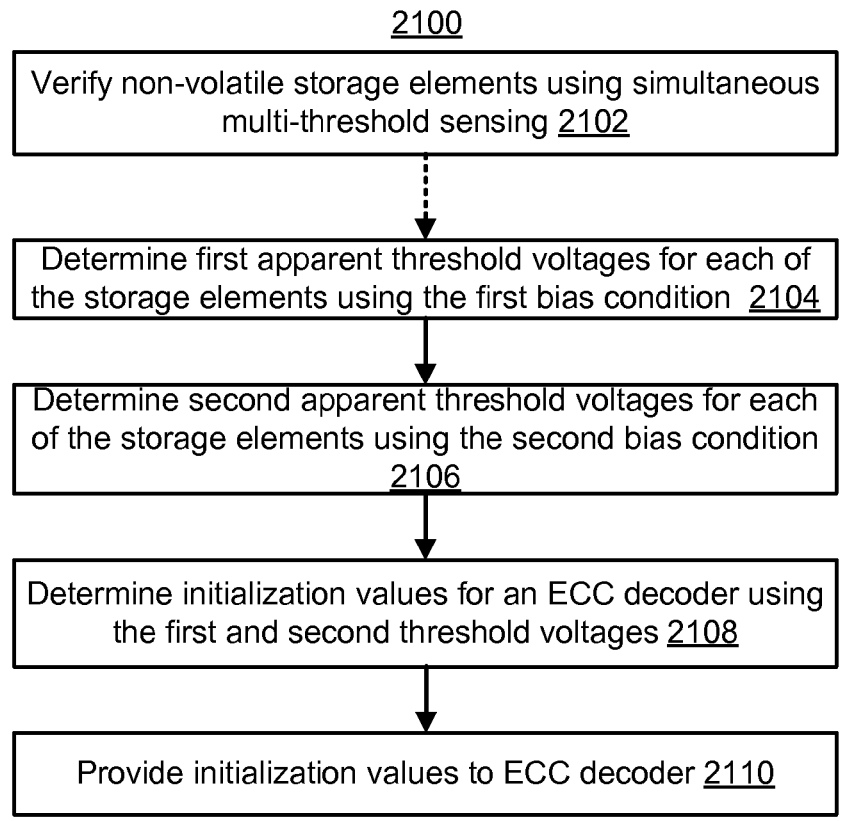
FIG. 11 is a flowchart of one embodiment of a process of reading non-volatile storage.

FIG. 11 is a flowchart of one embodiment of a process 2100 of reading non-volatile storage. Process 2100 may mitigate cell-to-cell variances in being read with a different bias condition than was used to verify. In step 2102, memory cells are verified using SMT sensing. Step 2102 may include verifying a first group of non-volatile storage elements using a first bias condition, and verifying a second group of non-volatile storage elements using a second bias condition. The first group could be memory cells being verified for one set of states (e.g., odd states). The second group could be memory cells being verified for another set of states (e.g., even states). As one example, the first and second groups are associated with the same word line that is being programmed.

There is a dashed line after step 2102 to indicate that some time may pass prior to step 2106. In one embodiment, steps 2104-2110 are only performed if a read process fails (e.g., error correction is unable to read the data). Note that steps 2104-2110 may be part of the recover data step 1916 of FIG. 9.

In step 2104, a first apparent threshold voltage is determined for each of the non-volatile storage elements in the first and second groups using the first bias condition. In one embodiment, reads are performed at numerous read compare voltages, each time using the first bias condition. Note that at this time it is not necessarily known which memory cells are in the first group and which are in the second group. In other words, it is not necessarily known which memory cells were verified using the first bias condition and which the second bias condition. Also, the Vt is referred to as an "apparent" threshold voltage because some of the memory cells are being read with a different bias condition than was used during verify. Therefore, those memory cells are expected to appear to have a different Vt.

In step 2106, a second apparent threshold voltage for each of the non-volatile storage elements in the first and second group using the second bias condition. In one embodiment, numerous reads are performed, each time using the second bias condition.

In step 2108, initialization values are determined for an ECC decoder 2008 using the first apparent threshold voltage and the second apparent threshold voltage for each of the non-volatile storage elements in the first group and the second group. As noted above, the ECC decoder 2008 may use the initialization values to recover the data via an iterative process. In some embodiments, step 2108 involves accessing suitable values from one or more LLR tables 2006, based on the results of the reads of steps 2104 and 2106. However, techniques other than LLR tables may be used. Further details are discussed below.

Figure 12:
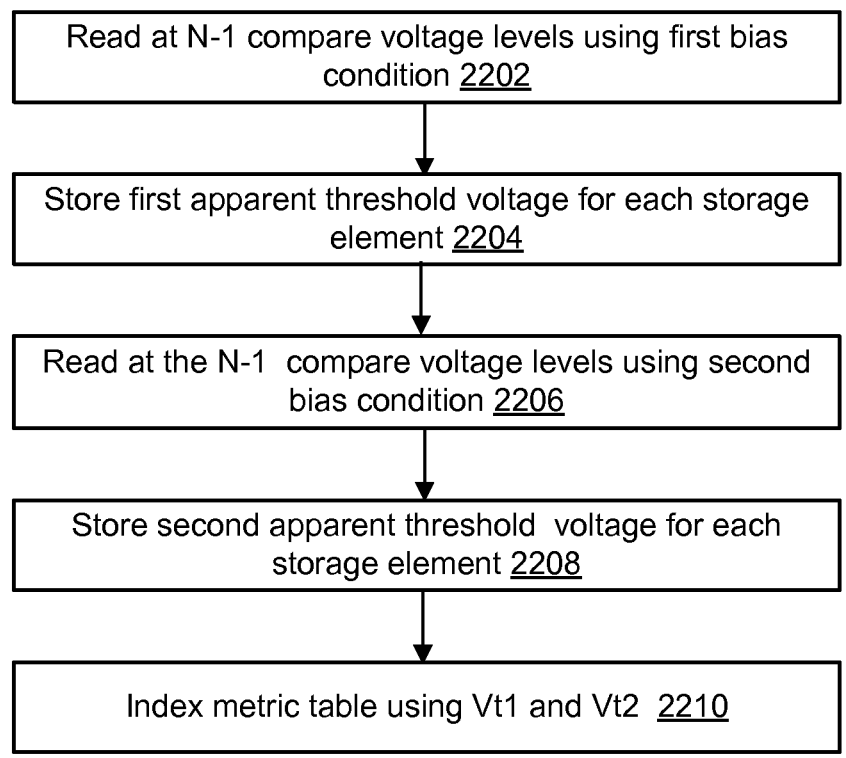
FIG. 12 is a flowchart illustrating one embodiment of a process for determining initialization values for an ECC decoder.

FIG. 12 is a flowchart illustrating one embodiment of a process 2200 for determining initialization values for an ECC decoder 2008. Process 2200 is one embodiment of steps 2104-2108 of FIG. 11. Thus, process 2200 may be performed after a normal read has failed. As noted, process 2200 is typically used when SMT verify has been used. In one embodiment, the SMT uses two bias conditions. This example will be used to describe process 2200. However, it will be noted that process 2200 may be modified to use more than two bias conditions.

In step 2202, a read is performed at "N-1" different reference voltage levels using a first bias condition. This is one of the bias conditions used during SMT verify. For example, it may be a short (or nominal) FSENSE. Note that this could be the same FSENSE that is used during a normal read (step 1904, FIG. 9), but this is not a requirement. The number of reference voltage levels "N-1" may be any number, but typically is high enough to achieve a suitable granularity in readings. Typically, N is greater than the number of data states. For example, N could be 64, even if there are only 4, 8, or 16 data states. Note that it is not required that the reference voltage levels be equally distributed across the Vt range.

In step 2204, a first apparent threshold voltage is stored for each non-volatile storage element. This is based on the readings of step 2202. For example, in step 2202, after each reference voltage is applied to the selected word line, the bit lines are sensed using the nominal FSENSE. A determination is made whether each storage element on the selected word line is considered to have "turned on" in response to the reference voltage. This result may be stored in a data latch in the sense amplifier (or associated with a sense amplifier). In one embodiment, this determination may be made by discharging a sense capacitor for a period of time defined by FSENSE. The final voltage of the sense capacitor may be examined to determine whether the storage element turned on.

Then, the reference voltage is increased and sensing is performed again using the nominal FSENSE. Typically, at some point, the storage element will no longer be considered to have turned on in response to the reference voltage. The apparent Vt of each storage element may be determined based on the lowest reference voltage for which the storage element failed to turn on and/or the highest reference voltage for which the storage element did turn on. Note that steps 2202 and 2204 are one embodiment of step 2104 of FIG. 11.

In step 2206, a read is performed at "N-1" different reference voltage levels using a second bias condition. This is one of the bias conditions used during SMT verify. For example, it may be a long FSENSE.

In step 2208, a second apparent threshold voltage is stored for each non-volatile storage element. This is based on the readings of step 2206. Steps 2206-2208 may be similar to steps 2202-2204, but use a different bias condition. Note that steps 2206-2208 are one embodiment of step 2106 of FIG. 11.

In step 2210, a metric table is indexed using the first and second apparent threshold voltages for each of the storage elements. This may result in an initialization value for each storage element. Note that step 2210 is one embodiment of step 2108 of FIG. 11. In one embodiment, the metric table is an LLR table 2006. Examples of other metric tables are discussed below.

As noted, using LLR tables 2206 is one technique for generating initialization values for a decoder. However, other metrics beside LLRs may be used. In one embodiment, the probability of the bit being "0" (or "1") is used instead of using the log likelihood ratio of the probabilities (i.e., the LLR) as a metric. In this case, the table indexed in step 2210 would be a table of probabilities instead of LLRs, and the ECC decoder would be designed to work with probability metrics instead of LLR metrics.

In one embodiment, likelihood ratios are used instead of log-likelihood ratios. In this case, the table indexed in step 2210 would be a table of Likelihood Ratios (LRs) instead of LLRs, and the ECC decoder would be designed to work with LR metrics instead of LLR metrics.

In one embodiment, the probability difference (P(0)−P(1)), also referred to as "bit expectation" or "soft bit" is used. In this case, the table indexed in step 2210 would be a table of "bit expectation" instead of LLRs, and the ECC decoder would be designed to work with "bit expectation metrics instead of LLR metrics.

Note that all the metrics mentioned above (probabilities, LRs, "bit expectations", LLRs) are equivalent metrics. That is, there is a one-to-one transformation from one metric to another. However, the proposed methods are also applicable to any other arbitrary metric that the decoder is designed to work with. For each such metric, an appropriate computation should be used to determine the metric value given the read Vt1 and Vt2 values (and a table should be computed accordingly).

Further details of one embodiment of an LLR table 2006 that may be suitable for step 2210 will be discussed. One embodiment of the LLR table 2206 may have up to $N^2$ entries, with each entry corresponding to one combination of possible apparent threshold voltages. Note that N−1 may be equal to the number of read reference voltages used in process 2100. The entries in the LLR table 2006 may be referred to as [Vt1, Vt2], where Vt1 is the first apparent threshold voltage and Vt2 is the second apparent threshold voltage. Thus, a given entry contains the LLR for a storage element that was read as having those two apparent Vts. Note that in practice it is not required for the LLR table to contain all possible $N^2$ combinations. Some combinations that are unlikely may be left out of the LLR table 2006. For example, for some embodiments, it is expected the two apparent Vts for a memory cell should be fairly close to each other. Thus, combinations with large differences may be omitted.

In one embodiment, the LLR table 2006 is computed based on a State Transition Matrix (STM). The STM may be of size M×$N^2$, where M is the number of programmed states. As before, N−1 may be the number of read reference values from steps 2202 or 2206. In other words, N may be the possible number of apparent Vts that a storage element may have due to the reading in process 2100. An entry in the STM may be referred to as [i, (j1,j2)], where "i" is the programmed state, and (j1,j2) refers to one possible combination of apparent threshold voltages. In one embodiment, entry [i, (j1,j2)] in the STM is equal to the probability of reading value j1 using the first FSENSE condition and of reading value j2 using the second FSENSE condition, given that state i was programmed.

Figure 13A:
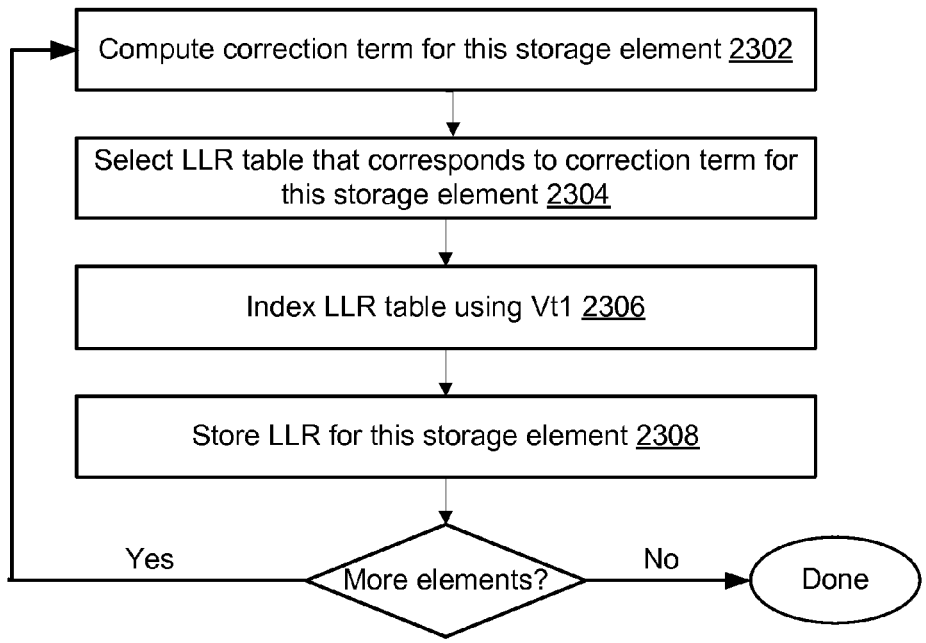
FIG. 13A is a flowchart of one embodiment of a process of determining initialization values for an ECC decoder.

FIG. 13A is a flowchart of one embodiment of a process 2300 of determining initialization values for an ECC decoder 2008. Process 2300 is one embodiment of steps 2104-2108 of FIG. 11. Thus, process 2300 may be performed after a normal read has failed. Process 2300 is typically used when SMT verify has been used. In one embodiment, the SMT uses two bias conditions. This example will be used to describe process 2300. However, it will be noted that process 2300 may be modified to use more than two bias conditions.

Process 2300 involves computing a correction term for each storage element. The correction term may be based on how a storage element responds differently to the two bias conditions than other storage elements. For example, if the average storage element showed a 95 mV Vt shift between using the first and second bias conditions, but this storage element showed a 115 mV shift, then the correction term may be based on this 20 mV deviation.

In process 2300, a number of LLR tables 2006 may be used. There may be one LLR table for each correction term. Each LLR table 2006 may have N entries in one embodiment. Again, N may be the number of possible apparent threshold voltages of storage elements. Thus, each entry may correspond to an apparent Vt.

Process 2300 may use, as input, the apparent threshold voltages of each storage element for each of the bias conditions. Steps 2202-2208 of FIG. 12 may be used for this.

In step 2302 a correction term is determined for one of the storage elements. As noted, this may correct for variances between this storage element and others with respect to the bias conditions. Further details are discussed below.

In step 2304, an LLR table 2006 that corresponds to the correction term is selected.

In step 2306, the selected LLR table 2006 is indexed using an apparent Vt of the storage element. In one embodiment, the Vt that was determined using a nominal bias condition is used. For example, the Vt determined using a nominal FSENSE may be used. However, depending on how the LLR tables were constructed, either apparent Vt might be used.

In step 2308, an LLR for this storage element is stored. The process 2300 continues on with the next storage element. Therefore, an LLR may be determined for each storage element. Note that while FIG. 13A was discussed with respect to LLRs, other metrics (e.g., probabilities, LRs, "bit expectations") may be used.

Figure 13B:
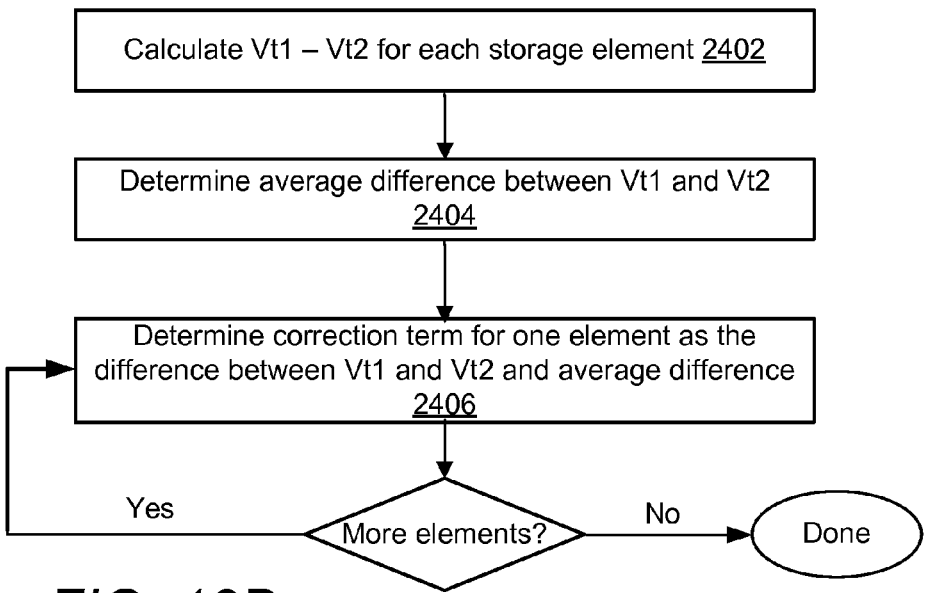
FIG. 13B is a flowchart of one embodiment of a process of determining a correction value for a storage element.

FIG. 13B is a flowchart of one embodiment of a process 2400 of determining a correction value for a storage element. Process 2400 may use, as input, the apparent threshold voltages of each storage element for each of the bias conditions. Steps 2202-2208 of FIG. 12 may be used for this.

In steps 2402 and 2402 an average difference between the two readings for each storage element is determined. Equation 1 describes one technique for making this calculation.

$$\overline{\Delta} = \frac{1}{\#\text{cells}} \sum_j (V_{j,1} - V_{j,2}) \qquad \text{Eq. 1}$$

In Equation 1, the term $V_{j,1}$ and $V_{j,2}$ are the first and second readings for the jth storage element. In step 2402, the difference between the first and second readings (e.g., apparent threshold voltages) for each storage element is determined. In step 2404, the average difference is determined.

Next, a correction term may be calculated for each individual storage element, in step 2406. Equation 2 shows one technique for determining a correction term $\epsilon_j$ for the jth storage element.

$$\epsilon_j = (V_{j,1} - V_{j,2}) - \overline{\Delta} \qquad \text{Eq. 2}$$

Process 2400 may compute a correction term for each of the storage elements. Note that while process 2400 was discussed with respect to LLRs, other metrics (e.g., probabilities, LRs, "bit expectations") may be used.

One embodiment of an LLR table 2006 will now be discussed. This embodiment may be used in process 2300. Reference will be made to FIG. 13C, which shows portions of two threshold distributions. The upper distribution shows states 2-6 for reference. Note that states 0-1 and 8-15 are not depicted in FIG. 13C. Also note that these threshold distributions may correspond to verifying without SMT sensing, and reading in a conventional manner. The lower distribution shows threshold distributions for states 2-6 for a group of cells for which the actual Vt shift due to mismatch between the verify and read bias conditions on odd states is lower by $\epsilon_j$ compared to the expected Vt shift. Another group of cells may exhibit a different Vt shift due to the bias mismatch between verify and read (corresponding to a different $\epsilon_j$ value). These threshold distributions may correspond to verifying with SMT sensing, and reading in accordance with embodiments disclosed herein. In this case, the information regarding the shifted threshold distribution (as shown in FIG. 13C) may be conveyed to the ECC decoder via the LLR values initializing the decoder. The LLR values for the bits stored in a given cell (or the LLR table from which the values are extracted) may be computed according to a threshold distribution model that is a function of the correction term $\epsilon_j$ that was computed for the specific cell. Conversely, if conventional decoder initialization is performed (e.g. based on a conventional read using a single nominal bias condition) then the LLRs may be computed according to a threshold distribution which is the combination of multiple threshold distributions each one having a different $\epsilon_j$ value (as the decoder initialization is unaware of the different $\epsilon_j$ of each cell). Hence, the threshold distributions of odd states in this case would have wider lobes, resulting in higher overlap between the distributions of different states and in less certainty of the bit values and less informative LLR values. This in turn would reduce the probability of the ECC decoder to succeed (or may require higher ECC redundancy in order to maintain the same success probability).

Notice that the even threshold distributions may be centered at about the same voltage, although this is not a requirement. The odd threshold distributions are offset in the distributions at the bottom of FIG. 13C. In this example, the odd threshold distributions are offset by a correction term. Thus, the state centers in this case may be given by Equation 3.

$$[\mu_0\mu_1-\epsilon_j, \mu_2\mu_3-\epsilon_j \ldots] \qquad \text{Eq. 3}$$

The values, μ, are the nominal state centers. For example, this is the case assuming no SMT noise. A correction term is applied to the center of the nominal state centers of the odd states. This is based on the assumption that even states were verified using a nominal bias condition (e.g., short FSENSE) and odd states were verified using a modified bias condition (e.g., long FSENSE). Note that during a normal read (e.g., step 1904, FIG. 9), the nominal bias condition may be used. Thus, the correction term may be applied to the states that are impacted by SMT noise.

Referring back to the selection of the LLR table 2006 in step 2306 of FIG. 13A, the LLRs of cell j may be computed based on the first read value Vj1 with respect to the estimated state centers of the specific cell j, which are a function of the correction term $\epsilon_j$, e.g., the estimated state centers may be given by $[\mu_0\mu_1-\epsilon_j, \mu_2\mu_3-\epsilon_j \ldots ]$. In one embodiment, several LLR tables 2006 are computed offline. Each LLR table 2006 may correspond to a different error term (see $\epsilon_j$, FIG. 13C). Then, when FIG. 13A is performed, a suitable LLR table 2006 is selected based on the error correction term that was calculated for the storage element.

Figure 14:
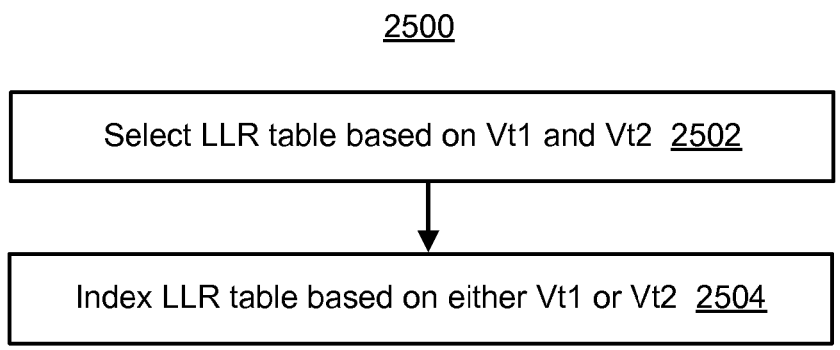
FIG. 14 describes a flowchart of one embodiment of a process of determining initialization values for an ECC.

FIG. 14 describes a flowchart of one embodiment of a process 2500 of determining initialization values for an ECC. Process 2500 is one embodiment of steps 2104-2108 of FIG. 11. Thus, process 2500 may be performed after a normal read has failed. Process 2500 describes determining LLR for one storage element.

In step 2502 an LLR table 2006 is selected based on the first and second apparent threshold voltages of the storage element. One technique for this selection is to compute a correction term $\epsilon_j$ for the storage element. Then, an LLR table 2006 may be selected based on the correction term $\epsilon_j$. However, another technique may be used to selected an LLR table 2006 based on the first and second apparent threshold voltages of the storage element.

In step 2504, the selected LLR table 2006 is indexed based on either the first and second apparent threshold voltages of the storage element. Whether the first or second apparent threshold voltage is used may depend on how the LLR table 2006 was constructed. Note that while process 2500 was discussed with respect to LLRs, other metrics (e.g., probabilities, LRs, "bit expectations") may be used.

Figure 15A:
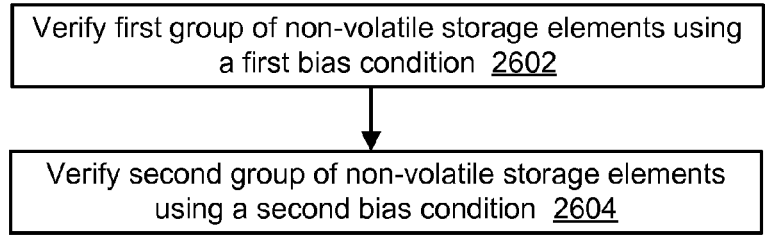
FIG. 15A is a flowchart of one embodiment of a process of SMT verifying during a program operation.

FIG. 15A is a flowchart of one embodiment of a process of SMT verifying during a program operation. The process is one embodiment of step 2102 of FIG. 11. In step 2602, a first group of non-volatile storage elements are verified using a first bias condition. This first bias condition may be referred to as a "nominal" bias condition.

In step 2604, a second group of non-volatile storage elements are verifying using a second bias condition. The first group could be storage elements being programmed to a first set of states, and the second group could be storage elements being programmed to a second set of states.

Note that SMT sensing can use more than two bias conditions. Thus, a third group of storage elements could be verified using a third bias condition, a fourth group of storage elements could be verified using a fourth bias condition, etc.

Figure 15B:
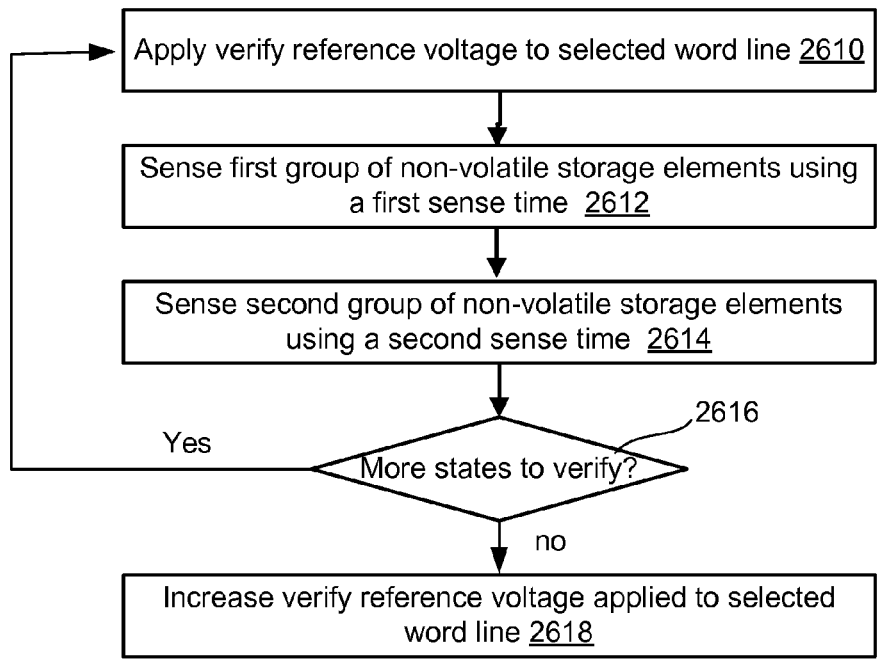
FIG. 15B is a flowchart of one embodiment of a process of SMT sensing in which two FSENSEs are used.

FIG. 15B is a flowchart of one embodiment of a process of SMT sensing in which two FSENSEs are used. In step 2610, a verify reference voltage is applied to a selected word line.

In step 2612, a first group of storage elements are sensed using a first (e.g., nominal) FSENSE. As one example, these could be storage elements being programmed to state 1.

In step 2624, a second group of storage elements are sensed using a second FSENSE. In one embodiment, this is a longer FSENSE than the nominal FSENSE. However, this could instead be a shorter FSENSE. In the first example (longer FSENSE➔ Vt shift down), these could be storage elements being programmed to state 0. In the second example (shorter FSENSE➔ Vt shift up), the storage elements may be programmed to state 2. Note that both steps 2612 and 2614 may be performed in response to step 2610.

In step 2616 a determination is made whether there are more states to verify. If so, the verify reference voltage is increased. In one embodiment, it is stepped up by two reference levels. Thus, the next nominal FSENSE (step 2612) might test memory cells being programmed to state 3. The next application of step 2614 might test memory cells being programmed to state 4. After the process completes, one or more additional program pulses may be applied. Note that it is not required that every state be verified each time. For example, verification of the highest states might be skipped early in programming. Likewise, verification of lower states might be skipped later in programming.

The following is a brief analysis of SMT noise mitigation during read. The analysis shows an advantage(s) of embodiments disclosed herein as compared to conventional read and decoder initialization methods, in terms of the ECC redundancy that is required in order to achieve a desired memory reliability, in a memory that is using SMT during programming. The discussion will be with respect to FSENSE, but applies to other bias conditions. Let the various "noises" governing the basic threshold voltage distribution width when using conventional sensing be modeled by a Gaussian noise term, denoted as "noise-1", having standard deviation of $\sigma_{base}$. When using SMT sensing, an additional noise term may be added due to the FSENSE variations. Let this noise term be modeled as a Gaussian noise term, denoted as "noise-2" and having standard deviation of $\sigma_{FSENSE}$. Assuming SMT is used for dual state verify, then the "noise-2" term affects half of the states—e.g., the states that are read at a different bias than the one they were verified with.

Figure 16A:
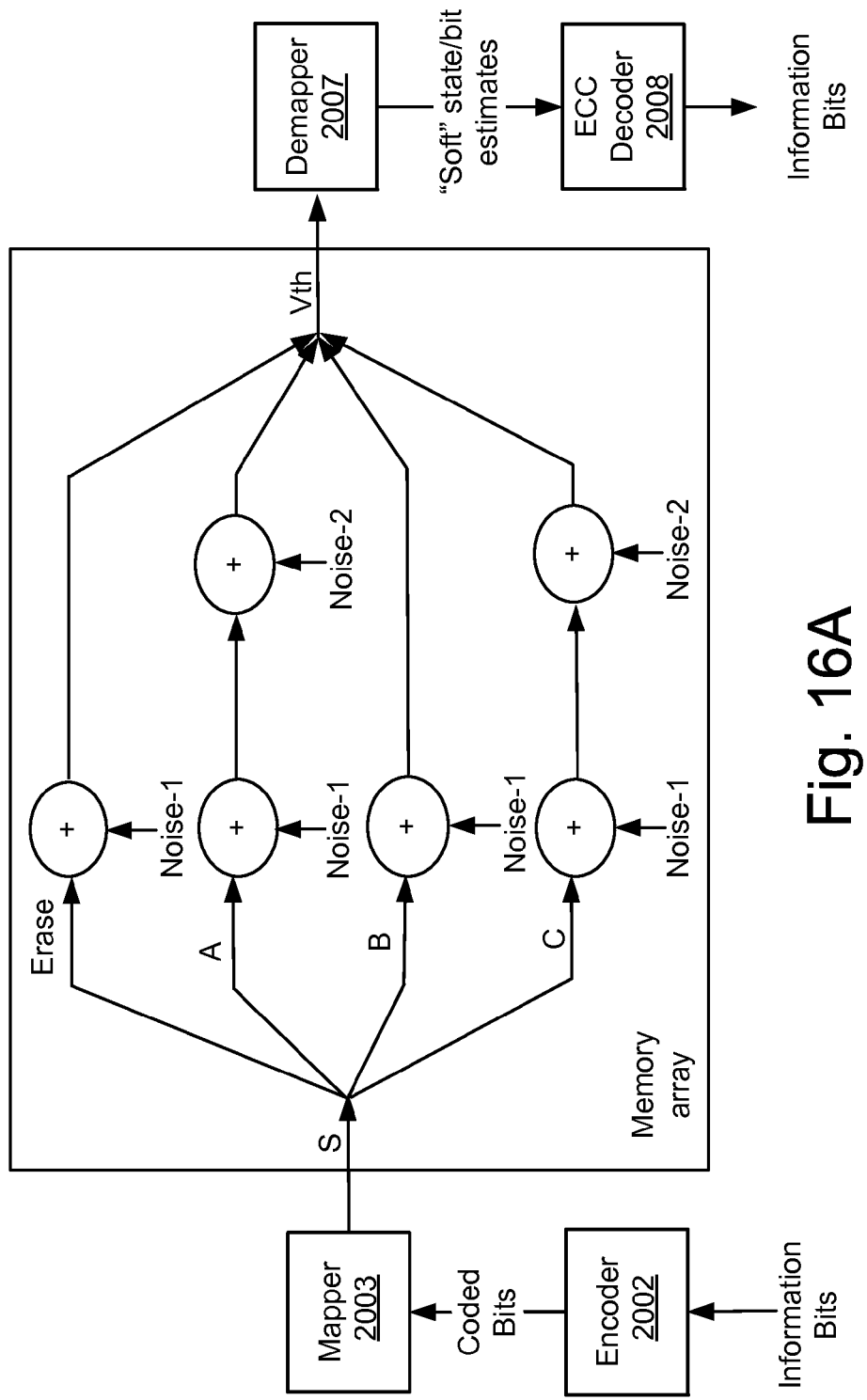
FIG. 16A is a diagram illustrating SMT noise affecting conventional reading.
Figure 16B:
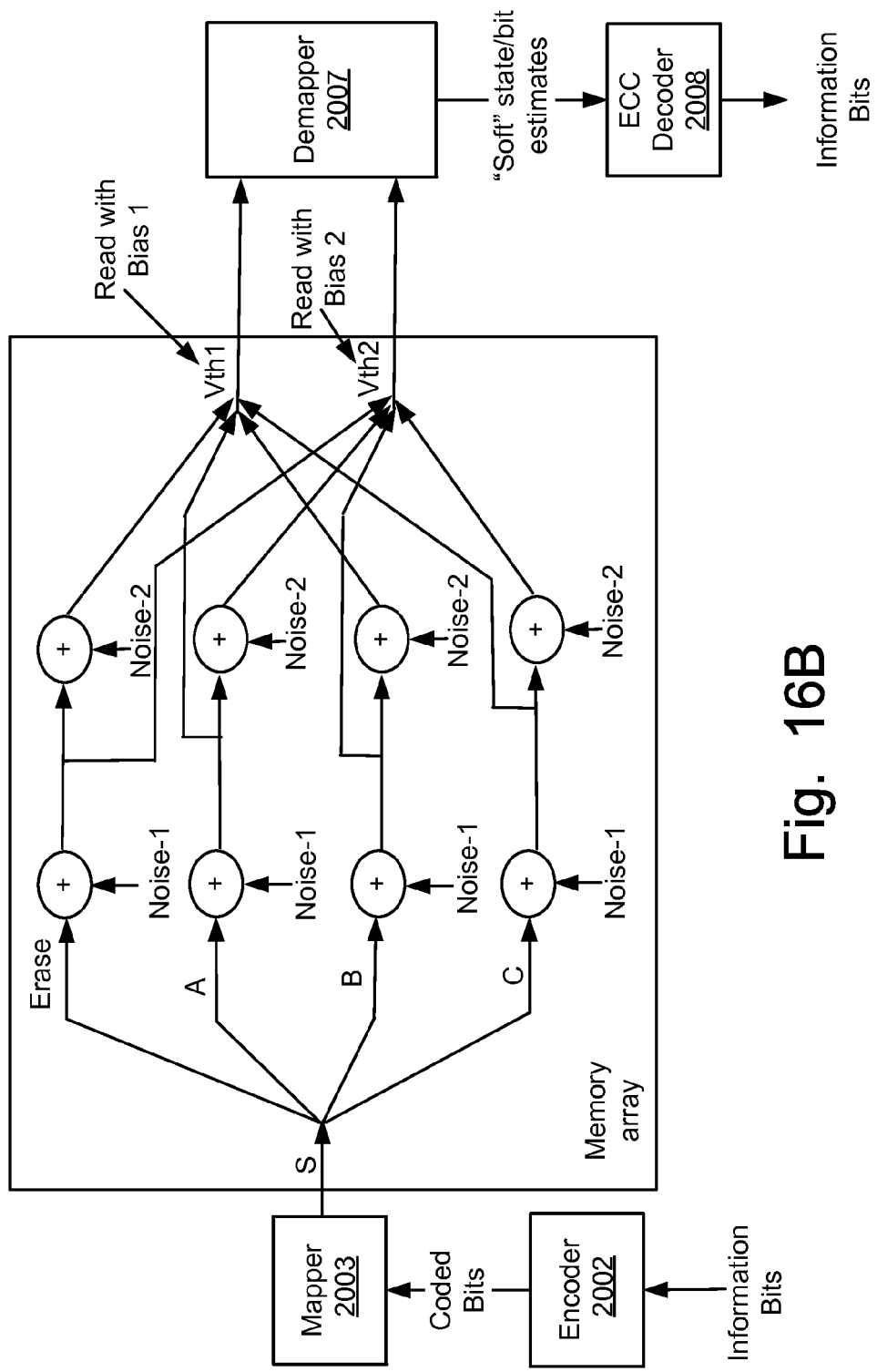
FIG. 16B is a diagram illustrating mitigating SMT noise in accordance with one embodiment.

FIG. 16A illustrates conventional reading using a single read operation. FIG. 16B illustrates a multiple reading approach, in which each cell is read twice (e.g., with two FSENSE conditions), in accordance with embodiments. One embodiment of a multiple reading approach may mitigate the effect FSENSE variations. In FIGS. 16A and 16B, the input S, which is the programmed state of a cell, could be from a mapper 2003, and the output may go to a demapper 2007.

The redundancy required by the various reading methods can be computed analytically using information theoretic tools. Information theory ensures that reliable storage is possible in a memory "channel" (as depicted in FIG. 16A and FIG. 16B), using an ECC scheme, if the ECC redundancy R is greater or equal than $$1 - \frac{c}{\log_2(M)},$$

where M is the number of possible data states and C is the cell's capacity (measured in information bits per cell), which is given by:

$$C = \sum_{S,V_{TH}} P(S)P(V_{TH}\mid S)\log_2\left(\frac{P(V_{TH}\mid S)}{\sum_s P(S)P(V_{TH}\mid S)}\right),$$

Here, S is a random variable representing the cell's programmed state and $V_{TH}$ is a random variable representing the cell's read threshold voltage.

Assuming that random data is stored, or that a scrambling mechanism is used, then $\forall S \in \{S_1, S_2, \ldots, S_M\}$ $P(S)=1/M$.

The read cell's $V_{TH}$ may be quantized. Thus, under this assumption, $V_{TH}$ can take only a finite set of N values $\{V_1, V_2, \ldots, V_N\}$, where N−1 is the number of reading thresholds [we used the notation N so far]. A cell's read voltage may be $V_{TH} \in \{V_1, V_2, \ldots, V_N\}$ if the actual cell threshold voltage $v_{th}$ satisfies: $LTH(V_{TH}) \leq v_{th} \leq UTH(V_{TH})$, where LTH and UTH are functions that match lower and upper reading thresholds for each of the N possible read values $\{V_1, V_2, \ldots, V_N\}$.

For conventional sensing (which is equivalent to FIG. 16A with $\sigma_{FSENSE}=0$), assuming a Gaussian CVD model with equal standard deviation $\sigma_{base}$ for all states, the conditional probability function $P(V_{TH}\mid S)$ is given by:

$$Pr(V_{TH}\mid S) \int_{LTH(V_{TH})}^{UTH(V_{TH})} \frac{1}{\sqrt{2\pi\sigma_{base}^2}} e^{-\frac{(v-\mu_s)^2}{2\sigma_{base}^2}} dv,$$

where $\mu_s$ is the mean value of state S CVD.

For SMT sensing with a conventional single read method and using the model shown in FIG. 16A, with basic standard deviation base and FSENSE variations noise standard deviation $\sigma_{FSENSE}$. In this case the conditional probability function $P(V_{TH}\mid S)$ is given by:

$$\int_{v=LTH(V_{TH})}^{UTH(V_{TH})} \frac{1}{\sqrt{2\pi\sigma_{base}^2}} e^{-\frac{(v-\mu_s)^2}{2\sigma_{base}^2}} dv, \text{ odd}$$

$$\int_{v_1=-\infty}^{\infty}\int_{v_2=LTH(V_{TH})}^{UTH(V_{TH})} \frac{1}{\sqrt{2\pi\sigma_{FSENSE}^2}} e^{-\frac{(v_2-v_1)^2}{2\sigma_{FSENSE}^2}} \cdot \frac{1}{\sqrt{2\pi\sigma_{base}^2}} e^{-\frac{(v_1-\mu_s)^2}{2\sigma_{base}^2}} dv_1 dv_2, \text{ even}$$

For SMT sensing with the dual read methods, and using the model shown in FIG. 16B, with basic standard deviation $\sigma_{base}$ and FSENSE variations noise standard deviation $\sigma_{FSENSE}$.

For one embodiment of the process of FIG. 12, the cell capacity C, is given by:

$$C = \sum_{S,V_{TH1},V_{TH2}} P(S)P(V_{TH1},V_{TH2}\mid S)\log_2\left(\frac{P(V_{TH1},V_{TH2}\mid S)}{\sum_s P(S)P(V_{TH1},V_{TH2}\mid S)}\right)$$

Where, the conditional probability function $P(V_{TH1},V_{TH2}\mid S)$ is given by:

$$\int_{v_1=LTH(V_{TH1})}^{UTH(V_{TH1})}\int_{v_2=LTH(V_{TH2})}^{UTH(V_{TH2})} \frac{1}{\sqrt{2\pi\sigma_{FSENSE}^2}}$$
$$e^{-\frac{(v_2-v_1)^2}{2\sigma_{FSENSE}^2}} \cdot \frac{1}{\sqrt{2\pi\sigma_{base}^2}} e^{-\frac{(v_1-\mu_s)^2}{2\sigma_{base}^2}} dv_1 dv_2, \text{ odd}$$

$$\int_{v_1=LTH(V_{TH2})}^{UTH(V_{TH2})}\int_{v_2=LTH(V_{TH1})}^{UTH(V_{TH1})} \frac{1}{\sqrt{2\pi\sigma_{FSENSE}^2}}$$
$$e^{-\frac{(v_2-v_1)^2}{2\sigma_{FSENSE}^2}} \cdot \frac{1}{\sqrt{2\pi\sigma_{base}^2}} e^{-\frac{(v_1-\mu_s)^2}{2\sigma_{base}^2}} dv_1 dv_2, \text{ even}$$

For one embodiment of the process of FIG. 13A, the cell capacity C, is given by:

$$C = \int_\varepsilon P(\varepsilon) \cdot C(\varepsilon) \cdot d\varepsilon$$

Where, $$P(\varepsilon) = \frac{1}{\sqrt{2\pi\sigma_{FSENSE}^2}} e^{-\frac{\varepsilon^2}{2\sigma_{FSENSE}^2}},$$

$$C(\varepsilon) = \sum_{S,V_{TH1}} P(S)P(V_{TH1}\mid S,\varepsilon)\log_2\left(\frac{P(V_{TH1}\mid S,\varepsilon)}{\sum_s P(S)P(V_{TH1}\mid S,\varepsilon)}\right)$$

and the conditional probability function $P(V_{TH1}\mid S,\varepsilon)$ is given by:

$$\int_{v=LTH(V_{TH})}^{UTH(V_{TH})} \frac{1}{\sqrt{2\pi\sigma_{base}^2}} e^{-\frac{(v-\mu_s)^2}{2\sigma_{base}^2}} dv, \text{ odd } S$$

$$\int_{v=LTH(V_{TH})}^{UTH(V_{TH})} \frac{1}{\sqrt{2\pi\sigma_{base}^2}} e^{-\frac{(v-\mu_s-\varepsilon)^2}{2\sigma_{base}^2}} dv, \text{ even } S$$

Note that the computations above assume that the demapper 2007 outputs "soft" state estimates (i.e. state LLRs). In case, the demapper 2007 outputs "soft" bit estimates (i.e. bit LLRs), as done in most ECC decoders, then the capacity computations would be different and would depend on the bit to state mapping.

Note that using LLR tables are one example of a metric for decoder initialization. LLR tables may be convenient for decoder hardware fixed point implementation, but other techniques may be used (for any decoder implementations). Thus, other metrics may be used. In one embodiment, the probability of the bit being "0" (or "1") is used instead of using the probabilities of the LLR. In one embodiment, likelihood ratios are used instead of log-likelihood ratios. In one embodiment, the probability difference (P(0)−P(1)), also referred to as "bit expectation" or "soft bit" is used. Thus, other techniques may be used to determine the decoder initialization values or metrics.

SMT Sensing

The following describes additional details of some embodiments of SMT sensing. In one embodiment, different voltages are applied between the gate and source of memory cells while reading or verifying memory cells. For example, in order to verify different threshold voltages during the same verify operation different voltages are applied between the gate and source of memory cells. As another example, in order to apply different amounts of compensation for cross-coupling effects different voltages are applied between the gate and source of memory cells. In one embodiment, a memory cell on one NAND string is tested to determine if its threshold voltage is at least at Vva at the same time that a memory cell on another NAND string is tested to determine if its threshold voltage is at least at Vvb. At this same time, a third memory cell on a third NAND string may be tested to determine whether its threshold voltage is above Vvc.

Applying Different Bias Conditions to Different Selected Memory Cells

FIG. 17A is a schematic diagram of a circuit that is able to apply different gate-to-source voltages across a selected memory cell on different strings of memory cells. The schematic will be used to explain principles of one embodiment. The voltage Vcgrv may be applied to the selected word line (e.g., WL2), while Vread may be applied to unselected word lines. The circuit has switches S1-S8 for connecting voltages VD, VD−Δ, VS, and VS−Δ to the strings of memory cells. Note that there may be many more strings than two. Also note that in this example, the strings of memory cells are not connected by a common source line.

Switches S2 and S5 may be closed such that VD−VS appears across one string. Alternatively, switches 51 and S6 may be closed such that (VD−Δ)−(VS−Δ) or VD−VS appears across that string. Therefore, the Vds of the selected memory cell will be about the same with either switch configuration. However, Vgs will be Vcgrv−VD for one and Vcgrv−VD+Δ for the other. Therefore, Vgs can be altered without altering Vds. Switches S3, S4, S7, and S8 can be used in a similar manner for the other string of memory cells. Therefore, a different Vgs can be applied to the strings while applying the same Vcgrv to the selected word line. Consequently, two different threshold voltages can be tested for while applying the same Vcgrv to the selected word line.

Figure 17B:
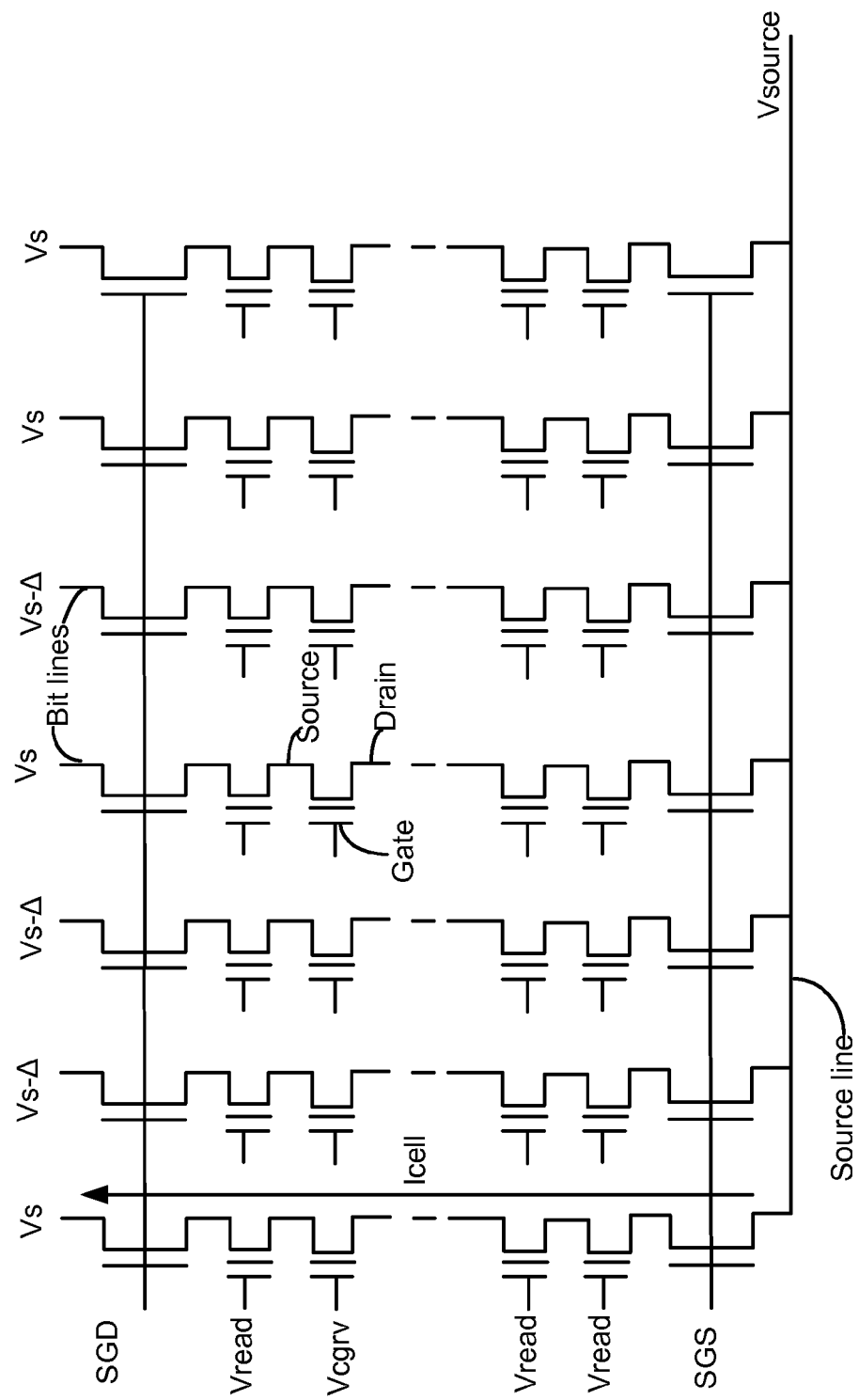
FIG. 17B is a schematic diagram of NAND strings that have different voltages applied across them during a verify operation.

FIG. 17B is a schematic diagram of NAND strings that have different voltages applied across them during a read operation. This circuit may be used when verifying different threshold voltages for different memory cells on the same word line, for applying different amounts of cross coupling compensation to different memory cells on the same word line during a read or program verify, as examples. The circuit may have other uses that involve reading two different threshold voltages at the same time.

The NAND strings are electrically connected at one end by a common source line. At the other end, each NAND string is electrically connected to a separate bit line. The word lines that electrically connect gates of a row of memory cells are not shown so as to not obscure the diagram. The memory cells that are associated with the selected word line are selected for reading or verifying. That is, each of these memory cells is to have its threshold voltage compared to some reference voltage during a verify (or read) operation. Different memory cells may have their threshold voltages compared to at least two different reference voltages. For example, referring briefly to FIG. 8A, one memory cell has its threshold voltage compared to Vva, while another has its threshold voltage compared to Vvb. A third memory cell might have its threshold voltage compared to Vvc. If, for example, this is performed during the verify stage of programming the memory cells, then each memory cell can be verified at the same time. For example, referring to FIG. 8B, after each program pulse, a single verify signal (Vverify) is applied to the selected word line in order to test the threshold voltage of all the memory cells being programmed. Therefore, time can be saved in that fewer verify operations are used between program pulses. Furthermore, since fewer verify operations are required, power can be saved.

Referring again to FIG. 17B, a read reference voltage (e.g., Vcgrv) is applied to the selected word line while a read pass voltage (e.g., Vread) is applied to unselected word lines. Therefore, each of the selected memory cells has Vcgrv applied to its gate. The read pass voltage (Vread) is a voltage level that should cause an unselected memory cell to turn on (e.g., to conduct a current) regardless of the state that it is programmed to. One group of memory cells have their bit lines biased to Vs and another group have their bit lines biased to Vs−Δ. For example, memory cells that are being tested for one threshold voltage have their bit lines biased to Vs, whereas memory cells that are being tested for a different threshold voltage have their bit lines biased to Vs−Δ. Note that still other memory cells could be tested for still another threshold voltage by applying still another voltage to their bit lines. In this embodiment, a voltage Vsource is applied to the common source line. The voltage Vsource is larger than the voltages applied to the bit lines. Therefore, the conduction current (Icell) flows from the source line to the bit line. In effect, the bottom of the memory cells functions as the drain and the top of the memory cells functions as the source. The gate, source and drain of one of the selected memory cells have been labeled. Note that a selected memory cell will turn on if its threshold voltage is equal to or less than the gate to source voltage. Also note, that as previously mentioned, for consistency in description the line the joins the NAND strings together at the bottom of FIG. 9B will be referred to as a common source line even though the bottom of the memory cells are functioning as a drain. In one embodiment, the Vt of the cell is measured depending on both Vgs and Vds of the voltage bias. Note that if Δ is relatively small, then Vds of memory cells on the bit lines having Vs applied will be very close to Vds of the bit lines having Vs−Δ applied.

Figure 17C:
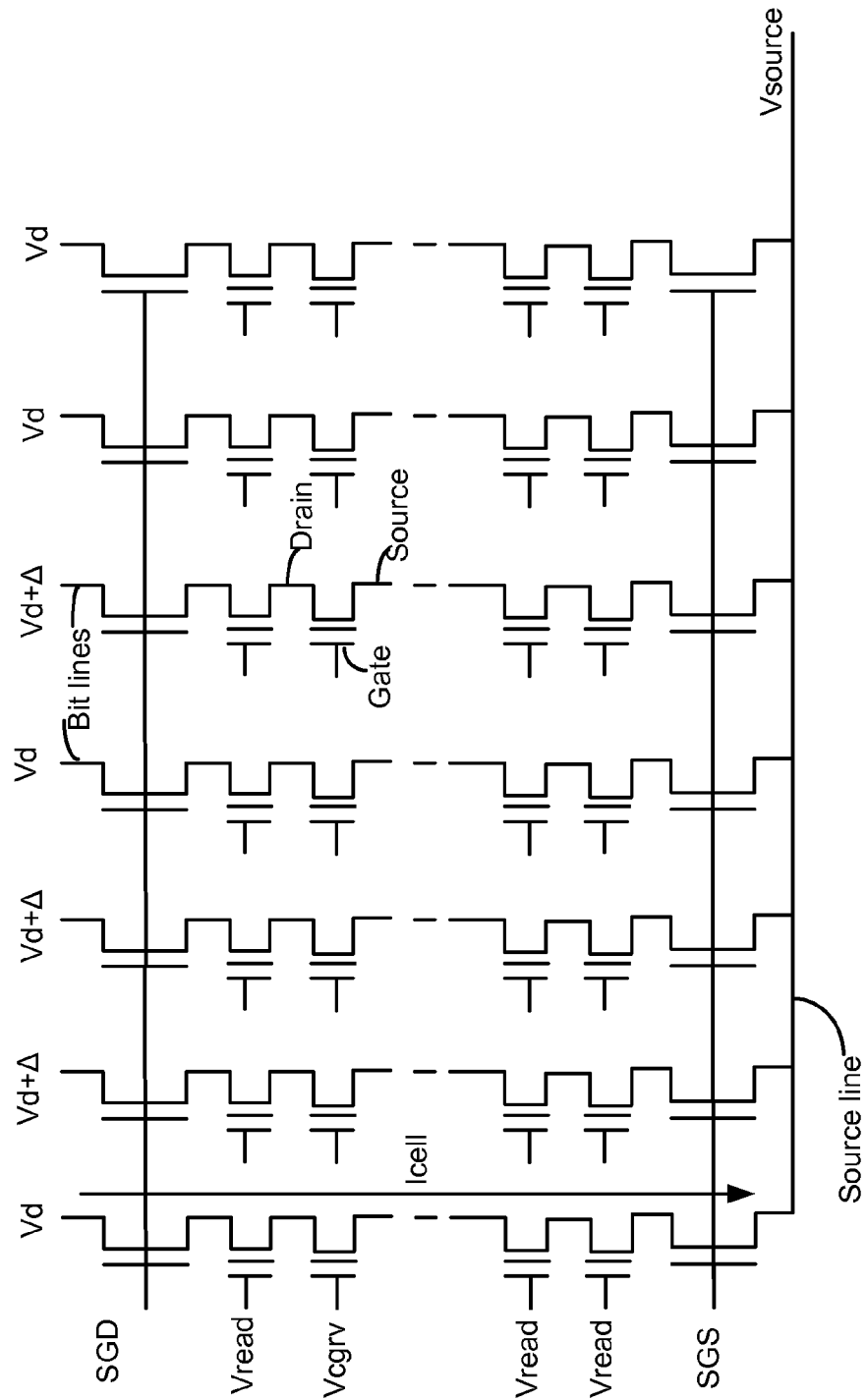
FIG. 17C is a schematic diagram of NAND strings that have different voltages applied across them during a verify operation.

FIG. 17C is a schematic diagram of NAND strings that have different voltages applied across them during a verify operation. This circuit may be used when verifying different threshold voltages for different memory cells on the same word line, for applying different amounts of cross coupling compensation to different memory cells on the same word line during a read or program verify, as examples. The circuit may have other uses that involve reading two different threshold voltages at the same time. The structure is similar to the one of FIG. 9B. However, the voltages applied to the bit lines are higher than the voltage applied to the common source line. Therefore, the top of the selected memory cell functions as the drain and the bottom of the selected memory cell functions as the source. The conduction current flows from the bit line to the source line in this embodiment. A read reference voltage (Vcgrv) is applied to the selected word line while a read pass voltage (Vread) is applied to unselected word lines. One of the selected memory cells has its gate, source, and drain labeled. Note that the drain and source are switched compared to FIG. 17B due to the way in which voltages are being applied across the NAND strings.

One group of memory cells have their bit lines biased to Vd, whereas another group of memory cell have their bit lines biased to Vd+Δ. For example, memory cells that are being tested for one threshold voltage have their bit lines biased to Vd, whereas memory cells that are being tested for a different threshold voltage have their bit lines biased to Vd+Δ. Note that in this example, each memory cell on the selected word line experiences the same gate to source voltage. That is, all selected memory cells have the same gate voltage and the NAND strings are joined by the common source line. However, their drain to source voltages may be different due to the different voltages applied to the bit lines. The Vt of the cell is measured depending on Vds of the voltage bias.

Note that a memory cell's threshold voltage may be a function of the drain voltage. For example, the phenomena referred to as drain induced barrier lowering (DIBL) may alter a field effect transistor's (FET) threshold voltage. For some devices, an increase in drain voltage decreases threshold voltage. For some devices, an increase in the drain voltage increases the depletion region which has the effect of lowering the threshold voltage.

In one embodiment, some bit lines have a voltage applied that causes little or no DIBL to the selected memory cell. Such memory cells will turn on if their threshold voltage is less than Vgs. However, other bit lines have a greater voltage applied thereto, which causes sufficient DIBL to effectively lower the threshold voltage of the selected memory cell. Therefore, those memory cells may turn on even if their actual threshold voltage is slightly less than Vgs.

The following example will be used to illustrate. Some memory cells may be tested to determine whether their threshold voltage is less than 3.0V and others may be tested to determine whether their threshold voltage is less than 3.5V. A voltage of 3.0V may be applied to the selected word line and a read pass voltage to unselected word lines. The common source line may be grounded. The bit lines of memory cells that are being tested for a threshold voltage of 3.0V are biased to a voltage that is intended to cause little or no DIBL. The bit lines of memory cells that may be being tested for a threshold voltage of 3.5V may be biased to a voltage that is intended to cause an amount of DIBL to lower the threshold voltage by about 0.5V, at least under the assumption that their threshold voltage without DIBL is near 3.5V. Therefore, the memory cells being tested for a threshold voltage of 3.5V will turn on if their threshold voltage is below 3.5V, but will not turn on if their threshold voltage is above 3.5V, given that 3.0V is applied to the selected word line. Note that other memory cells could be tested for still another threshold voltage by applying a different voltage to the bit line to cause a different shift in threshold voltage due to DIBL.

Figure 18:
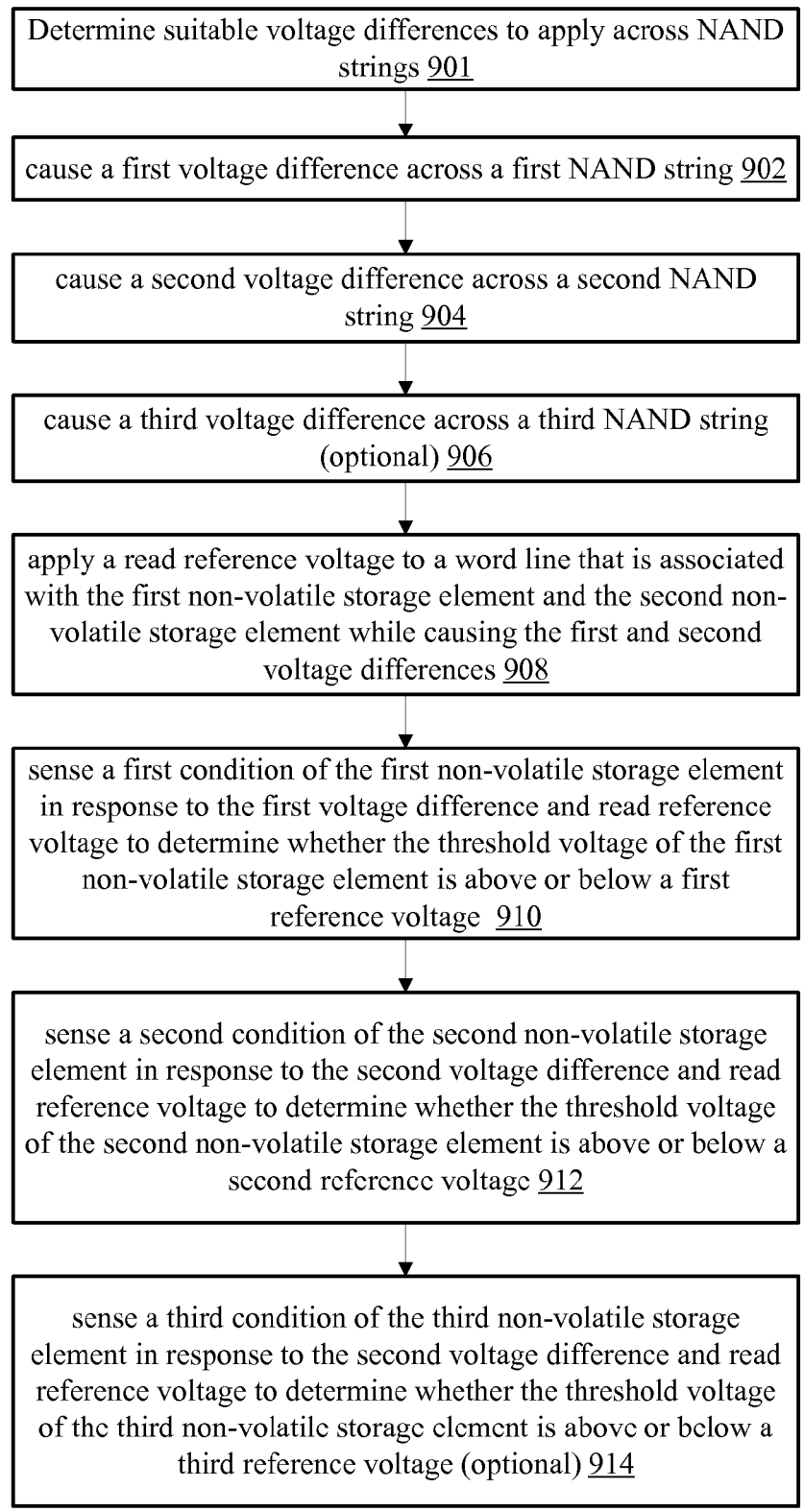
FIG. 18 is a flowchart of one embodiment of a process of sensing conditions of memory cells in different NAND strings by applying different voltages across different NAND strings.

FIG. 18 is a flowchart of one embodiment of a process of sensing conditions of memory cells in different NAND strings by applying different voltages across different NAND strings. The process of FIG. 18 is one embodiment of SMT sensing. Embodiments herein mitigate SMT noise while reading. For example, LLRs may be determined. Note that in one embodiment, the different voltages across the NAND strings cause a different Vgs for different memory cells being verified or read. Note that in another embodiment, the different voltages across the NAND strings cause a different Vds for different memory cells being verified or read. FIG. 18 will be discussed while referring to the example circuits of FIGS. 17B and 17C, as either of those circuits may be used. However, the process of FIG. 18 is not limited to those circuits.

In step 901, a suitable voltage to apply across is NAND string is determined. In one embodiment, this amounts to determining whether to apply Vs or Vs−Δ to a given bit line. In one embodiment, this amounts to determining whether to apply Vd or Vd+Δ to a given bit line. Note that three or more different voltages could be applied across the NAND strings. Further details of determining a suitable voltage difference are discussed below.

In step 902, a first voltage difference is caused across a first NAND string. For example, Vs is applied to the bit line while a voltage greater than Vs is applied to the source line. Therefore, the conduction current (if any) may flow from source line to bit line. As another example, Vd is applied to the bit line while a voltage less than Vd (e.g., ground) is applied to the source line. Therefore, the conduction current (if any) may flow from bit line to the source line.

In one embodiment, the first NAND string has a memory cell that is being verified at a first threshold level. For example, a determination is being made whether its threshold voltage is greater than Vva.

In 904, a second voltage difference is caused across a second NAND string. For example, Vs−Δ is applied to the bit line while a voltage greater than Vs−Δ is applied to the source line. Since the source line is common for all bit lines, the source line voltage will be same as in step 902. As another example, Vd+Δ is applied to the bit line while a voltage less than Vd+Δ (e.g., ground) is applied to the source line. In one embodiment, the second NAND string has a memory cell that is being verified at a second threshold level. For example, a determination is being made whether its threshold voltage is greater than Vvb.

In optional step 906, a third voltage difference is caused across a third NAND string. For example, Vs−2Δ is applied to the bit line while a voltage greater than Vs−2Δ is applied to the source line. As another example, Vd+2Δ is applied to the bit line while a voltage less than Vd+2Δ (e.g., ground) is applied to the source line. In one embodiment, the third NAND string has a memory cell that is being verified at a third threshold level. For example, a determination is being made whether its threshold voltage is greater than Vvc.

Steps 902, 904, and 906 may be performed together. Note that there may be thousands of selected memory cells along the selected word line. Therefore, step 902 may be applied to many different NAND strings at the same time. Likewise, steps 904 and 906 (if performed) may be performed on many different NAND strings.

In step 908, a read reference voltage is applied to a selected word line while causing the first and second voltage differences. For example, Vcgrv may be applied to the selected word line while Vsource is applied to the common source line and either Vs or Vs−Δ is applied to the bit line. Alternatively, Vcgrv may be applied to the selected word line while Vsource is applied to the common source line and either Vd or Vd−Δ is applied to the bit line. Therefore, a single reference voltage may be applied to the gates of the selected memory cells.

In step 910, a first condition of the first non-volatile storage element is sensed in response to the first voltage difference and read voltage to determine whether the threshold voltage of the first non-volatile storage element is above or below a first reference voltage. For example, the conduction current of a memory cell is sensed to determine whether the threshold voltage is greater than Vva.

In step 912, a second condition of the second non-volatile storage element is sensed in response to the second voltage difference and read voltage to determine whether the threshold voltage of the second non-volatile storage element is above or below a second reference voltage. The second reference voltage may be different from the first reference voltage. For example, the conduction current of a memory cell is sensed to determine whether the threshold voltage is greater than Vvb. Note that it is not required that the first and second reference voltages are verify levels. For example, the first reference voltage might be Vva+Δ and the second reference voltage might be Vva−Δ. Also note that it is not required that the first and second reference voltages be different. For example, the process of FIG. 10 may be used to apply different amounts of cross-coupling compensation. In this case, the first and second reference voltages may be the same. For example, the process could test for whether the threshold voltage of two different memory cells is greater than Vva while applying a different amount of cross-coupling compensation to each the memory cells.

In optional step 914, a third condition of the third non-volatile storage element is sensed in response to the third voltage difference and read voltage to determine whether the threshold voltage of the third non-volatile storage element is above or below a third reference voltage. In one embodiment, the third reference voltage is different from both the first and second reference voltages. For example, the conduction current of a memory cell is sensed to determine whether the threshold voltage is greater than Vvc.

Figure 19A:
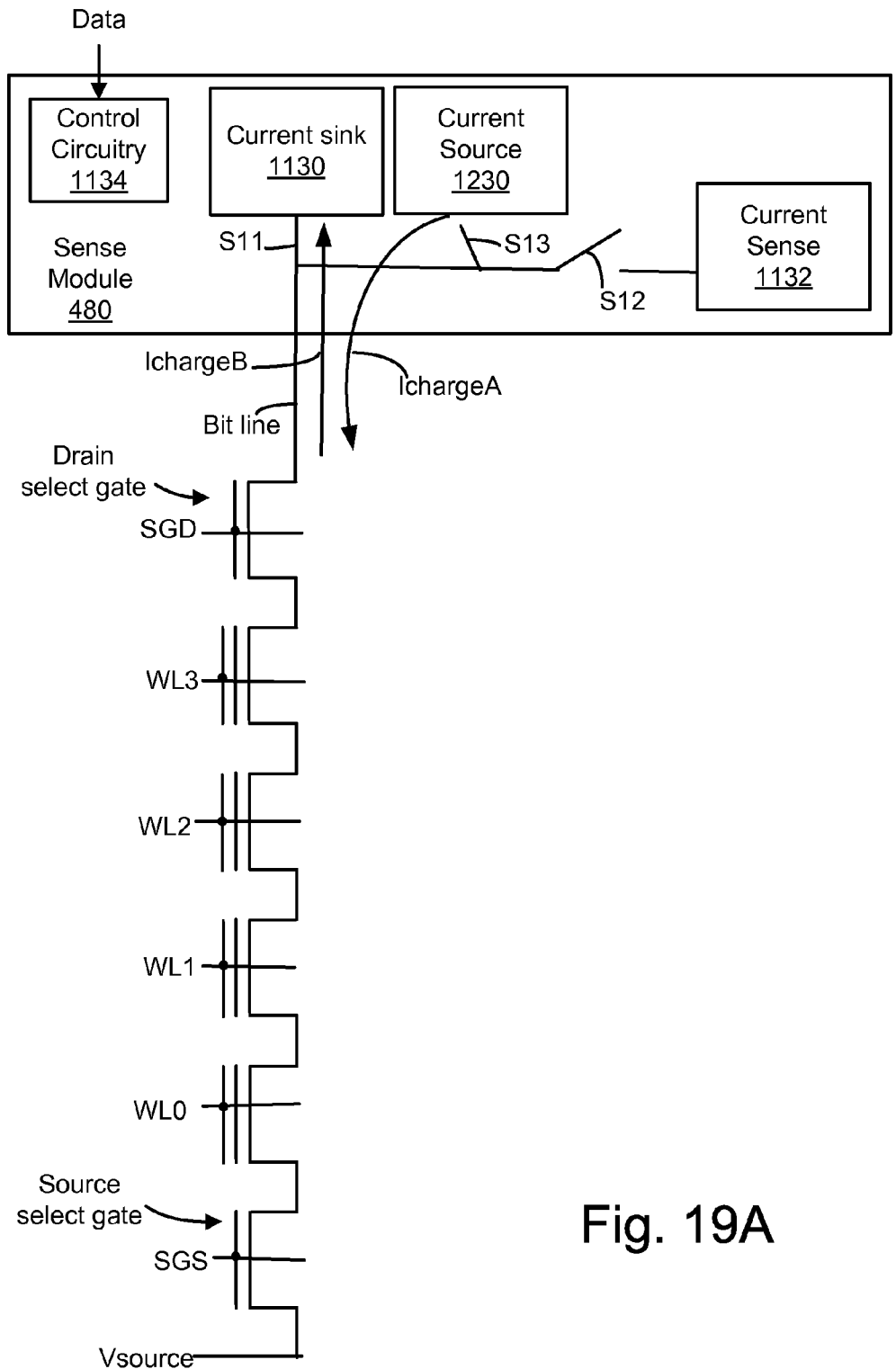
FIG. 19A is a block diagram of one embodiment of a sense module for charging a bit line to a voltage that is lower than the source line voltage.

FIG. 19A is a block diagram of one embodiment of a sense module 480 for charging a bit line to a voltage that is lower than the source line voltage. The sense module 480 may be used when implementing any of steps 902, 904, or 906 from FIG. 18. For example, the sense module 480 may be used to establish a certain voltage on the bit line. Another circuit (not depicted in FIG. 19A) may establish a certain voltage on the source line. Therefore, the sense module 480 may be used to create a certain voltage difference across a NAND string. The voltage on the bit line may be less than the source line voltage. The sense module 480 could be used to establish Vs and Vs−Δ for the example circuit of FIG. 17B.

Figure 19B:
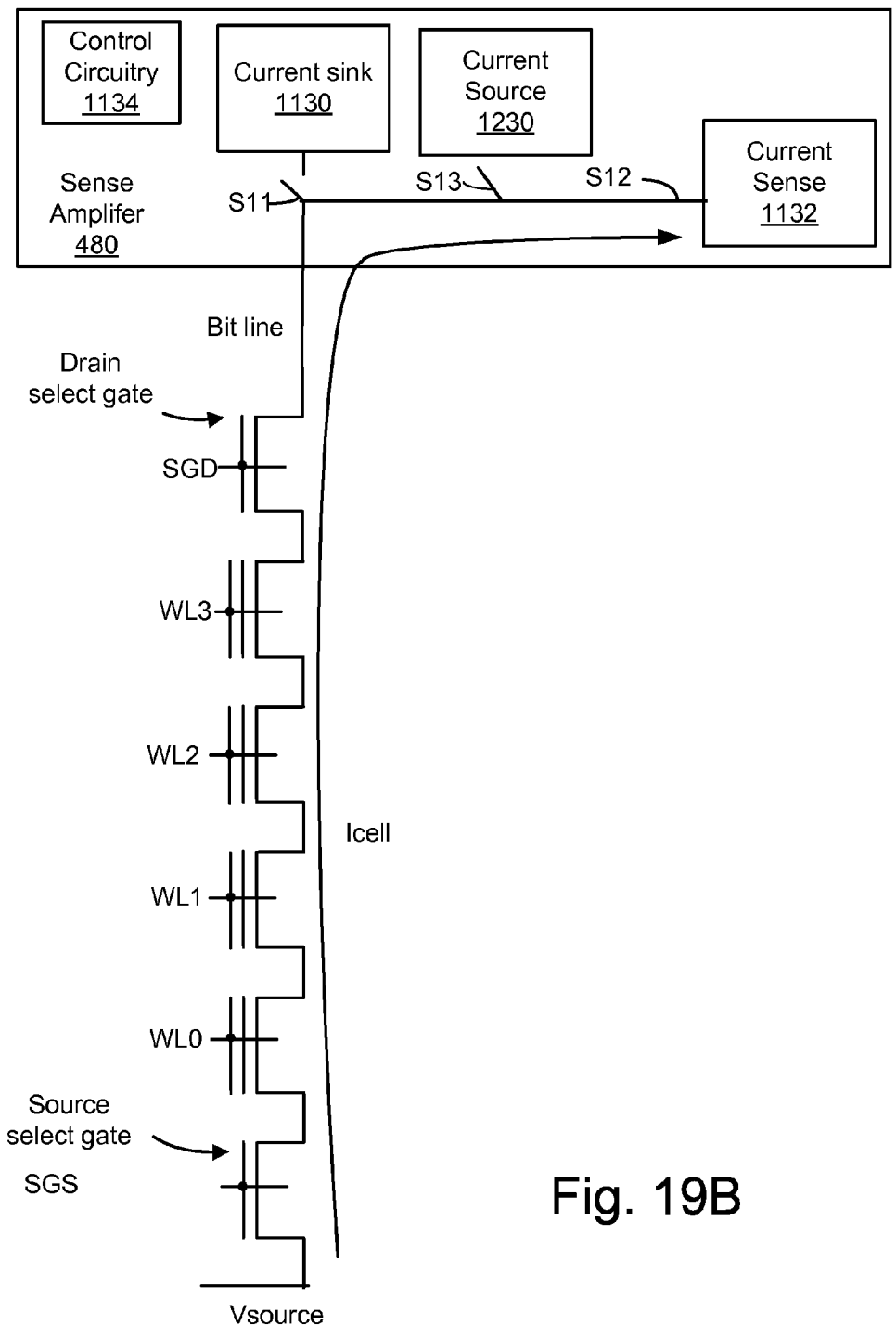
FIG. 19B is a block diagram the sense module of FIG. 19A showing the direction of current when sensing a memory cell's threshold voltage.

The sense module 480 has a current sink 1130, current source 1230, current sense 1132, and control circuitry 1134. Current sink 1130 may be used for reverse sensing and may include 1 to n different bit line voltage setups to apply different voltages to the bit line. Current source 1230 may be used for forward sensing and may also include 1 to n different voltage setups to apply different voltages to the bit line. The control circuit 1134 controls switch S11 connects the current sink 1130 to the bit line. The control circuit 1134 controls switch S13 connects the current source 1230 to the bit line. The control circuit 1134 controls switch S12 to connect the current sense 1132 to the bit line. In one embodiment, the control circuitry 1134 connects the current sink 1130 to the bit line to sink IchargeB to reduce the voltage to a target voltage. The current sense is one implementation of sense circuitry 470 of the sense module of FIG. 6. The circuit of FIG. 24 provides further details. Other implementations are possible. FIG. 19B is a block diagram the sense module 480 of FIG. 19A showing the direction of current when sensing a memory cell's threshold voltage.

The control circuit 1134 receives data, which is used to determine what voltage level the bit line should be charged to. In one embodiment, the data is based on the reference level is being verified. For example, the data might indicate whether Vva, Vvb, Vvc or another reference level is being verified. In one embodiment, the data is based on the amount of cross-coupling compensation that is desired. For example, the data might indicate whether a low or high amount of compensation is desired. In one embodiment, the cross-coupling compensation is based on a neighbor memory cell's Vt. In one embodiment, the cross-coupling compensation is based on the state to which neighbor memory cell is being programmed. Therefore, the data may indicated the neighbor's actual or intended data state, which based on the Vt. Further details are discussed below. In one embodiment, the data is based on a previous reading of the memory cell being read. For example, the data could indicate whether the memory cell was previously determined to have a threshold voltage above/below a target Vt.

Figure 20A:
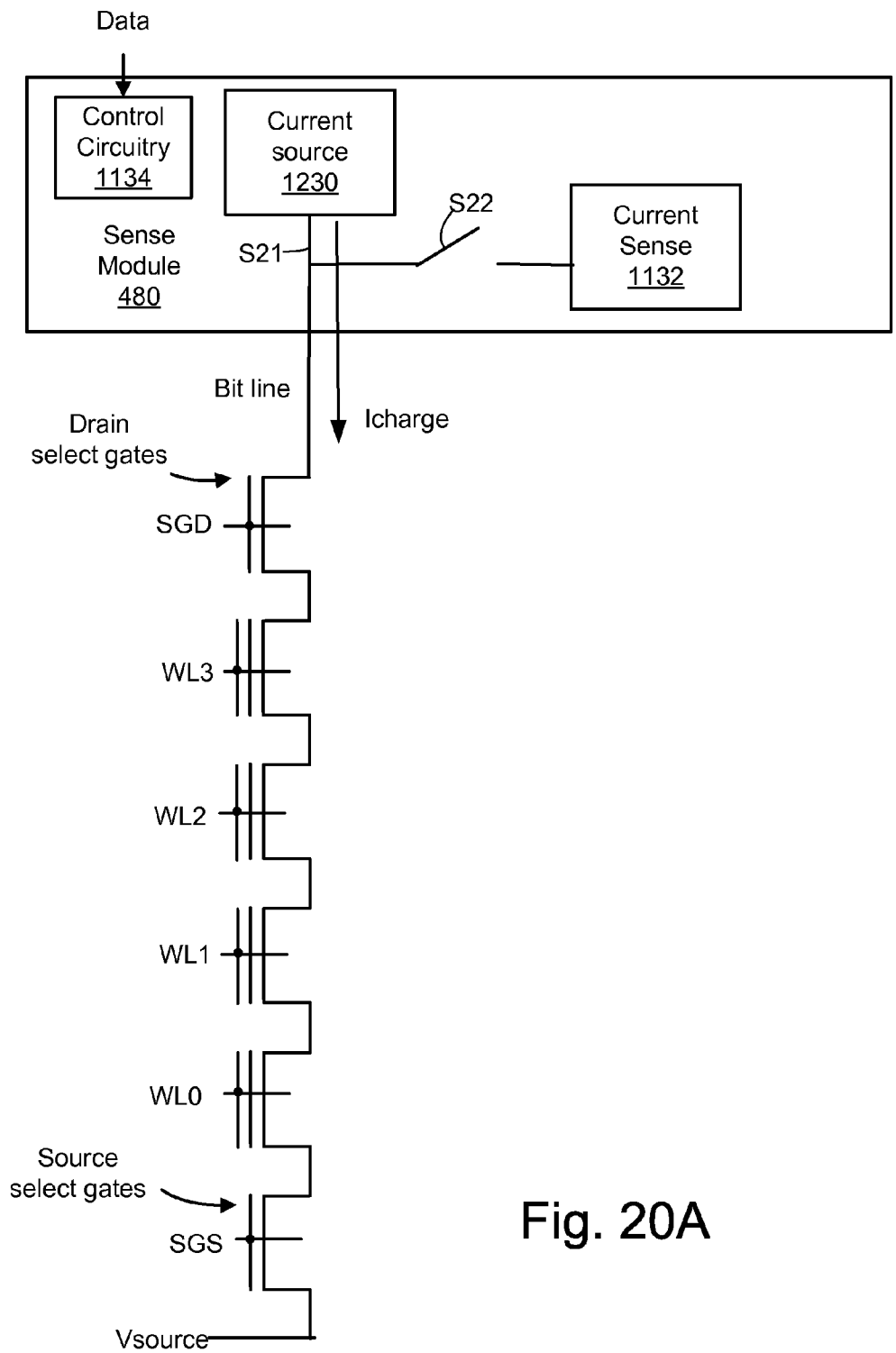
FIG. 20A is a block diagram of one embodiment of a sense module for charging a bit line to a voltage that is higher than the source line voltage.
Figure 20B:
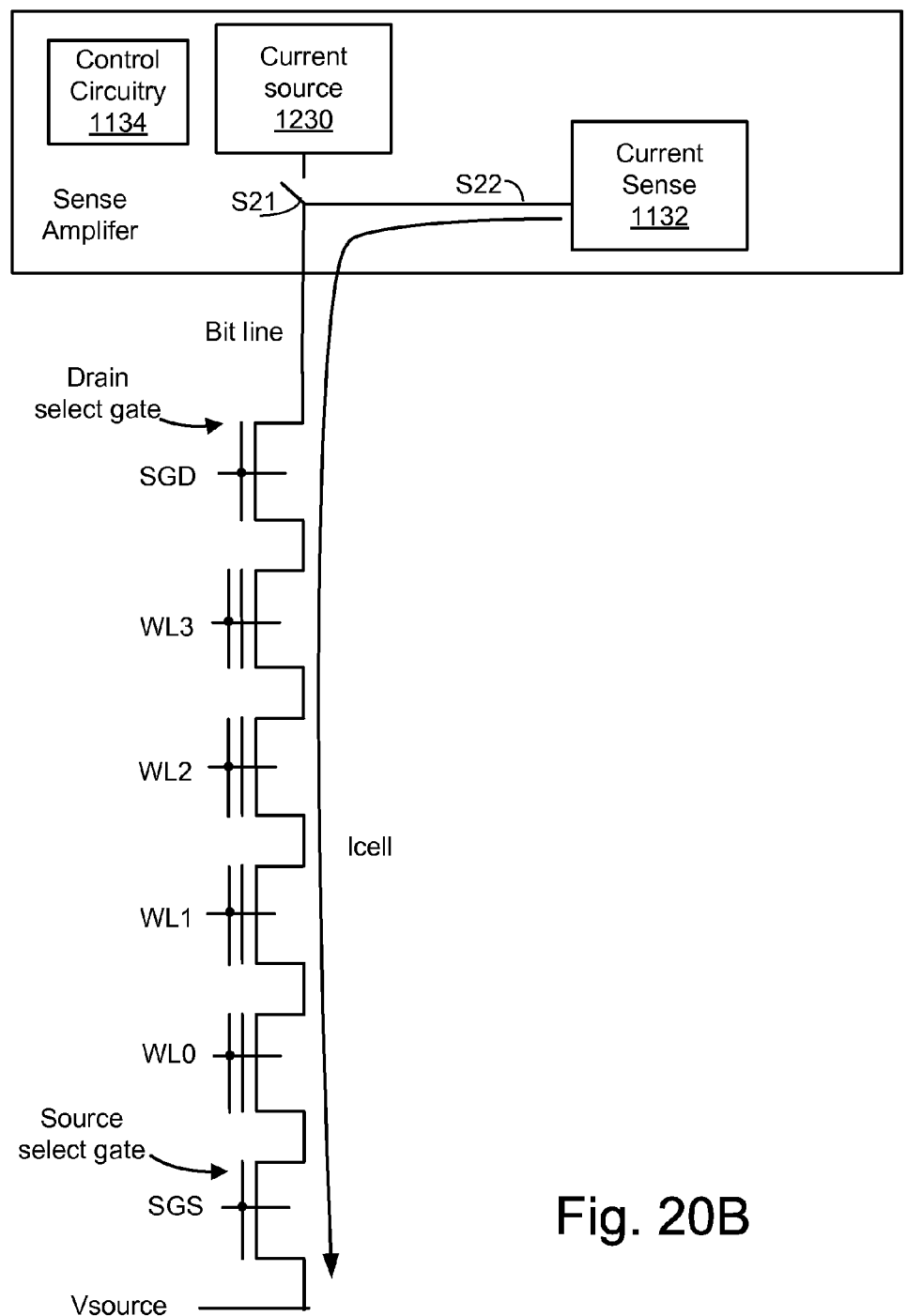
FIG. 20B is a block diagram the sense module of FIG. 20A showing the direction of current when sensing a memory cell's threshold voltage.

FIG. 20A is a block diagram of one embodiment of a sense module 480 for charging a bit line to a voltage that is higher than the source line voltage. The sense module 480 may be used when implementing any of steps 902, 904, or 906 from FIG. 18. For example, the sense module 480 may be used to create a certain voltage difference across a NAND string. The sense module 480 has a current source 1230, and current sense 1132. Switch S21 connects the current source 1230 to the bit line. Switch S22 connects the current sense 1132 to the bit line. FIG. 12B is a block diagram the sense module 480 of FIG. 12A showing the direction of current when sensing a memory cell's threshold voltage. As with the circuit of FIG. 11A, the control circuit 1134 receives data, which is used to determine to which voltage level the bit line should be charged. The sense module 480 could be used to establish Vd and Vd+Δ for the example circuit of FIG. 17C.

Figure 21A:
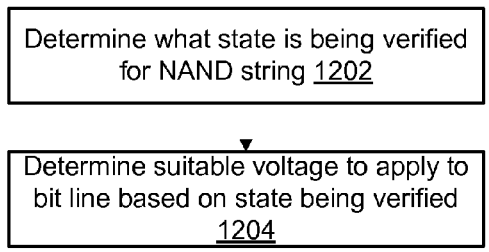
FIG. 21A is a flowchart of one embodiment of a process of determining a suitable voltage to apply across a NAND string based on the state being verified.
Figure 21B:
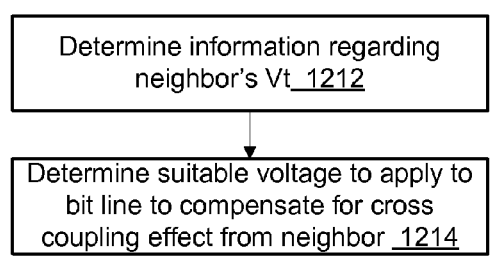
FIG. 21B is a flowchart of one embodiment of a process of determining a suitable voltage to apply across a NAND string to compensate for cross-coupling during read.

FIG. 21A is a flowchart of one embodiment of a process of determining a suitable voltage to apply across a NAND string based on the state being verified. The process is one embodiment of step 901 of FIG. 18. This process can be performed for every memory cell that is being verified. In step 1202, a determination is made as to which state is being verified. In one embodiment, a latch that is connected to the sense module 480 holds data that indicates what state the selected memory cell is being programmed to. This latch may maintain this value at least as long as the memory cell is being programmed such that its value can be used to determine the verify level. In one embodiment, the data from this latch is the data that is input to control circuitry 1134 of either FIG. 19A or 20A.

In step 1204, a suitable voltage is determined to apply to the bit line based on the state being verified. In one embodiment, the control circuitry 1134 determines the appropriate voltage to apply to the bit line. Note that in this embodiment it is assumed that all memory cells are connected by a common source line. Therefore, determining a voltage to apply to the bit line, in effect, determines a voltage to apply across the NAND strings. Further details of one embodiment of determining and controlling the bit line voltage are described below.

FIG. 13B is a flowchart of one embodiment of a process of determining a suitable voltage to apply across a NAND string to compensate for cross-coupling during read. The process is one embodiment of step 901 of FIG. 18. In this embodiment, the determination is based on the threshold voltage of a neighbor memory cell. This process can be performed for every memory cell that is being read. In step 1212, a determination is made as to the threshold voltage or state of the neighbor memory cell. In one embodiment, the neighbor memory cell is read to gain some information about its Vt. It is not required to know the exact state of the neighbor memory cell. Further details are discussed below. In one embodiment, some indication of the neighbor's threshold voltage is the data that is input to control circuitry 1134 of either FIG. 19A or 20A.

In step 1214, a suitable voltage is determined to apply to the bit line to compensate for cross-coupling due to the neighbor's Vt. In one embodiment, the control circuitry 1134 determines the appropriate voltage to apply to the bit line. For example, the input data might be whether the neighbor's threshold voltage is "high" or "low." If it is high, then a first voltage is to be applied to the bit line to achieve a first amount of compensation for cross-coupling. If it is low, then a second voltage is to be applied to the bit line to achieve a second amount of compensation for cross-coupling.

Figure 21C:
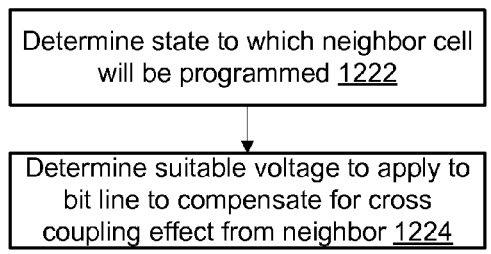
FIG. 21C is a flowchart of one embodiment of a process of determining a suitable voltage to apply across a NAND string to compensate for cross-coupling during programming.

FIG. 21C is a flowchart of one embodiment of a process of determining a suitable voltage to apply across a NAND string to compensate for cross-coupling during programming. The process is one embodiment of step 901 of FIG. 10. In this embodiment, the determination is based on the threshold voltage to which a neighbor memory cell will be programmed. This process can be performed for every memory cell that is being programmed. In step 1224, a determination is made as to the state to which the neighbor memory cell will be programmed. In one embodiment, there is a latch that holds data that indicates the intended state to which the neighbor will be programmed. In one embodiment, the data from this latch is the data that is input to control circuitry 1134 of either FIG. 19A or 20A.

In step 1224, a suitable voltage is determined to apply to the bit line to compensate for cross-coupling due to the later programming of the neighbor. In one embodiment, the control circuitry 1134 determines the appropriate voltage to apply to the bit line. For example, the input data might be whether the neighbor's threshold voltage will be "high" or "low." If it will be high, then a first voltage is to be applied to the bit line to achieve a first amount of compensation for cross-coupling. If the neighbor's threshold voltage will be will be low, then a second voltage is to be applied to the bit line to achieve a second amount of compensation for cross-coupling.

Figure 21D:
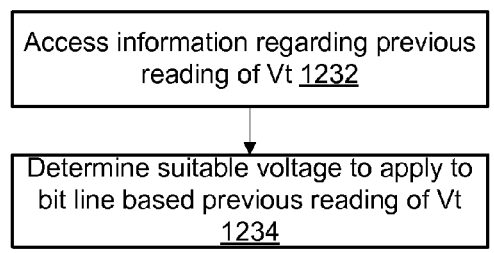
FIG. 21D is a flowchart of one embodiment of a process of determining a suitable voltage to apply across a NAND string based on a previous threshold voltage of the memory cell.

FIG. 21D is a flowchart of one embodiment of a process of determining a suitable voltage to apply across a NAND string based on a previous determination relating to the threshold voltage of the memory cell. This may be used to perform a binary search to locate the threshold voltage with any desired accuracy. Performing a binary search will be discussed more fully below. The process of FIG. 21D is one embodiment of step 901 of FIG. 18. This process can be performed for every memory cell that is being read. In step 1232, information regarding a previous reading of the threshold voltage of the selected memory cell is accessed. For example, a latch may hold a value that indicates the result of a previous comparison of the conduction current of the selected memory cell with a reference current. If the reference current is selected to test for a target Vt, then the value in the latch indicates whether the selected memory cell's threshold voltage is above or below a target Vt. In one embodiment, the data from this latch is the data that is input to control circuitry 1134 of either FIG. 19A or 20A.

In step 1234, a suitable voltage to apply to the bit line is determined based on the previous reading for the Vt. For example, assume that the previous reading determined whether the threshold voltage was above or below a target Vt. One voltage to apply to the bit line might be able to test for the target threshold voltage+Δ. Another voltage to apply to the bit line might be able to test for the target threshold voltage−Δ. If the previous reading indicated that the threshold voltage was below the target, then a voltage is applied to test for the target threshold voltage−Δ. If the previous reading indicated that the threshold voltage was above the target, then a voltage is applied to test for the target threshold voltage+Δ.

Figure 22A:
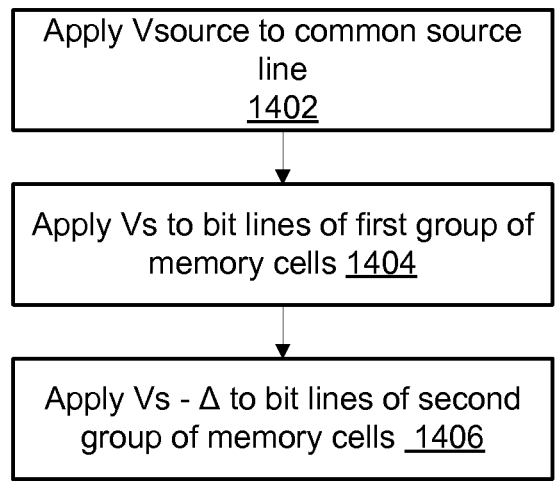
FIG. 22A is a flowchart of one embodiment of a process for establishing different voltages across NAND that causes different Vgs for selected memory cells on different NAND strings.

FIG. 22A is a flowchart of one embodiment of a process for establishing different voltages across NAND strings. FIG. 22A is one implementation of steps 902-904 of FIG. 18. FIG. 22A is an embodiment in which different Vgs are used for different NAND strings. For example, different threshold voltages could be sensed by applying different Vgs to different memory cells. In one embodiment, different Vgs and Vds are applied to sense different threshold voltages. Alternatively, different amounts of cross-coupling could be provided by applying different Vgs to different memory cells. In one embodiment, different Vgs and Vds are applied to provide different amounts of cross-coupling. The circuitry of FIG. 19A may be used when implementing the process of FIG. 22A.

In step 1402, a voltage is applied to a common source line. For example, referring to FIG. 11A, the voltage Vsource is applied to the source line. An example, level for Vsource is 2.5V. Note that Vdd may be a lower voltage such as 1.6V.

In step 1404, Vs is applied to bit lines of a first group of memory cells. The first group may include memory cells whose threshold voltage is being compared to a first voltage level. The first group may include memory cells for which a first amount of cross-coupling compensation is desired. As an example, Vs might be 2.1V if Vsource is 2.5V. To establish Vs, the control circuitry 1134 may close first close switch S13 to connect the current source 1230 to the bit line. Then, the control circuitry 1134 closes switch S11 to connect the current sink 1130 to the bit line to achieve the target voltage. The control circuitry 1134 may determine when the bit line is at Vs and may disconnect the current sink 1130 from the bit line to hold the bit line at Vs.

In step 1406, Vs−Δ is applied to bit lines associated with a second group of memory cells. The second group may include memory cells whose threshold voltage is being compared to a second voltage level. The second group may include memory cells for which a second amount of cross-coupling compensation is desired. As an example, Vs−Δ might be 2.1V if Vsource is 2.5V. To establish Vs−Δ, the control circuitry 1134 may close first close switch S13 to connect the current source 1230 to the bit line. Then, the control circuitry 1134 closes switch S11 to connect the current sink 1130 to the bit line to achieve the target voltage. The control circuitry 1134 may determine when the bit line is at Vs−Δ and may disconnect the current sink 1130 from the bit line to hold the bit line at Vs−Δ. Note that steps 1404 and 1406 may be performed together.

Figure 22B:
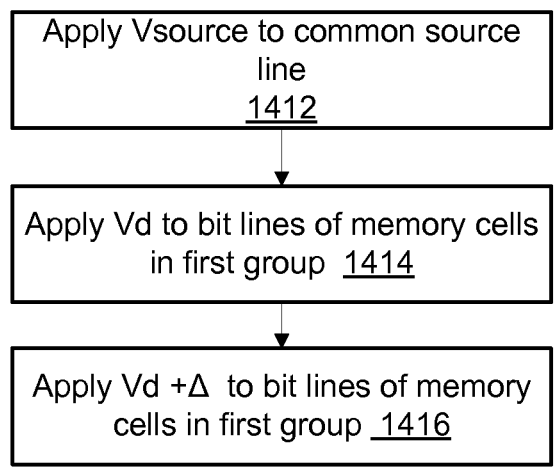
FIG. 22B is a flowchart of one embodiment of a process for establishing different voltages across NAND strings that causes different Vds for selected memory cells on different NAND strings.

FIG. 22B is a flowchart of one embodiment of a process for establishing different voltages across NAND strings. FIG. 22B is one implementation of steps 902-904 of FIG. 18. FIG. 22B is an embodiment in which a different Vds is used for different NAND strings. For example, different threshold voltages could be sensed. Alternatively, different amounts of cross-coupling could be provided. The process of FIG. 22B may use the circuit of FIG. 20A, although that is not required. The process of FIG. 22B may be performed simultaneously on all NAND strings having a memory cell being verified or read. In one embodiment, the different Vds causes a different amount of DIBL.

In step 1412, a voltage is applied to a common source line. For example, referring to FIG. 19A, the voltage Vsource is applied to the source line. An example, level for Vsource is 1.2V. Note that Vdd may be a higher voltage such as 2.5V.

In step 1414, Vd is applied to bit lines of a first group of memory cells. The first group may include memory cells whose threshold voltage is being compared to a first voltage level. The first group may include memory cells for which a first amount of cross-coupling compensation is desired. As an example, Vd might be 1.6V if Vsource is 1.2V. In this example, Vds will be about 0.4V. To establish Vd, the control circuitry 1134 may close switch S21 to connect the current source 1230 to the bit line. The control circuitry 1134 may determine when the bit line is at Vd and may disconnect the current source 1230 from the bit line to hold the bit line at Vd.

In step 1416, Vd+Δ is applied to bit lines associated with a second group of memory cells. The second group may include memory cells whose threshold voltage is being compared to a second voltage level. The second group may include memory cells for which a second amount of cross-coupling compensation is desired. The voltage Vd+Δ causes a sufficient amount of DIBL to alter (e.g., lower) the threshold voltage of the memory cells by the difference between the first and second voltage levels. As an example, Vd+Δ may be about 2.0V with Vsource being 1.2V. Therefore, Vds may be about 0.8V. To establish Vd+Δ, the control circuitry 1134 may close switch S21 to connect the current source 1230 to the bit line. The control circuitry 1134 may determine when the bit line is at Vd+Δ and may disconnect the current source 1230 from the bit line to hold the bit line at Vd+Δ. Note that steps 1414 and 1416 may be performed together.

Figure 23:
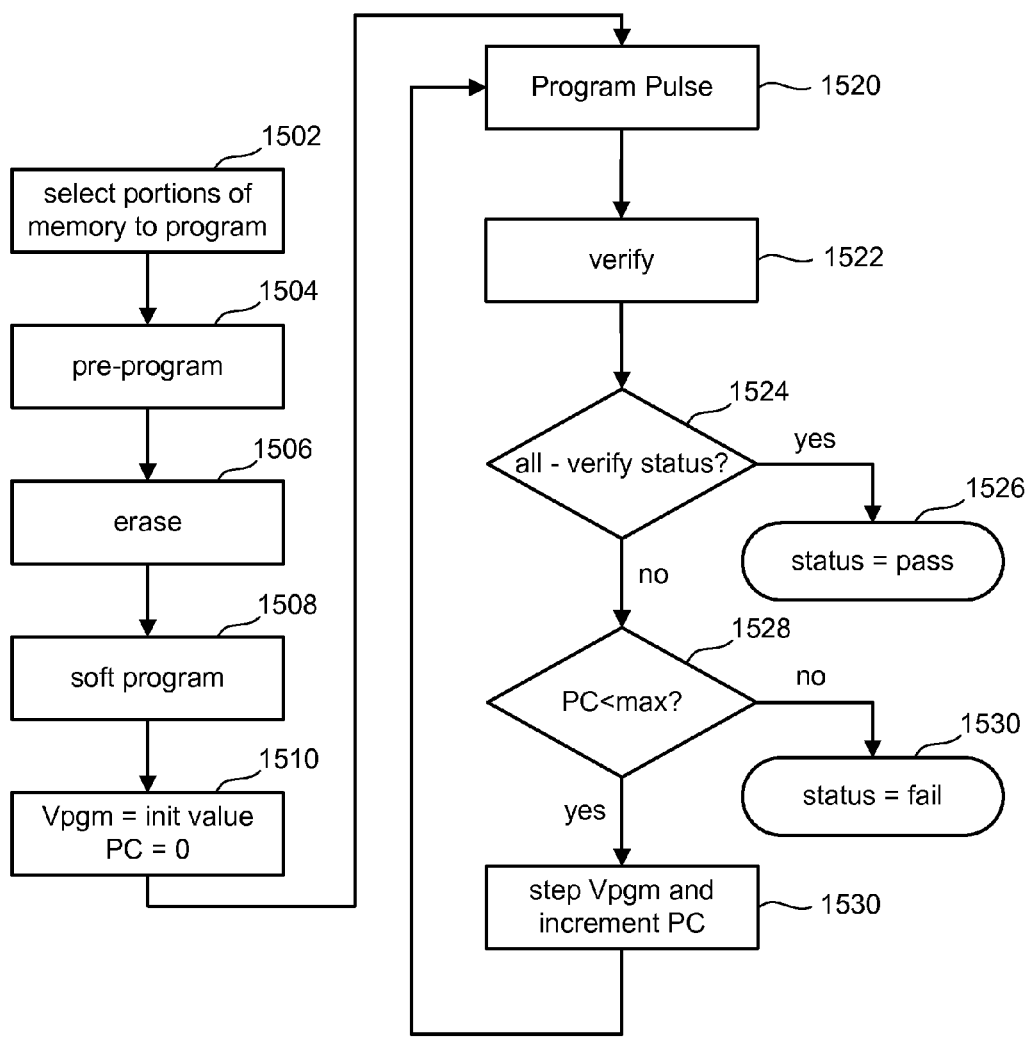
FIG. 23 is a flowchart describing one embodiment of a programming process, which includes one or more verification steps.

FIG. 23 is a flowchart describing one embodiment of a programming process, which includes one or more verification steps. Embodiments disclosed herein can speed up the programming by verifying multiple states during a single verification operation. In step 1502, the portion of the memory to be programmed is selected. In one implementation, this can be one or more write units appropriate to the memory structure. One example of a write unit is referred to as a page. In other embodiments, other units and/or structures can also be used. In step 1504, a pre-programming process is sometimes used wherein the addressed memory cells are given non-data dependent programming to level out storage element wear and provide a more uniform starting point for the subsequent erase. In step 1506, an erase process is performed, as appropriate for the type of storage element being used. One example of a suitable smart erase process is described in U.S. Pat. No. 5,095,344, incorporated herein by reference in its entirety. Step 1508 includes a soft programming process designed to put the threshold voltages of erased memory cells into a more uniform starting range for the actual write phase. In one embodiment, if any of the memory cells fail to verify during erase (or during soft programming), they can be mapped out of the logical address space. At this point the memory is ready for the data conditional programming phase.

In step 1510, the program voltage (Vpgm) is set to an initial value. For example, in some embodiments, the staircase wave form of FIG. 7b is used and step 1510 includes setting the initial pulse. Also, in step 1510, a program counter (PC) is initialized to zero. In step 1520, a program pulse is applied. For example, one iteration of step 1520 could include applying program pulse 800 of FIG. 8B.

In step 1522, a verification process is performed. The verification process may verify more than one state at a time. Referring to FIG. 8A, in one embodiment, some memory cells that are being programmed to the A-state are verified for the Vva level, while other memory cells that are being programmed to the B-state are verified for the VvB level. In one embodiment, the verification is a concurrent coarse/fine verify. Referring to FIG. 8A, some memory cells that are being programmed to the A-state are verified for the VvaL level, while others that are being programmed to the A-state are verified for the Vva level. During the initial programming steps in which the memory cell's threshold is well below the final level (Vva), course programming is applied. However, after the memory cell's threshold voltage reaches VvaL, fine programming is used. Thus, while some memory cells are being verified for coarse programming, other memory cells are being verified for fine programming. Note that with course/fine programming, some memory cells are being verified for one state (e.g., A-state), while others are being verified for another state (e.g., B-state). Note that when a particular memory cell has been verified as being programmed to its intended state, it may be locked out from further programming. More details of step 1522 are described below. In some embodiments, VvaL and Vva (see, for example, FIG. 8a) can be sensed at the same time. Likewise, VvbL and Vvb, etc. may be sensed together.

In step 1524, it is determined whether all of the memory cells have verified that their threshold voltages are at the final target voltage for that memory cell. If so, the programming process is completed successfully (status=pass) in step 1526. If all of the memory cells are not all verified, then it is determined whether the program counter (PC) is less than a maximum value such as 20. If the program counter (PC) is not less than max (step 1528), then the program process has failed (step 1530). If the program counter (PC) is less than a maximum value (e.g., 20), then the program counter (PC) is incremented by 1 and the program voltage is stepped up to the next pulse in step 1530. Subsequent to step 1530, the process loops back to step 1520 and the next program pulse is applied to the memory cells.

Figure 24A:
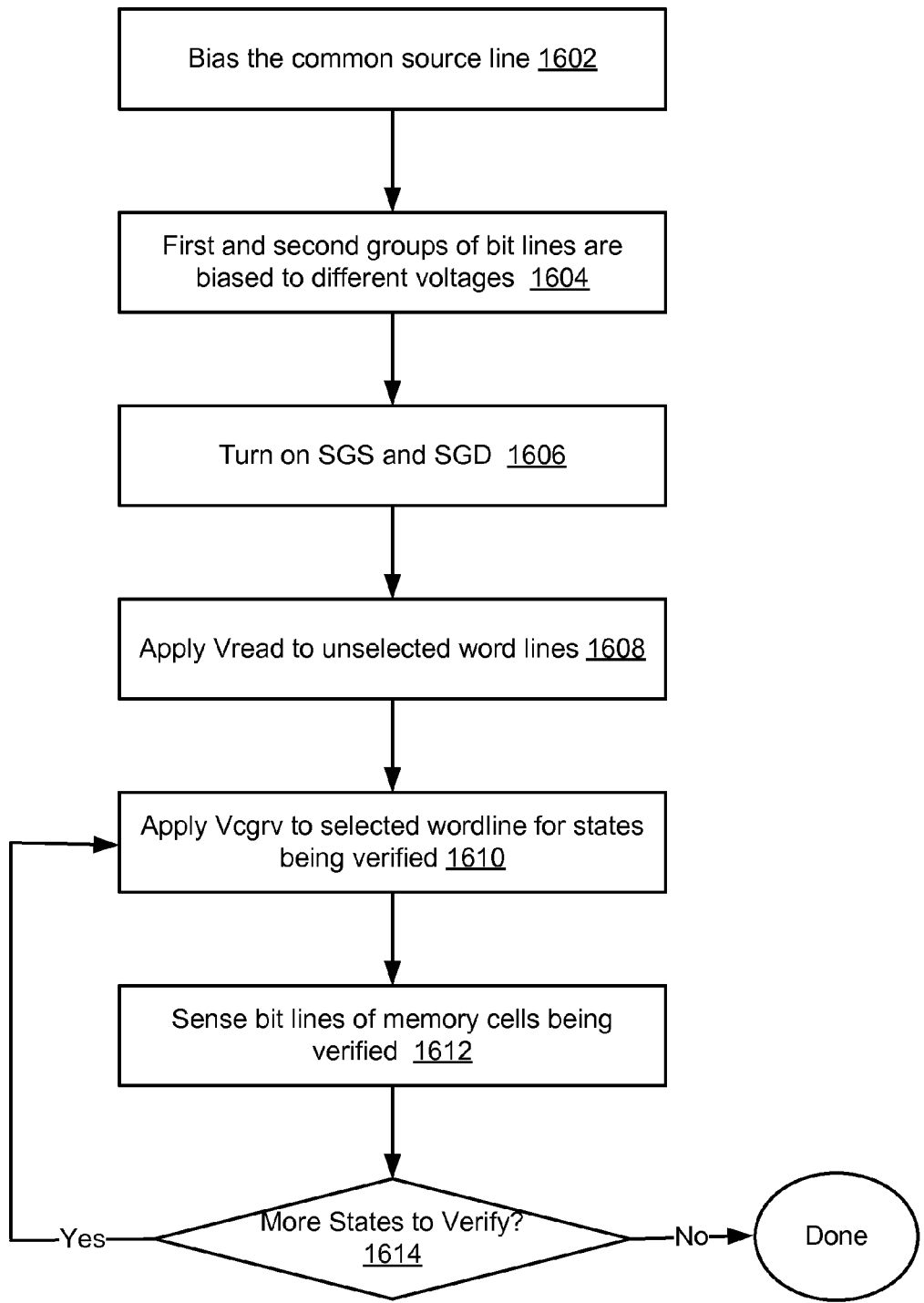
FIG. 24A is a flowchart of one embodiment of a process of verifying memory cells during a programming operation.
Figure 24B:
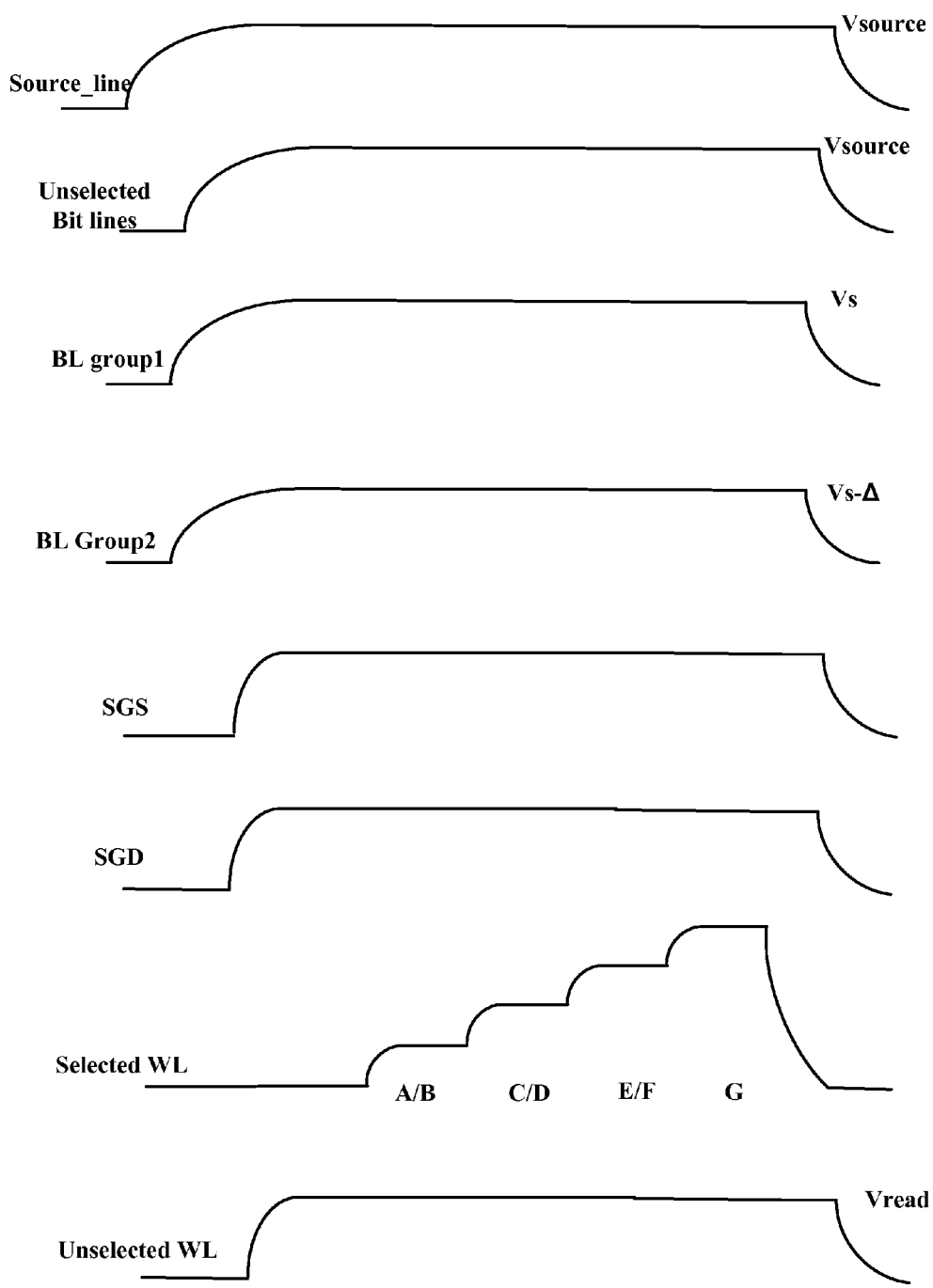
FIG. 24B is a timing diagram showing one embodiment of voltages applied to word line and bit lines during the verify process of FIG. 24A.

FIG. 24A is a flowchart of one embodiment of a process of verifying memory cells during a programming operation. In this process reverse sensing is used. The process is one embodiment of SMT sensing during program verify. Embodiments disclosed herein mitigate SMT noise while reading storage elements there were verified using the process of FIG. 24A. The process is one implementation of step 1522 of the programming process of FIG. 23. Therefore, the process may be applied once during each iteration of the programming process. FIG. 24B is a timing diagram showing one embodiment of voltages applied to word line and bit lines during the verify process of FIG. 24A. Note that the voltage applied to the selected word line is modified during the process. For example, the voltage is raised to level "A/B" in order to verify the A-state and the B-state, then the voltage is raised to level "C/D" in order to verify the C-state and the D-state, etc. Further details are discussed below.

In step 1602, the common source line is biased to Vsource. As an example, the source line is biased to 2.5V.

In step 1604, first and second bit lines are biased to different voltages. The first group contains bit lines that are to have Vs applied to the bit line. The second group contains bit lines that are to have Vs−Δ applied to the bit line. There may also be a third group that contains bit lines that are to have Vs applied. For example, bit lines for memory cells being programmed to the A-, C-, E-, and G-state may be put into the first group. Bit lines for memory cells being programmed to the B-, D-, and F-state may be put into the second group. Bit lines for memory cells that are to stay erased may be put into the third group. In one embodiment, one of the bit lines from the first group (e.g., the A-state) and one of the bit lines from the second group (e.g., the B-state) may be being verified at a time. During step 1604, all the bit lines in the first group may be biased to Vs, all of the bit lines in the second group may be biased to Vs−Δ, and all of the bit lines in the third group may be biased to Vsource.

In step 1606, voltages are applied to the source side select gate (SGS) and the drain side select gate (SGD). As an example, SGS and SGD are biased to Vsource+Vt, where threshold voltage is the threshold voltage of the SGS transistor.

In step 1608, Vread is applied to unselected word lines. In step 1610, a suitable read voltage is applied to the selected word line. Referring to FIG. 24B, the voltage on the selected word line may be raised to the level labeled "A/B" in order to verify the A-state and the B-state. This level will create a Vgs that is suitable to verify the memory cells being programmed to the A-state, as well as a Vgs that is suitable to verify the memory cells being programmed to the B-state.

In step 1612, the bit lines of memory cells to be verified are sensed. If the threshold voltage of a memory cell being verified is below its target state it should turn on and conduct a sizeable current, which may be detected. For example, the current sense 1132 of FIG. 19B may determine whether or not the memory cell conducts a sizeable current based on Icell. Note that other sensing techniques could be used.

If there are more states to verify (step 1614), then the process returns to step 1610. In step 1610, the voltage on the selected word line is again set to the level that is appropriate for the states being verified. For example, the voltage may be changed to the level labeled "C/D" in FIG. 24B to verify memory cells being programmed to the C-state and the D-state. This level on the selected word line will create a Vgs that is suitable to verify the memory cells being programmed to the C-state, as well as a Vgs that is suitable to verify the memory cells being programmed to the D-state. The cells targeted to C-state may have different bitline bias compared with the cells targeted to D states.

When all states are verified, the process completes. Note that it is not an absolute requirement that all states be verified. For example, early in the programming process it might not be necessary to verify the highest states. Therefore, the process could end without raising the selected word line voltage to the levels "E/F" and "G." Likewise, later in the programming process it might not be necessary to verify the lowest states. Therefore, the process could skip raising the selected word line voltage to the levels "A/B." Note that for any memory cell that is verified to have reached its intended state, programming may be locked out such that it is not affected by further programming pulses.

Note that while FIG. 24A was described in connection with the example waveforms of FIG. 24B, the process is not limited to those waveforms. For example, there could be more or fewer than eight states. Also, instead of verifying two states at a time, three or more states could be verified with each iteration of the process.

Also note that while step 1604 contemplates biasing bit lines that are verified by applying different voltages to the selected word line, this is not required. For example, when verifying the A-state and the B-state, it is not required that the bit lines for the other states are biased to Vs and Vs+Δ. Instead, those bit lines could be biased to Vsource. Then, after verifying the A-state and the B-state, a different set of bias conditions could be applied to the bit lines to verify the C-state and the D-state.

Figure 25A:
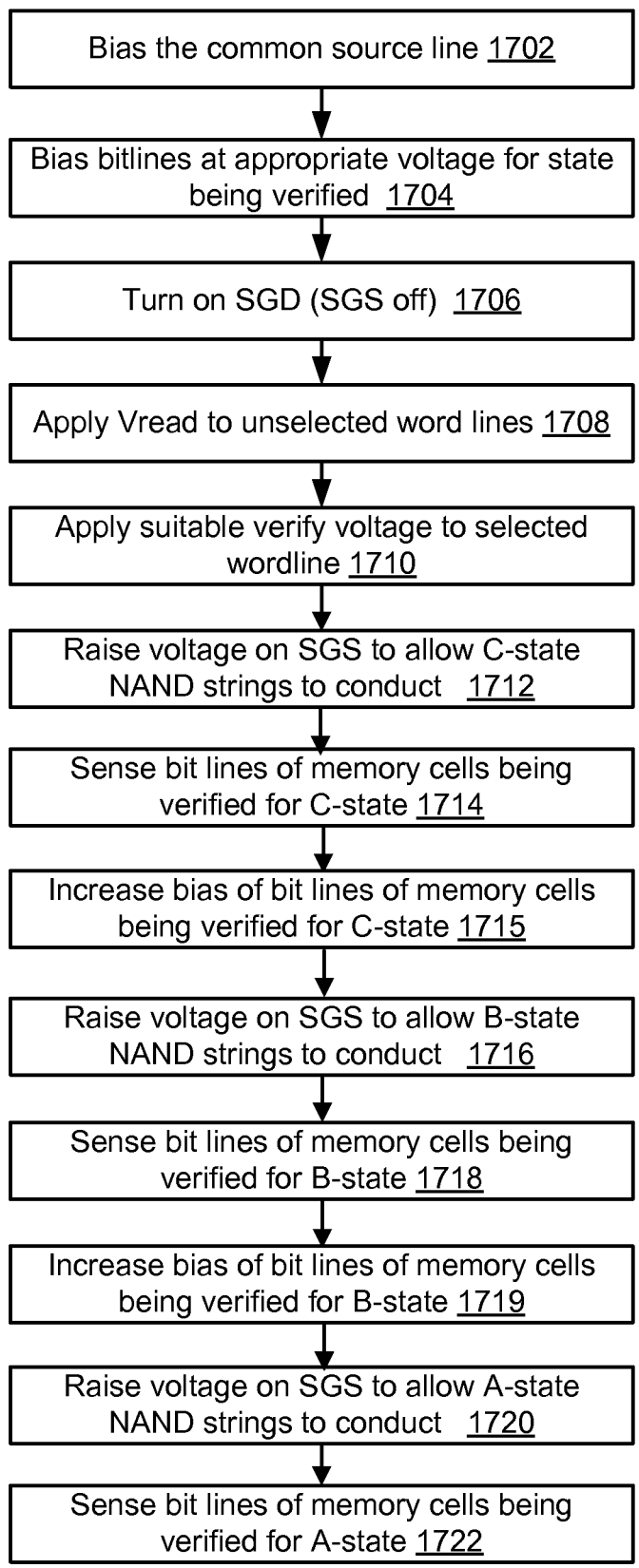
FIG. 25A is a flowchart of one embodiment of a process of verifying memory cells during a programming operation.
Figure 25B:
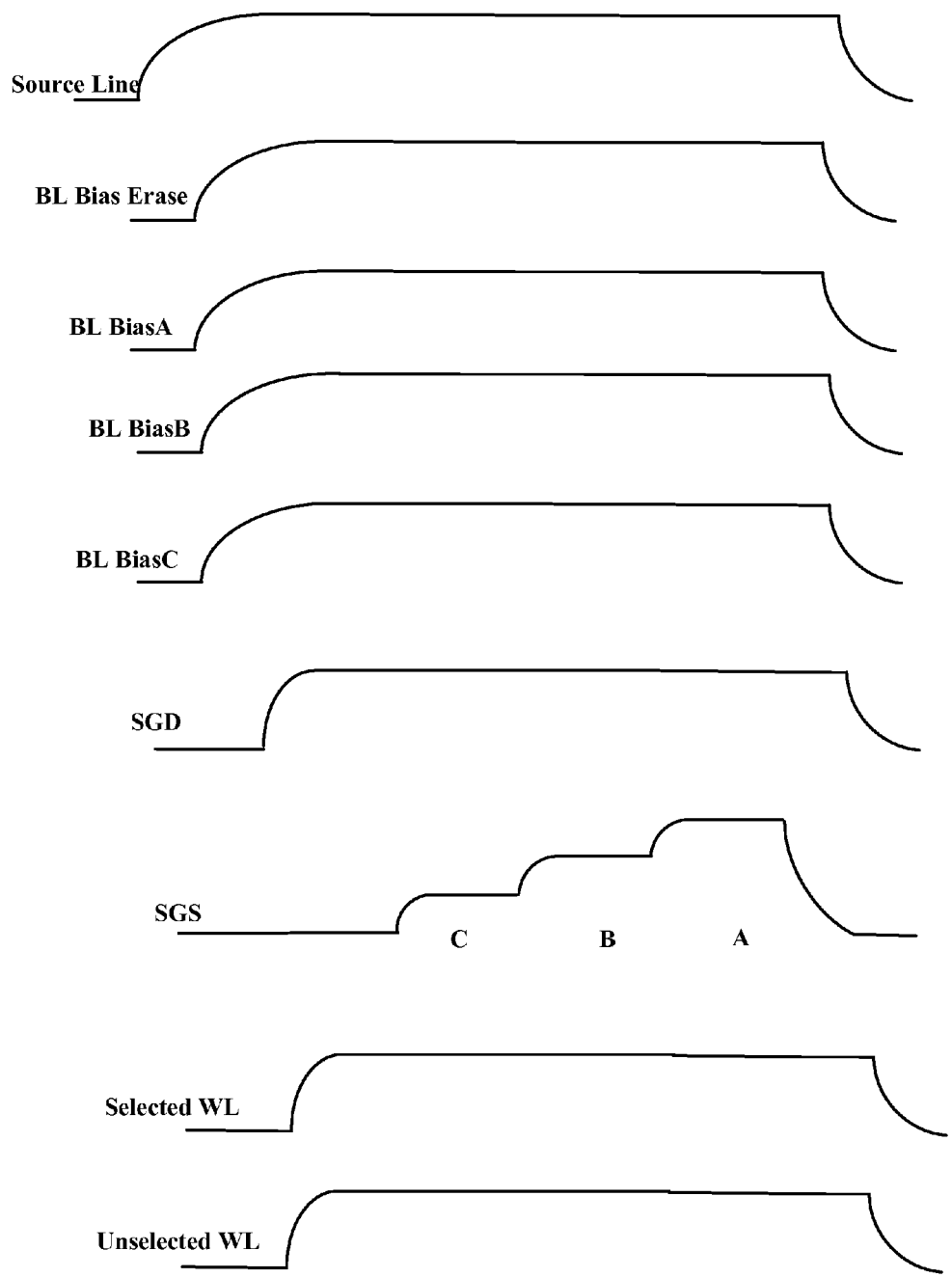
FIG. 25B is a timing diagram showing one embodiment of voltages applied to word line and bit lines during the verify process of FIG. 25A.

FIG. 25A is a flowchart of one embodiment of a process of verifying memory cells during a programming operation. This is one implementation of SMT sensing using reverse sensing. Embodiments disclosed herein mitigate SMT noise when reading storage elements there were verified using the process of FIG. 25A. The process is one implementation of step 1522 of the programming process of FIG. 23. Therefore, the process may be applied once during each iteration of the programming process. FIG. 25B is a timing diagram showing one embodiment of voltages applied to word line and bit lines during the verify process of FIG. 17A. Referring to FIG. 17B, note that to verify different states, the voltage applied to SGS is changed from the level labeled "C", then to "B", then to "A" in order to verify the C-state, then the B-state, then the A-state. Other levels could be used to verify other states. This process different from the one of FIG. 24A in that rather than altering the voltage on the selected word line, the voltage on SGS is altered.

FIG. 24A described simultaneous verify of only two states each time (out of e.g., eight states). A reason for simultaneously verifying only two states and not four states or all eight states is for reducing the risk of cell punch-through, which may occur due to large bias condition differences that may result in large Vds voltage difference over the cell. In one embodiment, the drain side voltage is controlled in order to overcome the cell punch-through problem, which may allow simultaneously verifying more states. FIG. 25A is a flowchart of one embodiment of a process that controls the drain side voltage to avoid cell punch-through.

Figure 26A:
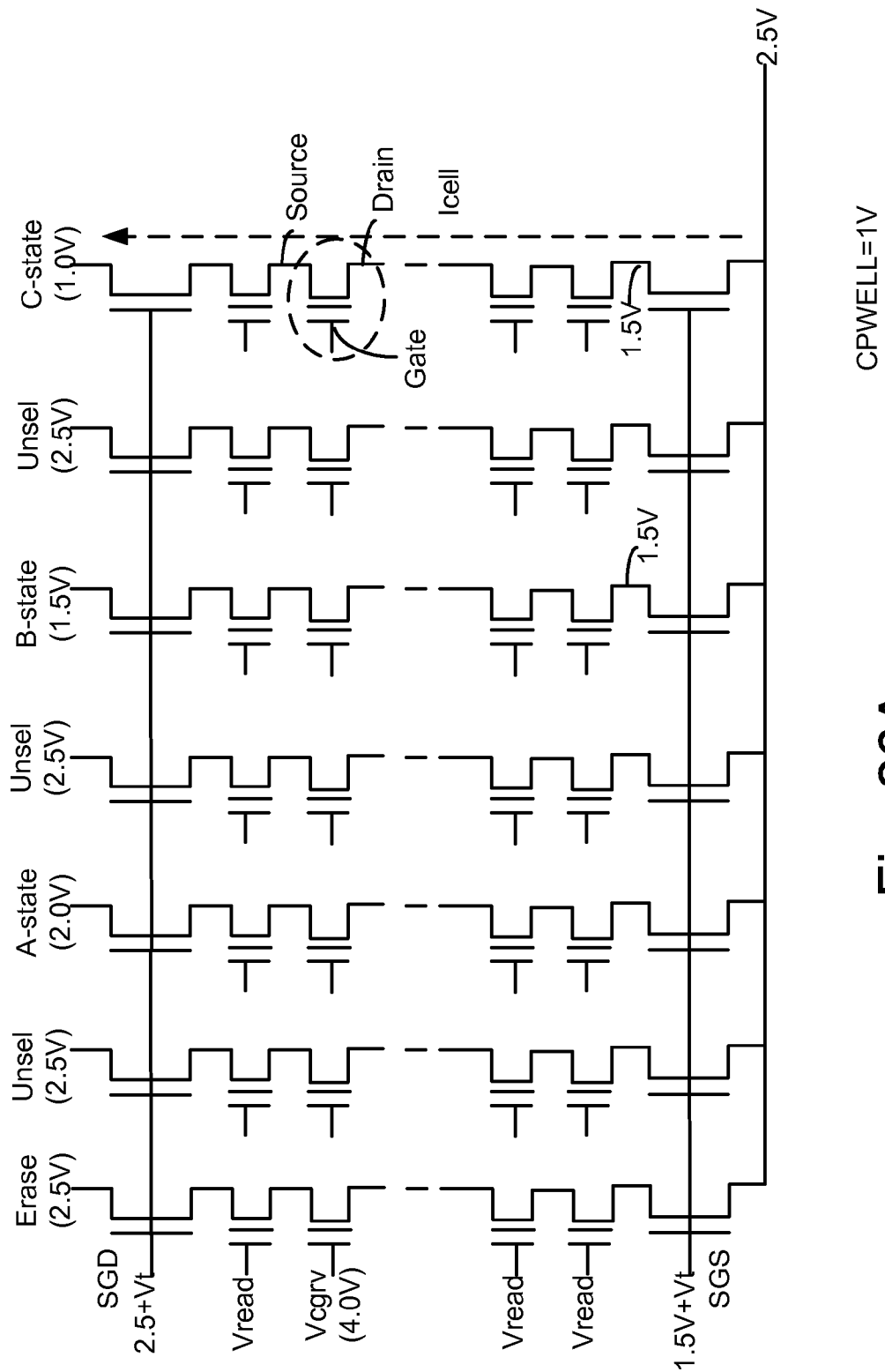
FIG. 26A is a diagram of several NAND strings showing example voltages applied when verifying the C-state in the process of FIG. 25A.
Figure 26B:
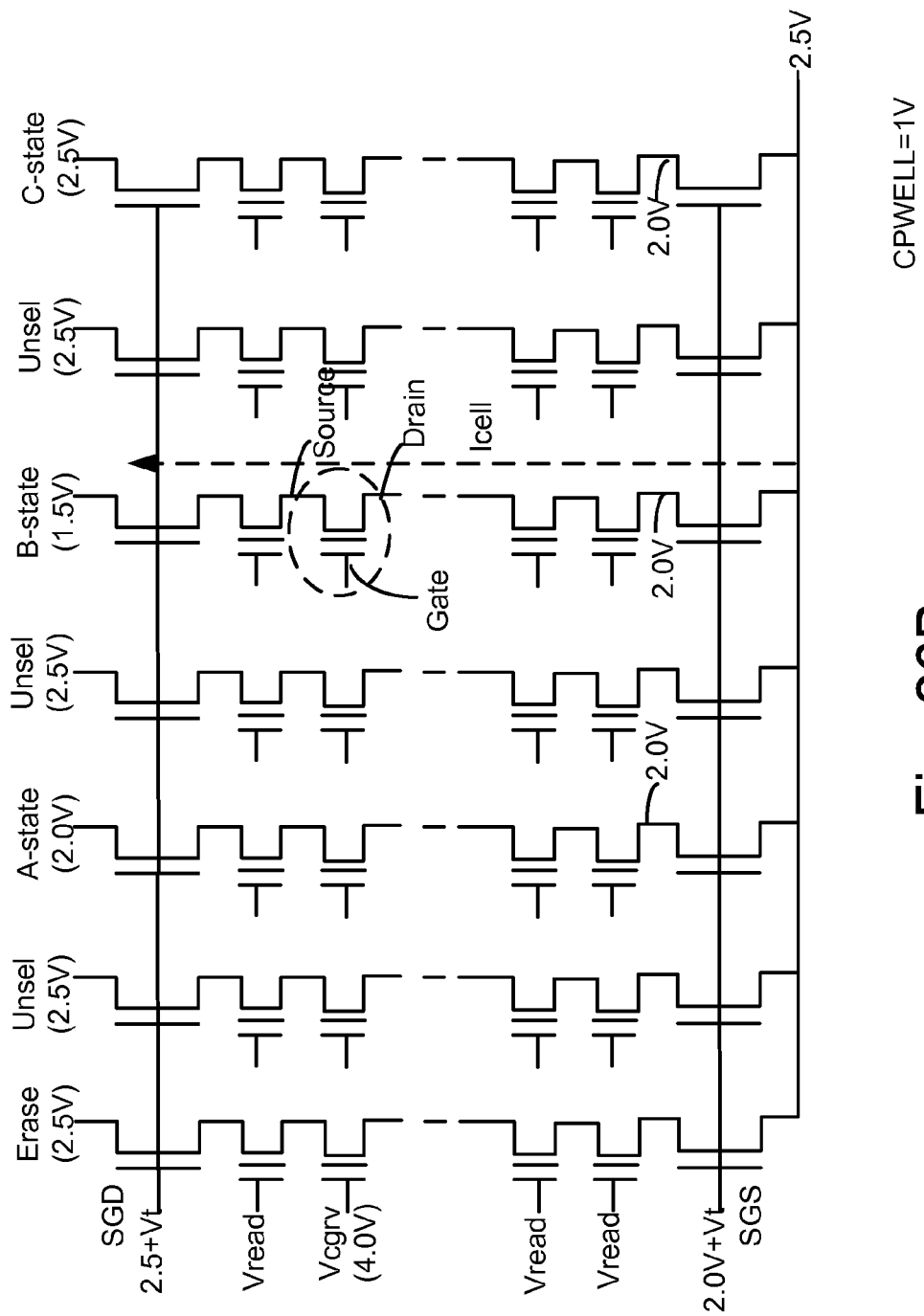
FIG. 26B is a diagram of several NAND strings showing example voltages applied when verifying the B-state in the process of FIG. 25A.
Figure 26C:
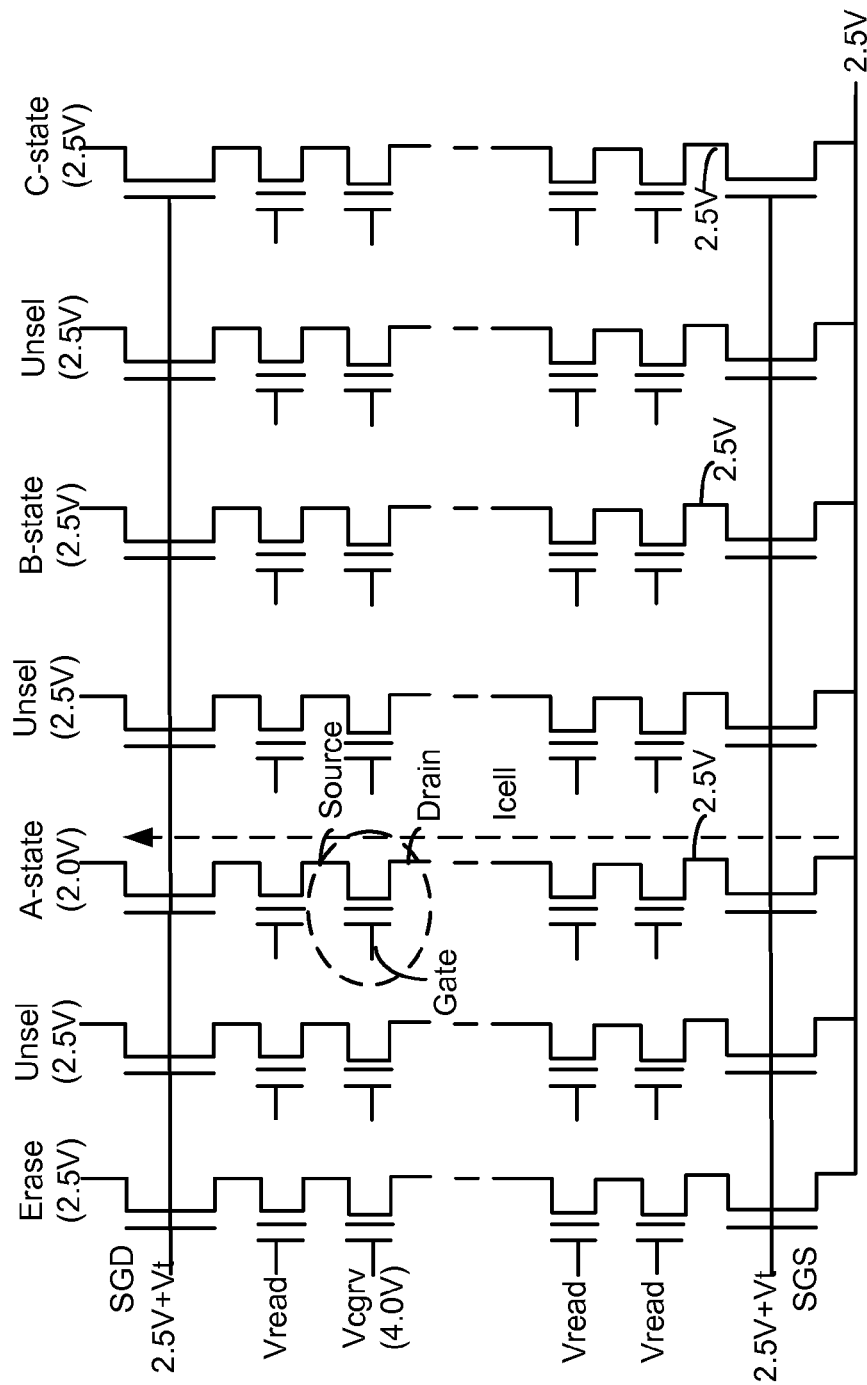
FIG. 26C is a diagram of several NAND strings showing example voltages applied when verifying the A-state in the process of FIG. 25A.

When discussing FIG. 25A and FIG. 25B, reference will be made to FIG. 26A, FIG. 26B, and FIG. 26C. FIG. 26A is a diagram of several NAND strings showing example voltages applied when verifying the C-state in the process of FIG. 17A. FIG. 26B is a diagram of several NAND strings showing example voltages applied when verifying the B-state in the process of FIG. 25A. FIG. 26C is a diagram of several NAND strings showing example voltages applied when verifying the A-state in the process of FIG. 25A.

In the process of FIG. 25A, the voltage applied to the source side select line (SGS) is used to control the drain side voltage to avoid the punch-through. In this case, all states (e.g., A, B, C in the example of FIG. 25B) may be verified simultaneously. Therefore, only a single voltage is applied to the selected WL (see FIG. 25B). All states may be verified almost simultaneously because SGS is ramped up gradually. Therefore, this method may be referred to as "pseudo-simultaneous multi state verify". Note that for some memory devices, SGS may have a shorter RC delay than that of the word line; therefore, voltage changes to SGS will be faster than voltages changes to the word line.

In step 1702, the common source line is biased to Vsource. As an example, the source line is biased to 2.5V. In step 1704, bit lines are biased at an appropriate voltage for the states to be verified. For example, bit lines for the erase state, A-state, B-state, and C-state each receive a different bias. In one embodiment, the bit lines for the erase state receive the highest bias, A-state the next highest bias, B-state the next highest bias, and C-state receive the lowest bias. For example, bit lines for the erase state are biased to 2.5V, bit lines for the A-state are biased to 2.0V, bit lines for the B-state are biased to 1.5V, and bit lines for the C-state are biased to 1.0V.

In one embodiment, the bit line verify is performed on an even bit line/odd bit line basis. For example, during one performance of process of FIG. 25A only the odd bit lines are verified. In this case, the even bit lines may have the same voltage as the bit lines having memory cells that are to stay erased. For example, Vsource (e.g., 2.5) may be applied to these "unselected" bit lines. After verifying memory cells on the odd bit lines, the process of FIG. 25A may then be repeated to verify memory cells on the even bit lines.

In step 1706, a voltage is applied to the drain side select gate (SGD). As an example, SGD is biased to Vsource+Vt, where threshold voltage is the threshold voltage of the SGD transistor. Note that at this time, SGS is held at a relatively low value such as ground. This low value prevents the NAND strings from conducting a current.

In step 1708, Vread may be applied to unselected word lines. In step 1710, a suitable read (or verify) voltage is applied to the selected word line. The read voltage should be sufficient such to verify the memory cells being verified for the C-state. For example, if the threshold voltage for the C-state is 3.0V, then 4.0V may be applied to the selected word line. Recall that 1.0V was applied to the bit lines for memory cells being programmed to the C-state in this example. Therefore, Vgs for the C-state memory cells will be 3.0V. Note that Vgs for memory cells being verified for the A-state and B-state may be high enough for those memory cells to turn on. However, because the signal applied to SGS is low at this time, none of the NAND strings conduct a current. Referring to FIG. 17B, note that the voltage applied to the selected word line is not required to change in order to verify different states.

In step 1712, the source side select gate is raised to a level that is sufficient to allow NAND strings having a memory cell being verified for the C-state to conduct. Referring to FIG. 17B, SGS is raised to level "C". As an example, level C may be 1.5V+Vt, where threshold voltage is the threshold voltage of the SGS transistor. Raising SGS to level C allows NAND strings that have a memory cell being verified for the C-state to conduct. However, NAND strings that have a memory cell being verified for either the B- or A-state will not conduct a current. Referring to FIG. 18A, with SGS at 1.5V+threshold voltage (of the SGS transistor), the source of the SGS transistor that is lightly on should be about 1.5V. Therefore, note that the bottom of the NAND string labeled C-state is at 1.5V and the top is at 1.0V. Therefore, Vds for the memory cell is about 0.5V. However, note that for the NAND string labeled B-state that there is 1.5V at each end of the NAND string. Therefore, the memory cell on the selected word line should not conduct a strong current even if its threshold voltage is below Vgs.

In step 1714, the bit lines of memory cells being programmed to the C-state are sensed. If the threshold voltage of a memory cell being verified is below its target state it should turn on and conduct a sizeable current, which may be detected. For example, the current sense 1132 of FIG. 11B may determine whether or not the memory cell conducts a sizeable current based on Icell. Note that other sensing techniques could be used.

In step 1715, the voltage of the bit lines of memory cells being verified for the C-state may be raised. For example, the bit line voltage is raised to 2.5V. This may help to prevent punch-through conduction during later steps of the process. As another alternative, the bit lines may be floated.

In step 1716, the voltage applied to SGS is raised to a level that is sufficient to allow conduction of NAND strings having a memory cell being verified for the B-state. Referring to FIG. 25B, SGS is raised to level "B." As an example, the voltage applied to SGS is raised to 2.0V+Vt, where threshold voltage is the threshold voltage of the SGS transistors. Referring to FIG. 18B, the voltage at the source of the SGS transistors on the NAND strings labeled A-, B-, and C-state are all at about 2.0V. This should not be sufficient to allow conduction of current on the NAND string labeled A-state, as 2.0V is also applied to the bit line. However, the NAND strings labeled B-state should be able to conduct a current. Note that because the bit lines of memory cells being programmed to the C-state were raised to 2.5V (or have been floated), there should not be a conduction current for those NAND strings.

In step 1718, the bit lines of memory cells being programmed to the B-state are sensed. If the threshold voltage of a memory cell being verified is below its target state it should turn on and conduct a sizeable current, which may be detected. For example, the current sense 1132 of FIG. 11B may determine whether or not the memory cell conducts a sizeable current based on Icell. Note that other sensing techniques could be used.

In step 1719, the voltage of the bit lines of memory cells being verified for the B-state may be raised. For example, the bit line voltage is raised to 2.5V. This may help to prevent punch-through conduction during later steps of the process. As another alternative, the bit lines may be floated.

In step 1720, the voltage applied to SGS is raised to a level that is sufficient to allow conduction of NAND strings having a memory cell being verified for the A-state. Referring to FIG. 17B, SGS is raised to level "A." As an example, the voltage applied to SGS is raised to 2.5V+Vt, where Vt is the threshold voltage of the SGS transistors. Referring to FIG. 26C, the voltage at the source of the SGS transistors on the NAND strings labeled A-, B-, and C-state are all at about 2.5V. This should be sufficient to allow conduction of current on the NAND string labeled A-state, as only 2.0V is applied to its NAND string. However, because the bit lines of memory cells being programmed to the B- and C-states were raised to 2.5V (or have been floated), there should not be a conduction current for those NAND strings.

In step 1722, the bit lines of memory cells being programmed to the A-state are sensed. If the threshold voltage of a memory cell being verified is below its target state it should turn on and conduct a sizeable current, which may be detected. The possible conduction current (Icell) is shown as a dashed line. For example, the current sense 1132 of FIG. 11B may determine whether or not the memory cell conducts a sizeable current based on Icell. Note that other sensing techniques could be used. At this point all states are verified and process completes. Note that for any memory cell that is verified to have reached its intended state, programming may be locked out such that it is not affected by further programming pulses.

Figure 27:
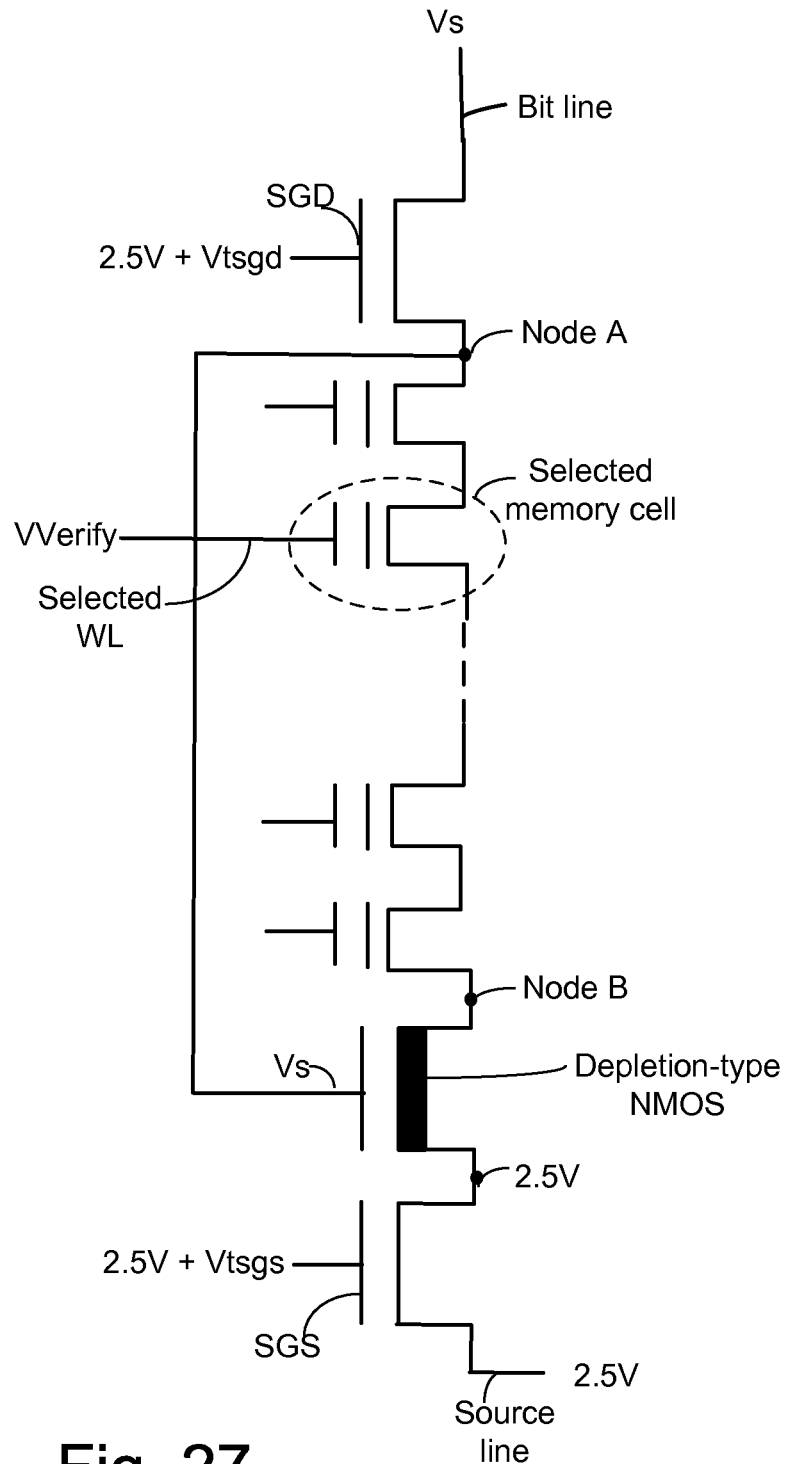
FIG. 27 is a diagram of one embodiment of a NAND string that has a transistor to help control Vds when performing reverse sensing.

FIG. 27 is a diagram of one embodiment of a NAND string that has a transistor to help control Vds when performing reverse sensing. The circuit of FIG. 27 may reduce or eliminate punch-through conduction when verifying different reference levels at the same time. The circuit of FIG. 27 may be used with the process of FIG. 24A and the timing diagrams of FIG. 24B. For example, in FIG. 24B the voltages to SGS and SGS are ramped up once during sensing of all of the states. This is in contrast to the technique depicted in FIG. 25A and FIG. 25B in which SGS is ramped to different voltages during sensing of different states. In some embodiments, the circuit of FIG. 26 is used to simultaneously verify more than two states without risk of punch-through conduction. In one embodiment, all states are simultaneously verified.

The NAND string in FIG. 26 includes a depletion type NMOS transistor with its gate connected to the SGD transistor. Specifically, the gate of the depletion type NMOS transistor is connected to the drain of the SGD transistor. In this example, Vs is applied to the bit line and 2.5V is applied to the source line. Transistor SGD has 2.5V+Vtsgd applied to its gate (Vtsgd is the threshold voltage of transistor SGD). Transistor SGS has 2.5V+Vtsgs applied to its gate (Vtsgs is the threshold voltage of transistor SGS). This may result in node A being about Vs and node B being about Vs−Vth NMOS, where Vth NMOS is the threshold voltage of the NMOS transistor. If the threshold voltage of the NMOS transistor is about −0.5V, then node B will be about Vs+0.5V. Therefore, the voltage across the NAND string will be about 0.5V above the voltage of the bit line. Note that if the voltage of the bit line where Vs+Δ, then the voltage at node B would be about Vs+Δ+0.5V. Again, the voltage across the NAND string will be about 0.5V. Also note that this means that Vds of the memory cell that is selected for verify may be about 0.5V. Keeping Vds at a relatively low value may prevent punch through conduction.

Further details of SMT sensing are discussed in "Simultaneous Multi-State Read Or Verify In Non-Volatile Storage," filed on Mar. 25, 2010, by Eran Sharon et al., which is hereby incorporated by reference in its entirety for all purposes.

One embodiment includes a method for operating non-volatile storage having a plurality of non-volatile storage elements including a first group and a second group. The method may comprise verifying the first group of non-volatile storage elements using a first bias condition, and verifying the second group of non-volatile storage elements using a second bias condition. Further, first apparent threshold voltage for each of the non-volatile storage elements in the first and second group are determined using the first bias condition, and second apparent threshold voltage are determined for each of the non-volatile storage elements in the first and second group using the second bias condition. Initialization values for an ECC decoder may be determined using the first apparent threshold voltage and the second apparent threshold voltage for each of the non-volatile storage elements in the first group and the second group.

A non-volatile storage device comprising a plurality of non-volatile storage elements including a first group and a second group, a word line associated with the plurality of non-volatile storage elements, and one or more management circuits in communication with the word line and the plurality of non-volatile storage elements. The one or more management circuits verify the first group of non-volatile storage elements using a first bias condition. The one or more management circuits verify the second group of non-volatile storage elements using a second bias condition. The one or more management circuits determine a first apparent threshold voltage for each of the non-volatile storage elements in the first group and the second group using the first bias condition. The one or more management circuits determine a second apparent threshold voltage for each of the non-volatile storage elements in the first group and second group using the second bias condition. The one or more management circuits determine initialization values for an ECC decoder using the first apparent threshold voltage and the second apparent threshold voltage of each of the non-volatile storage elements in the first group and the second group.

One embodiment includes a method for operating non-volatile storage. The method comprises verifying whether non-volatile storage elements in a NAND memory array were programmed to appropriate states of a plurality of states using simultaneous multi voltage threshold sensing, including using a first bias condition to test whether non-volatile storage elements were programmed to a first set of the states and a second bias condition to test whether non-volatile storage elements were programmed to a second set of the states. The method further comprises reading the non-volatile storage elements at N−1 read compare voltage levels using the first bias condition to determine a first apparent threshold voltage for each of the non-volatile storage elements, and reading the non-volatile storage elements at the N−1 read compare voltage levels using the second bias condition to determine a second apparent threshold voltage for each of the non-volatile storage elements. Initialization values are determined for a soft ECC decoder based on the first apparent threshold voltage and the second apparent threshold voltage for each of the non-volatile storage elements.

One embodiment includes a non-volatile storage device comprising a plurality of non-volatile storage elements arranged as NAND strings, a plurality of word lines associated with the NAND strings, a plurality of bit lines, each NAND string is associated with a bit line, and one or more management circuits in communication with the plurality of word lines, the plurality of non-volatile storage elements, and the plurality of bit lines. The one or more management circuits verify whether non-volatile storage elements associated with a first word line of the word lines were successfully programmed to appropriate states of a plurality of states using simultaneous multi-voltage threshold sensing. The one or more management circuits use a first bias condition during the verify to test whether non-volatile storage elements were successfully programmed to a first set of the states, the one or more management circuits simultaneous use a second bias condition during the verify to test whether non-volatile storage elements were successfully programmed to a second set of the states. The one or more management circuits read the non-volatile storage elements associated with the first word line at N−1 read compare voltage levels and using the first bias condition to determine a first apparent threshold voltage for each of the non-volatile storage elements associated with the first word line. The one or more management circuits read the non-volatile storage elements associated with the first word line at the N−1 read compare voltage levels using the second bias condition to determine a second apparent threshold voltage for each of the non-volatile storage elements associated with the first word line, the one or more management circuits determine initialization values for a soft ECC decoder based on the first apparent threshold voltage and the second apparent threshold voltage for each of the non-volatile storage elements associated with the first word line.

One embodiment includes a method for operating non-volatile storage having a plurality of non-volatile storage elements including a first group and a second group. The method comprises verifying the first group of non-volatile storage elements using a first bias condition, verifying the second group of non-volatile storage elements using a second bias condition, and reading the first group and second group of non-volatile storage elements using the first bias condition. The reading includes performing ECC decoding. The method further comprises using results of the reading using the first bias condition if the ECC decoding passed, and performing error correction of a)-c) only if the ECC decoding failed. The error correction includes: a) determining a first apparent threshold voltage for each of the non-volatile storage elements in the first and second group using the first bias condition; b) determining a second apparent threshold voltage for each of the non-volatile storage elements in the first and second group using the second bias condition; and c) determining initialization values for an ECC decoder using the first apparent threshold voltage and the second apparent threshold voltage for each of the non-volatile storage elements in the first group and the second group.

The foregoing detailed description of the invention has been presented for purposes of illustration and description. It is not intended to be exhaustive or to limit embodiments to the precise form disclosed. Many modifications and variations are possible in light of the above teaching. The described embodiments were chosen in order to best explain the principles and practical applications, to thereby enable others skilled in the art to best utilize various embodiments and with various modifications as are suited to the particular use contemplated. It is intended that the scope be defined by the claims appended hereto.

What is claimed is:

1. A method for operating non-volatile storage having a plurality of non-volatile storage elements including a first group and a second group, the method comprising:
   verifying the first group of non-volatile storage elements using a first bias condition during a program operation that programs the first group and the second group to a plurality of data states, wherein the first group are verified for a first set of the plurality of data states;
   verifying the second group of non-volatile storage elements using a second bias condition during the program operation, wherein the second group are verified for a second set of the plurality of data states;
   determining a first apparent threshold voltage for each of the non-volatile storage elements in the first group and the second group using the first bias condition during a read operation after the program operation is complete;
   determining a second apparent threshold voltage for each of the non-volatile storage elements in the first group and the second group using the second bias condition during the read operation; and
   determining initialization values for an ECC decoder for the read operation using the first apparent threshold voltage and the second apparent threshold voltage for each of the non-volatile storage elements in the first group and the second group.

2. The method of claim 1, wherein the determining initialization values for an ECC decoder includes:
   indexing a metric table using the first apparent threshold voltage and the second apparent threshold voltage for a first of the plurality of non-volatile storage elements; and
   repeating the indexing for other ones of the plurality of non-volatile storage elements.

3. The method of claim 2, wherein the determining a first apparent threshold voltage includes reading the first and second groups of non-volatile storage elements at N−1 read compare voltage levels using the first bias conditions, the determining a second apparent threshold voltage includes reading the first and second groups of non-volatile storage elements at the N−1 read compare voltage levels using the second bias conditions, the metric table includes a plurality of entries, each entry corresponds to one possible combination of apparent threshold voltages.

4. The method of claim 1, wherein the determining initialization values for an ECC decoder includes:
   a) determining a correction term for a first of the plurality of non-volatile storage elements based on the first apparent threshold voltage and the second apparent threshold voltage of the first non-volatile storage element;
   b) accessing a metric table that corresponds to the correction term for the first non-volatile storage element, the accessed metric table is one of a plurality of stored metric tables, each metric table corresponds to a different correction term;
   c) indexing the accessed metric table using the first apparent threshold voltage of the first non-volatile storage element; and
   repeating said a)-c) for other ones of the plurality of non-volatile storage elements.

5. The method of claim 1, wherein the verifying the first group of non-volatile storage elements using the first bias condition includes determining whether non-volatile storage elements in the first group were programmed to an appropriate programmed state in a first set of programmed states, the verifying the second group of non-volatile storage elements using the second bias conditions includes determining whether non-volatile storage elements in the second group were programmed to an appropriate programmed state in a second set of programmed states.

6. The method of claim 1, wherein the verifying the non-volatile storage elements using the first bias condition includes applying a plurality of read compare voltages to a word line associated with the plurality of non-volatile storage elements using a first sense time, the verifying the non-volatile storage elements using the second bias condition includes applying the plurality of read compare voltages to the word line using a second sense time that is different from the first sense time.

7. The method of claim 1, wherein the verifying the non-volatile storage elements using the first bias condition includes applying a plurality of read compare voltages to a word line associated with the plurality of non-volatile storage elements while applying a first voltage to bit lines associated with the plurality of non-volatile storage elements, the verifying the non-volatile storage elements using the second bias condition includes applying the plurality of read compare voltages to the word line while applying a second voltage to the bit lines.

8. The method of claim 1, wherein the plurality of non-volatile storage elements include a third group, and further comprising:
   verifying the third group of non-volatile storage elements using a third bias condition; and
   determining a third apparent threshold voltage for each of the non-volatile storage elements in the first, second, and third groups using the third bias condition, the determining initialization values for an ECC decoder is based on the first apparent threshold voltage, the second apparent threshold voltage, and the third apparent threshold voltage for each of the plurality of non-volatile storage elements.

9. The method of claim 1, wherein the plurality of non-volatile storage elements are part of a three-dimensional memory array.

10. The method of claim 1, wherein determining the initialization values for the ECC decoder is based on differences between how the plurality of non-volatile storage elements respond to being verified using the second bias condition and being read using the first bias condition.

11. A non-volatile storage device comprising:
    a plurality of non-volatile storage elements including a first group and a second group;
    a word line associated with the plurality of non-volatile storage elements; and
    one or more management circuits in communication with the word line and the plurality of non-volatile storage elements, the one or more management circuits are configured to program the first group and the second group to a plurality of data states during a program operation, the one or more management circuits are configured to verify the first group of non-volatile storage elements for a first set of the plurality of data states using a first bias condition during the program, the one or more management circuits are configured to verify the second group of non-volatile storage elements for a second set of the plurality of data states using a second bias condition during the program operation, the one or more management circuits are configured to determine a first apparent threshold voltage for each of the non-volatile storage elements in the first group and the second group using the first bias condition during a read operation that follows the program operation, the one or more management circuits are configured to determine a second apparent threshold voltage for each of the non-volatile storage elements in the first group and second group using the second bias condition during the read operation, the one or more management circuits are configured to determine initialization values for an ECC decoder for the read operation using the first apparent threshold voltage and the second apparent threshold voltage of each of the non-volatile storage elements in the first group and the second group.

12. The non-volatile storage device of claim 11, wherein the one or more management circuits are configured to index a metric table using the first apparent threshold voltage and the second apparent threshold voltage for a first of the non-volatile storage elements as a part of determining initialization values for an ECC decoder.

13. The non-volatile storage device of claim 12, wherein the one or more management circuits are configured to read the first and second groups of non-volatile storage elements at N−1 read compare voltage levels using the first bias conditions to determine the first apparent threshold voltages, wherein the one or more management circuits are configured to read the first and second groups of non-volatile storage elements at the N−1 read compare voltage levels using the second bias conditions to determine the second apparent threshold voltages, wherein the metric table includes a plurality of entries, wherein each entry corresponds to one possible combination of apparent threshold voltages.

14. The non-volatile storage device of claim 11, wherein the one or more management circuits are configured to determine a correction term for a first of the plurality of non-volatile storage elements based on the first apparent threshold voltage and the second apparent threshold voltage of the first non-volatile storage element to determine initialization values for the ECC decoder for a first of the plurality of non-volatile storage elements, wherein the one or more management circuits are configured to access a metric table that corresponds to the correction term for the first non-volatile storage element, wherein the accessed metric table is one of a plurality of stored metric tables, wherein each metric table corresponds to a different correction term, wherein the one or more management circuits are configured to index the accessed metric table using the first apparent threshold voltage of the first non-volatile storage element.

15. The non-volatile storage device of claim 11, wherein the one or more management circuits are configured to apply a plurality of read compare voltages to the word line and use a first sense time when reading the non-volatile storage elements using the first bias condition, wherein the one or more management circuits are configured to apply the plurality of read compare voltages to the word line and use a second sense time when reading the non-volatile storage elements using the second bias condition.

16. The non-volatile storage device of claim 11, further comprising a plurality of bit lines associated with the plurality of non-volatile storage elements, wherein the one or more management circuits are configured to apply a plurality of read compare voltages to the word line and apply a first voltage to the plurality of bit lines when reading the non-volatile storage elements using the first bias condition, wherein the one or more management circuits are configured to apply the plurality of read compare voltages to the word line and apply a second voltage to the plurality of bit lines when reading the non-volatile storage elements using the second bias condition.

17. The non-volatile storage device of claim 11, wherein sensing a given non-volatile storage element at the second bias condition results in an apparent threshold voltage shift relative to sensing the given non-volatile storage element at the first bias condition, the one or more management circuits are further configured to determine the initialization values for the ECC decoder based on variations in the shift of apparent threshold voltage between the non-volatile storage elements.

18. A method for operating non-volatile storage having a plurality of non-volatile storage elements including a first group and a second group, the method comprising:
  programming the first group of non-volatile storage elements to a first set of states and the second group of non-volatile storage elements to a second set of states during a program operation;
  verifying the first group of non-volatile storage elements using a first bias condition during the program operation;
  verifying the second group of non-volatile storage elements using a second bias condition during the program operation;
  reading the first group and the second group of non-volatile storage elements using the first bias condition during a read operation that follows the program operation, the reading includes performing ECC decoding;
  using results of the reading using the first bias condition if the ECC decoding passed; and
  performing error correction of a)-c) for the read operation only if the ECC decoding failed, the error correction includes:
    a) determining a first apparent threshold voltage for each of the non-volatile storage elements in the first group and the second group using the first bias condition;
    b) determining a second apparent threshold voltage for each of the non-volatile storage elements in the first group and the second group using the second bias condition; and
    c) determining initialization values for an ECC decoder using the first apparent threshold voltage and the second apparent threshold voltage for each of the non-volatile storage elements in the first group and the second group.

19. The method of claim 18, wherein the plurality of non-volatile storage elements are part of a three-dimensional memory array.

20. The method of claim 18, wherein verifying or reading a given non-volatile storage element at the second bias condition results in an apparent threshold voltage shift relative to verifying or reading the given non-volatile storage element at the first bias condition, the determining initialization values includes determining initialization values based on variations in the shift of apparent threshold voltage between the non-volatile storage elements.

21. A non-volatile storage device comprising:
  a three-dimensional memory array having a plurality of non-volatile storage elements including a first group and a second group;
  a word line associated with the plurality of non-volatile storage elements; and
  one or more management circuits in communication with the word line and the plurality of non-volatile storage elements, the one or more management circuits program the first group and the second group to a plurality of data states during a program operation, the one or more management circuits verify the first group of non-volatile storage elements using a first bias condition during the program operation, wherein the first group are verified for a first set of the plurality of data states, the one or more management circuits verify the second group of non-volatile storage elements using a second bias condition, during the program operation, wherein the second group are verified for a second set of the plurality of data states, the one or more management circuits determine a first apparent threshold voltage for each of the non-volatile storage elements in the first group and the second group using the first bias condition during a read operation that follows the program operation, the one or more management circuits determine a second apparent threshold voltage for each of the non-volatile storage elements in the first group and second group using the second bias condition during the read operation, the one or more management circuits determine initialization values for an ECC decoder for the read operation using the first apparent threshold voltage and the second apparent threshold voltage of each of the non-volatile storage elements in the first group and the second group.

22. The non-volatile storage device of claim 21, wherein the one or more management circuits determine the initialization values for the ECC decoder based on variations in shifts in apparent threshold voltage for non-volatile storage elements that are verified using the second bias condition and read using the first bias condition.

* * * * *